(12) United States Patent
Nakamura et al.

(10) Patent No.: US 10,867,647 B2
(45) Date of Patent: Dec. 15, 2020

(54) MARCHING MEMORY AND COMPUTER SYSTEM

(71) Applicants: Tadao Nakamura, Sendai (JP); Michael J. Flynn, Palo Alto, CA (US)

(72) Inventors: Tadao Nakamura, Sendai (JP); Michael J. Flynn, Palo Alto, CA (US)

(*) Notice: Subject to any disclaimer, the term of this patent is extended or adjusted under 35 U.S.C. 154(b) by 0 days.

(21) Appl. No.: 16/625,005

(22) PCT Filed: Jan. 23, 2019

(86) PCT No.: PCT/JP2019/002020
§ 371 (c)(1),
(2) Date: Dec. 20, 2019

(87) PCT Pub. No.: WO2019/146623
PCT Pub. Date: Aug. 1, 2019

(65) Prior Publication Data
US 2020/0143857 A1    May 7, 2020

Related U.S. Application Data

(60) Provisional application No. 62/620,666, filed on Jan. 23, 2018.

(51) Int. Cl.
*G11C 7/22* (2006.01)
*G11C 16/10* (2006.01)
*G11C 7/10* (2006.01)

(52) U.S. Cl.
CPC ............ *G11C 7/222* (2013.01); *G11C 7/1027* (2013.01); *G11C 7/1066* (2013.01); *G11C 7/1093* (2013.01)

(58) Field of Classification Search
CPC ....... G11C 19/184; G11C 19/18; G11C 19/28; G11C 7/1072; G11C 16/10; G11C 16/32;
(Continued)

(56) References Cited

U.S. PATENT DOCUMENTS 5,506,998 A * 4/1996 Kato ..................... G06N 3/10
712/29
6,728,330 B1   4/2004 Aue
(Continued)

FOREIGN PATENT DOCUMENTS

EP    2815403 B1    1/2019
JP    2016186832 A  10/2016

OTHER PUBLICATIONS

The extended European search report dated Oct. 5, 2020 in the counterpart European patent application.

*Primary Examiner* — Hien N Nguyen
(74) *Attorney, Agent, or Firm* — Metrolex IP Law Group, PLLC

(57) ABSTRACT

A marching memory includes an alternating periodic array of odd-numbered columns ($U_1, U_2, \ldots, U_{n-1}, U_n$) and even-numbered columns ($U_{r1}, U_{r2}, \ldots, Ur_{n-1}, Ur_n$). Each of the odd-numbered columns ($U_1, U_2, \ldots, U_{n-1}, U_n$) has a sequence of front-stage cells aligned along a column direction so as to store a set of moving information of byte size or word size. And each of the even-numbered columns ($U_{r1}, U_{r2}, \ldots, Ur_{n-1}, Ur_n$) has a sequence of rear-stage cells aligned along a column direction so as to store the set of moving information, so that the set of moving information can be transferred synchronously, step by step, along a direction orthogonal to the column direction.

9 Claims, 22 Drawing Sheets

(58) Field of Classification Search
CPC ... G11C 19/186; G11C 19/188; G11C 19/282; G11C 19/287; G11C 5/025; G11C 5/063; G11C 7/22; G11C 8/12; G06F 1/12; G06F 1/08; G06F 15/78; G06F 5/06; G06F 5/08; G06F 9/30

See application file for complete search history.

(56) References Cited

U.S. PATENT DOCUMENTS

| | | |
|---|---|---|
| 8,949,650 B2 | 2/2015 | Nakamura et al. |
| 9,361,957 B2 | 6/2016 | Nakamura et al. |
| 9,449,696 B2 * | 9/2016 | Nakamura ............ G11C 19/184 |
| 10,573,359 B2 * | 2/2020 | Nakamura ............ G11C 19/287 |
| 2002/0184381 A1 * | 12/2002 | Ryan .................. H04L 49/3027 |
| | | 709/234 |
| 2012/0249502 A1 * | 10/2012 | Takahashi ........ H03K 19/01728 |
| | | 345/205 |
| 2013/0141157 A1 | 6/2013 | Takemura |

\* cited by examiner

[Fig. 1]
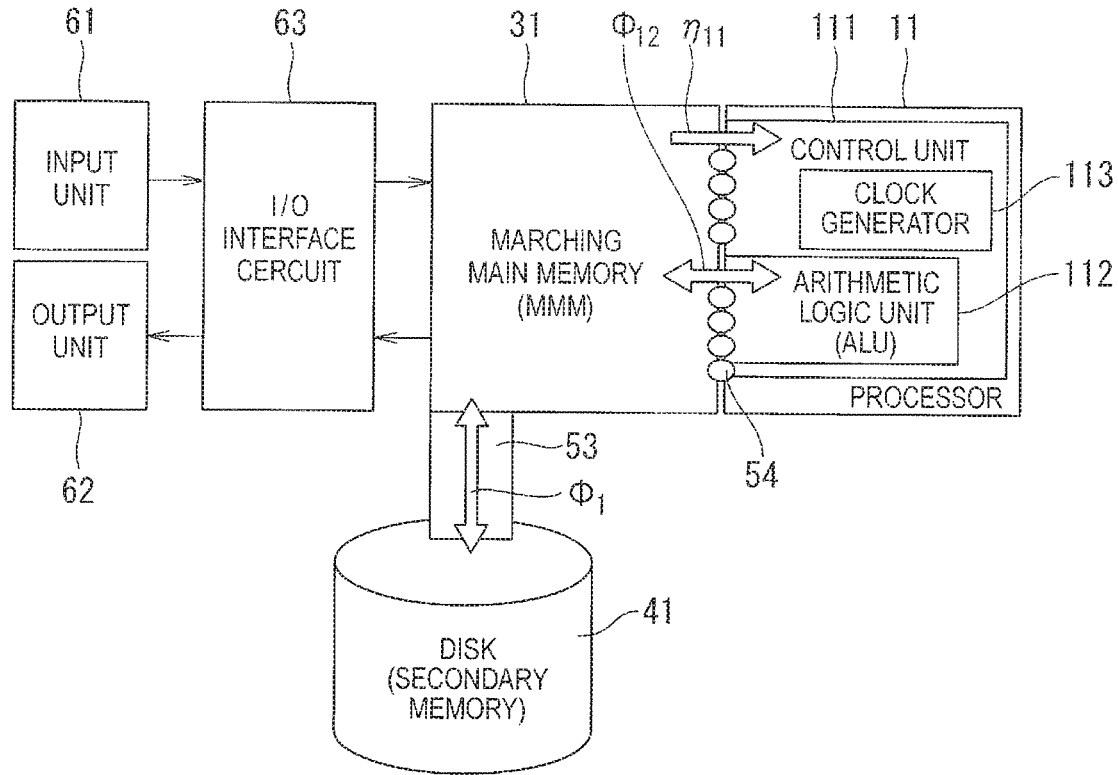
[Fig. 2]
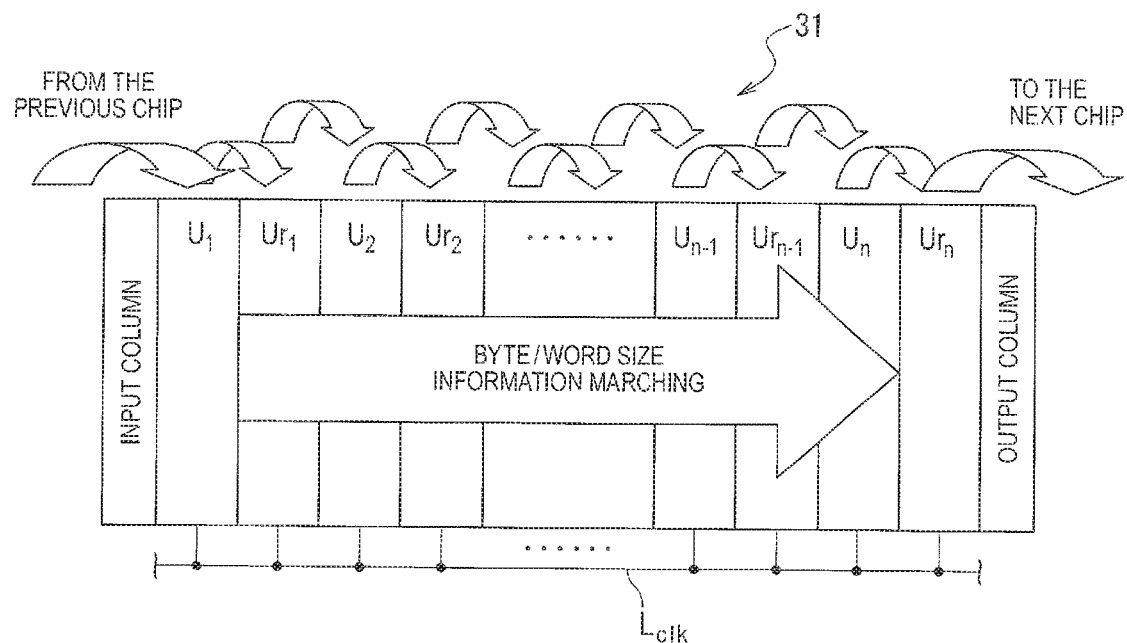

[Fig. 3A]
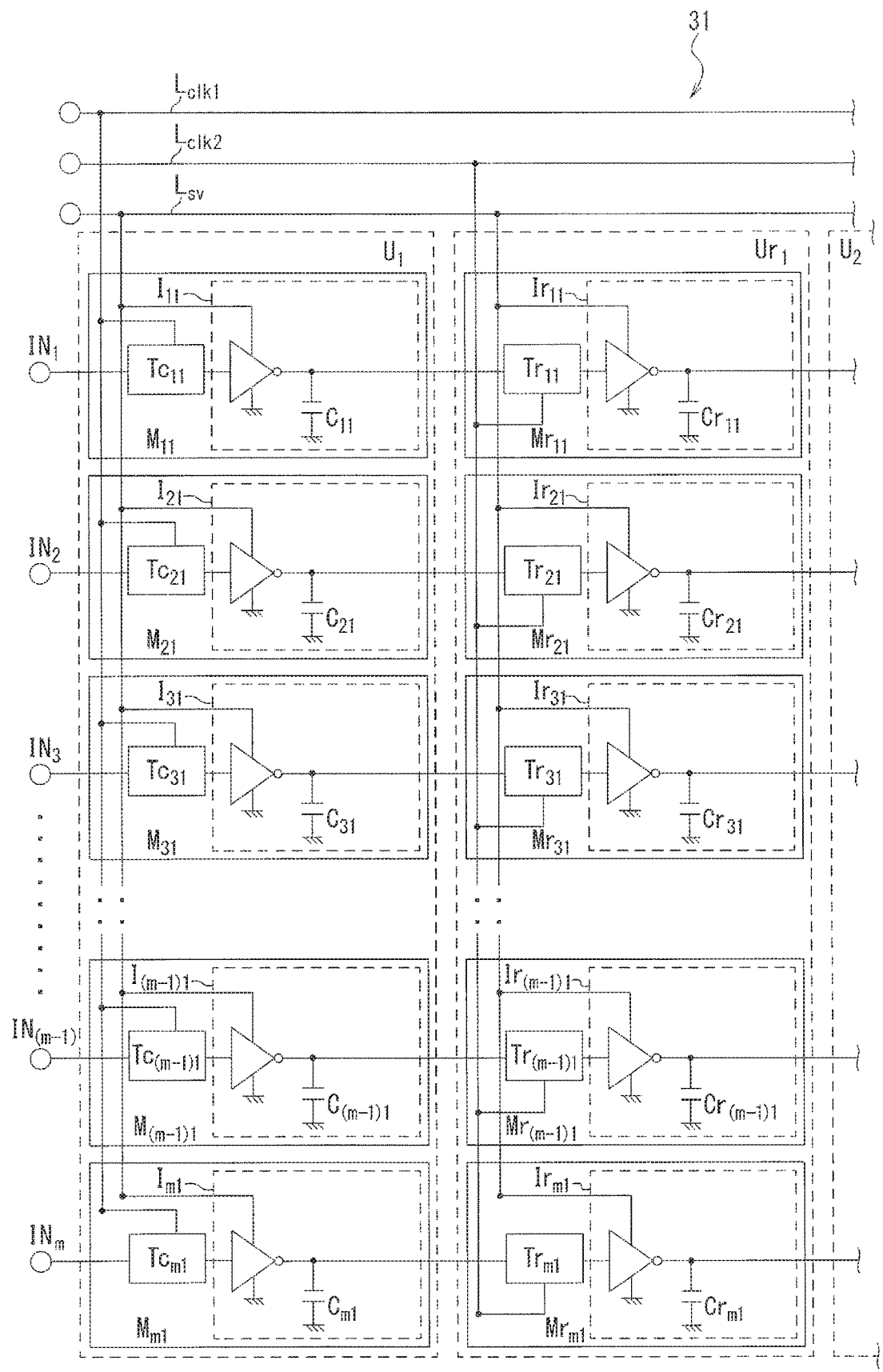

[Fig. 3B]
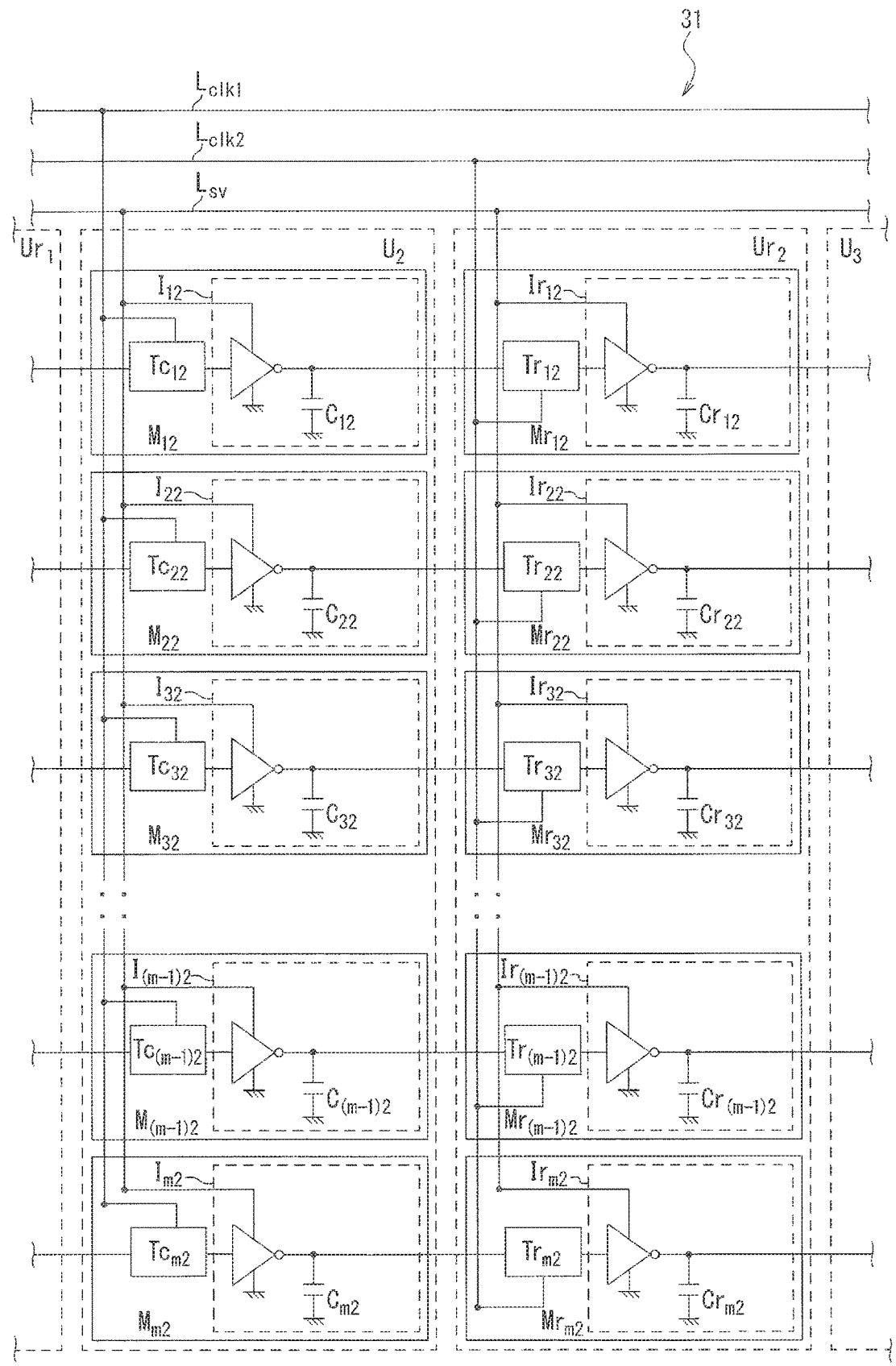

[Fig. 3C]
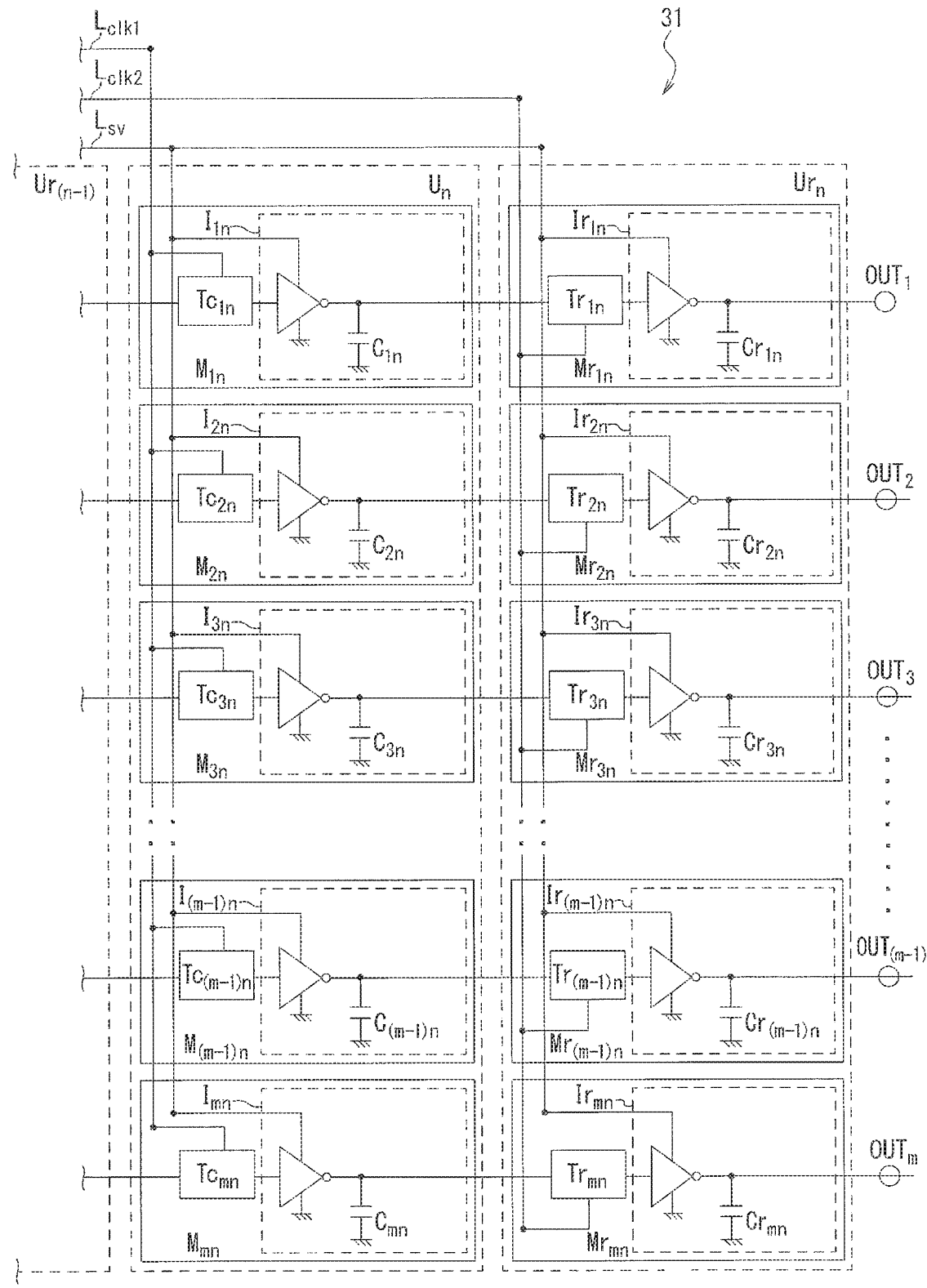

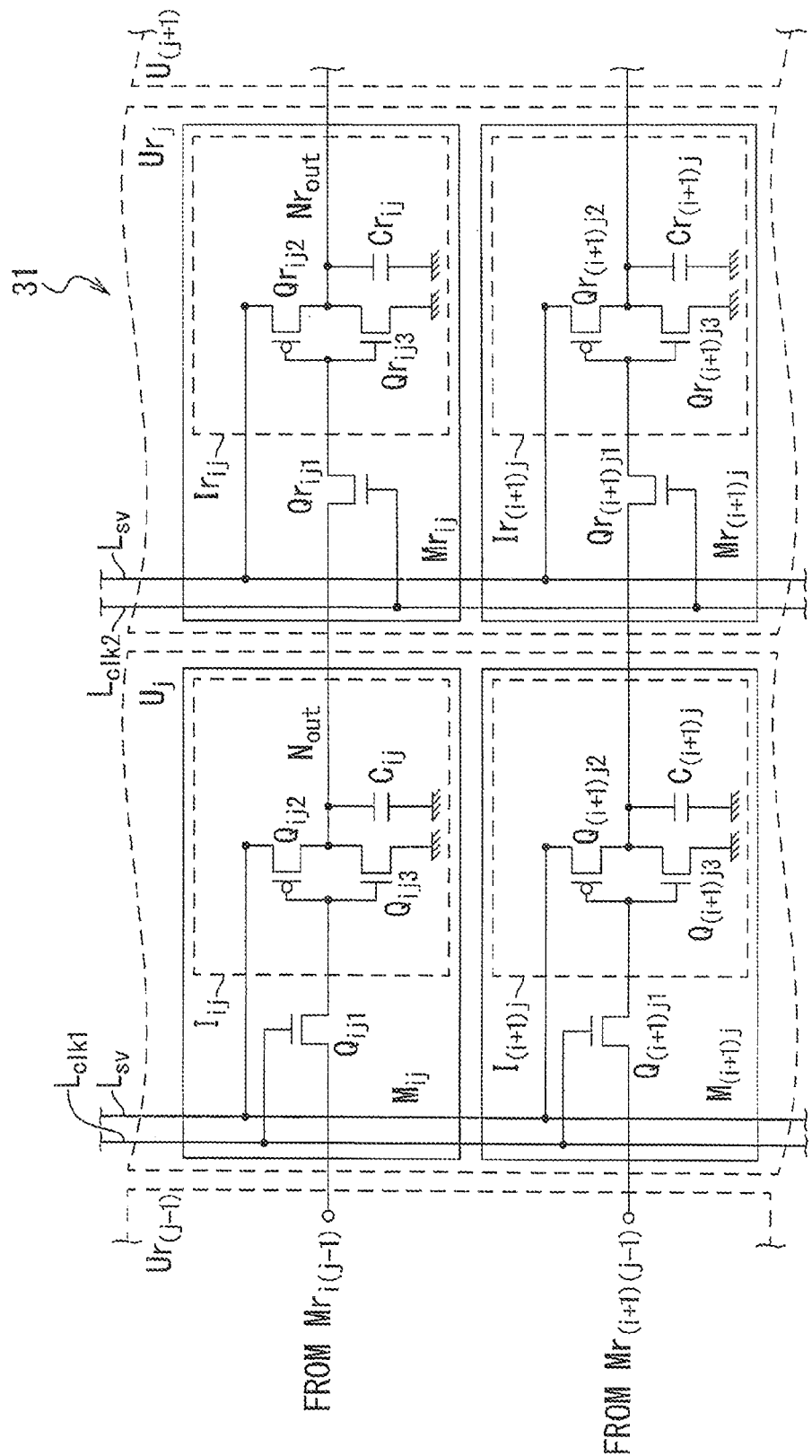
[Fig. 4A]

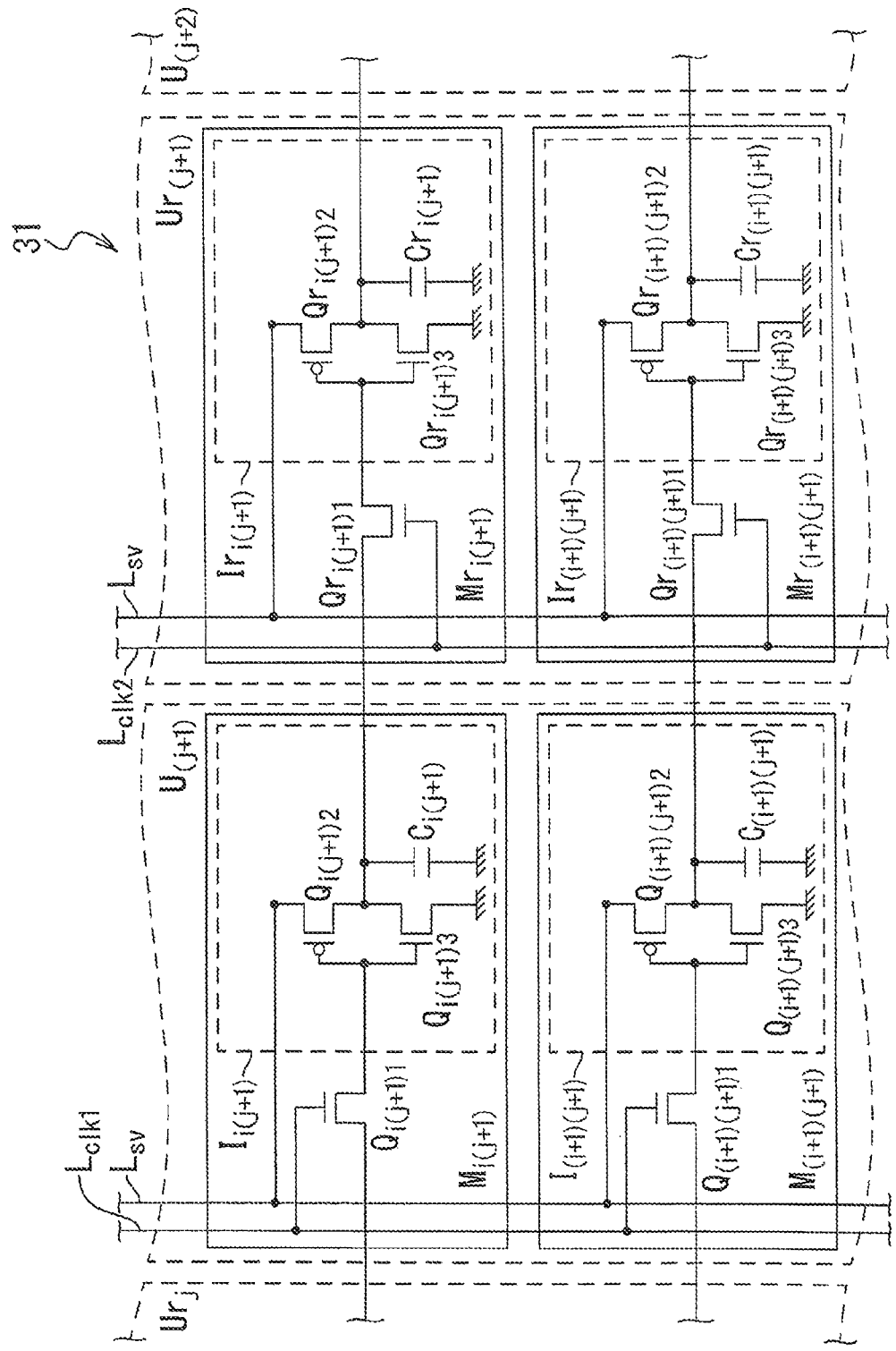

[Fig. 5A]
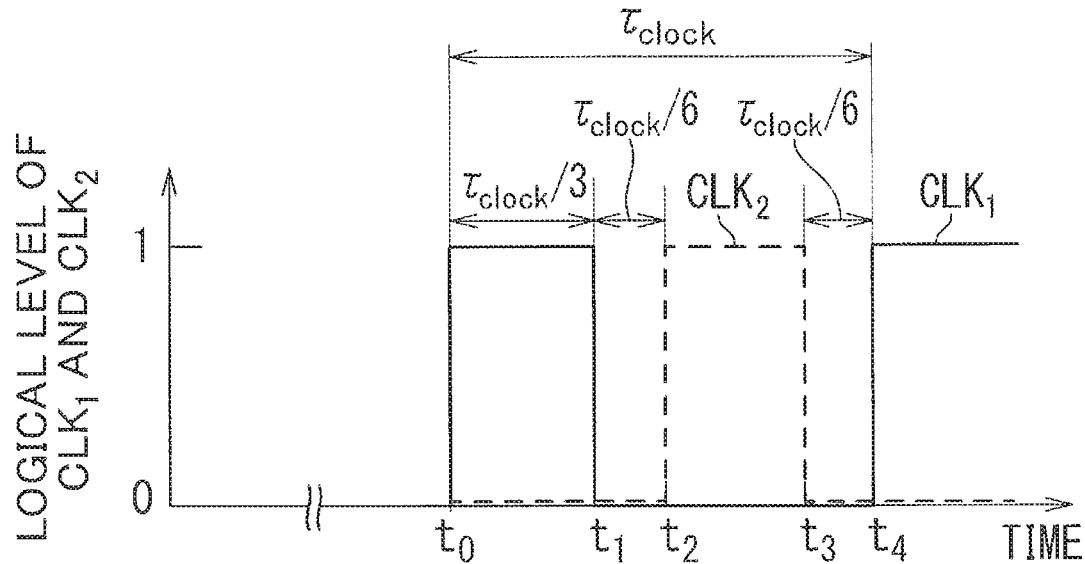
[Fig. 5B]
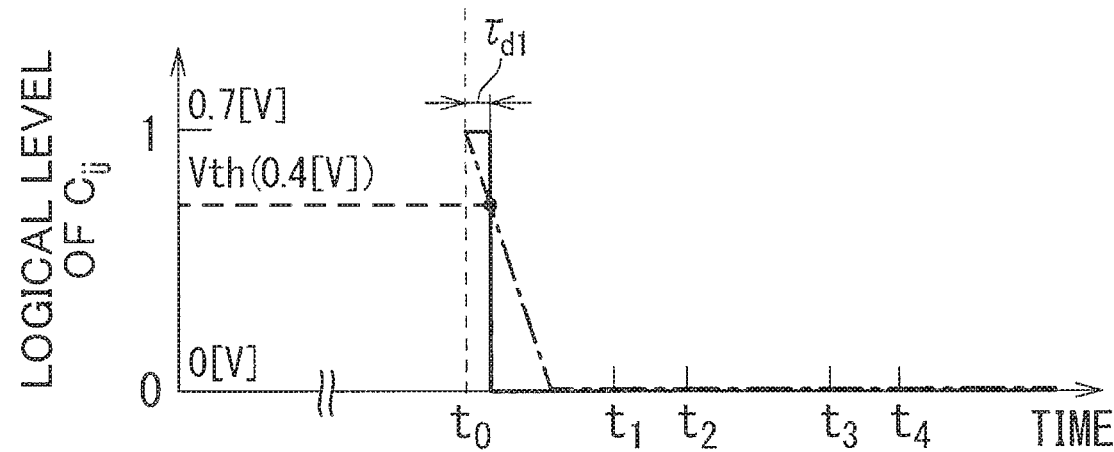
[Fig. 5C]
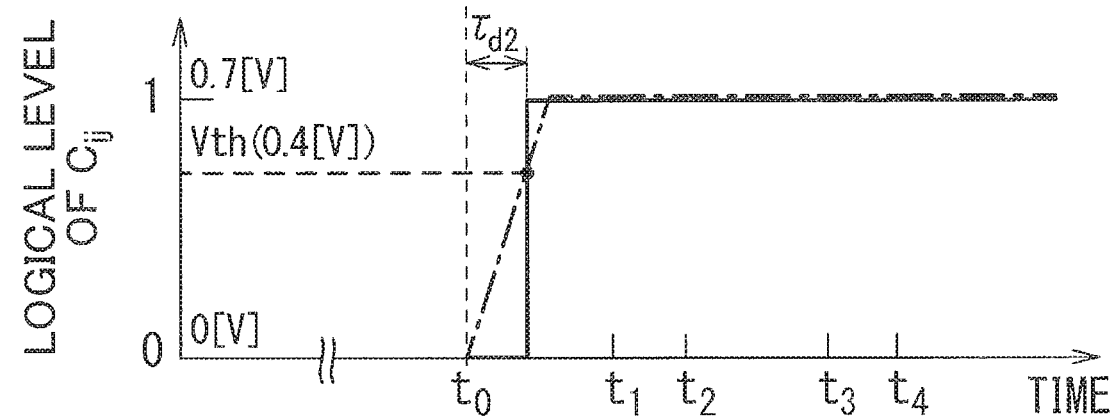

[Fig. 5D]
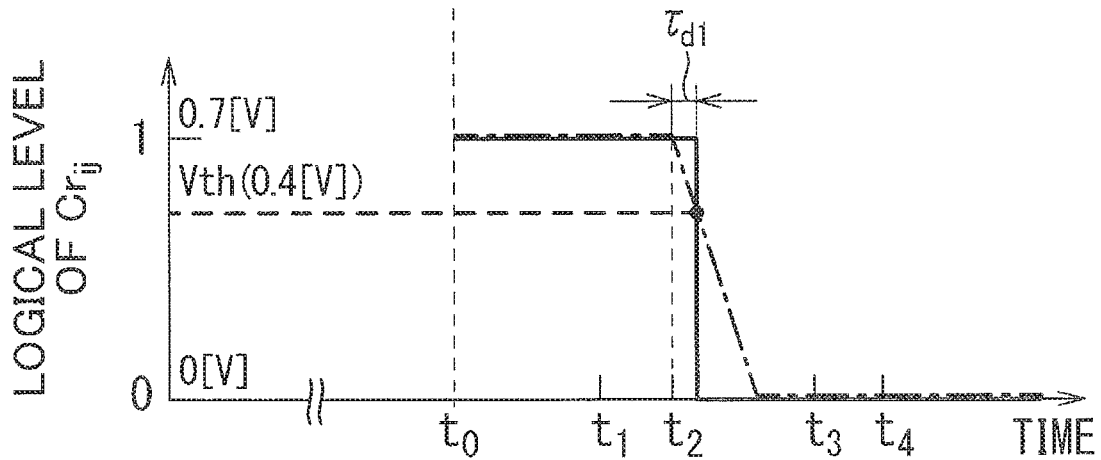
[Fig. 5E]
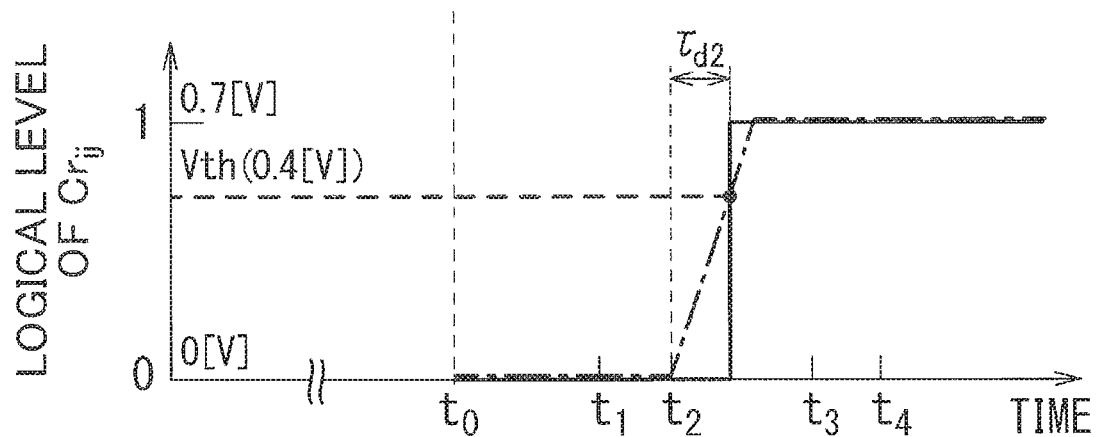
[Fig. 6A]
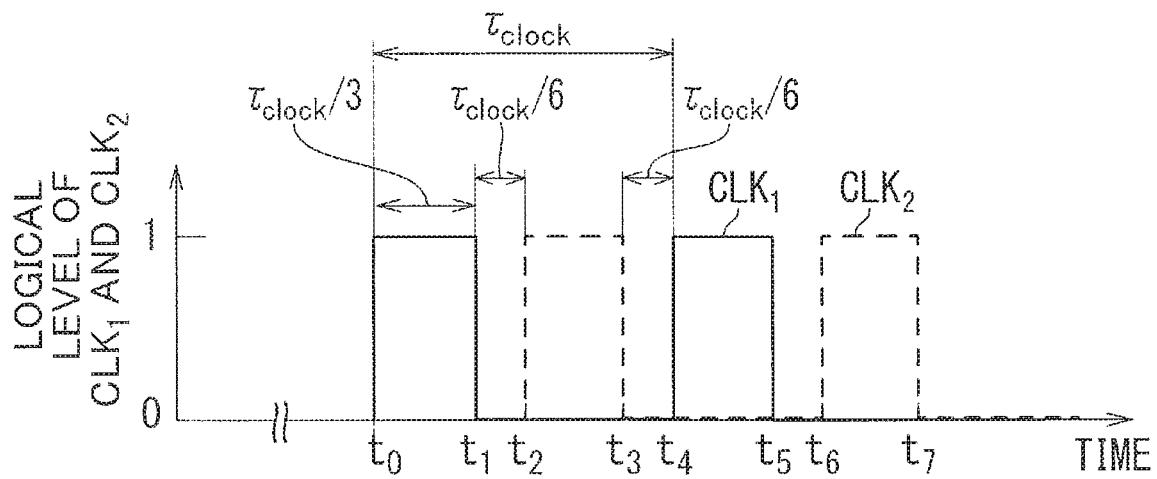

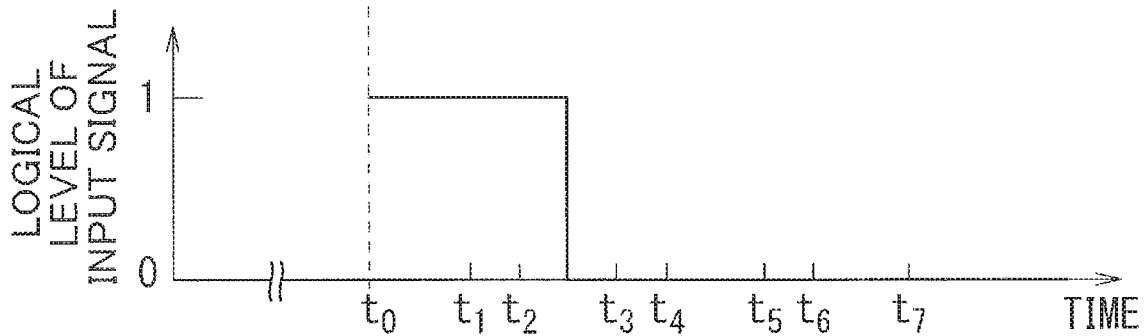
[Fig. 6B]
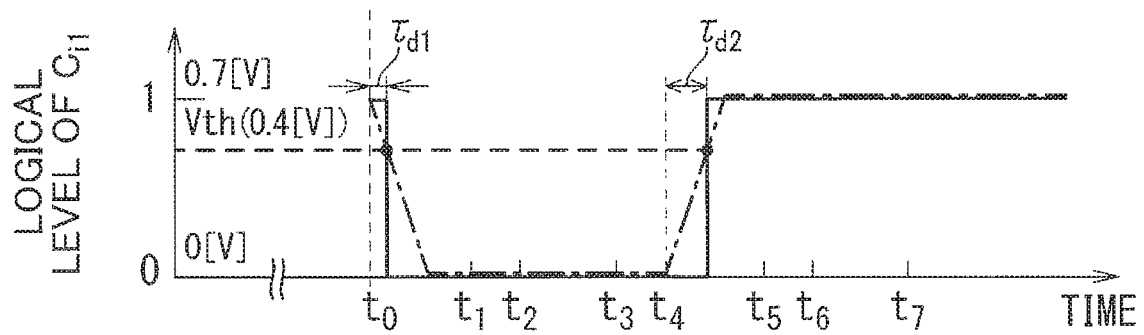
[Fig. 6C]
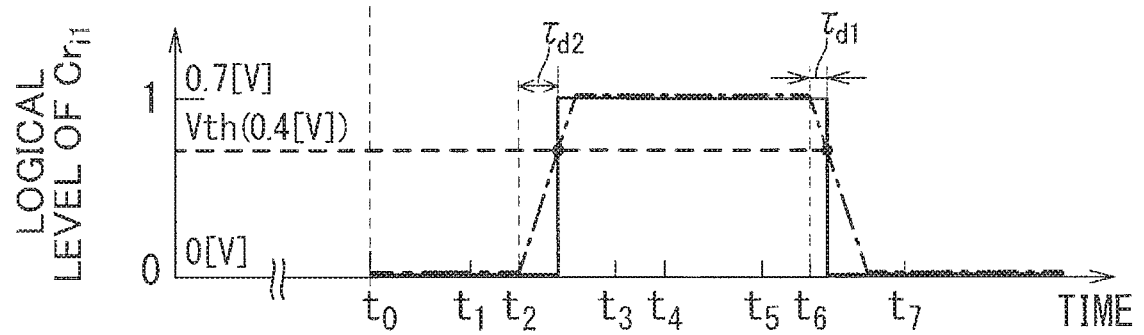
[Fig. 6D]
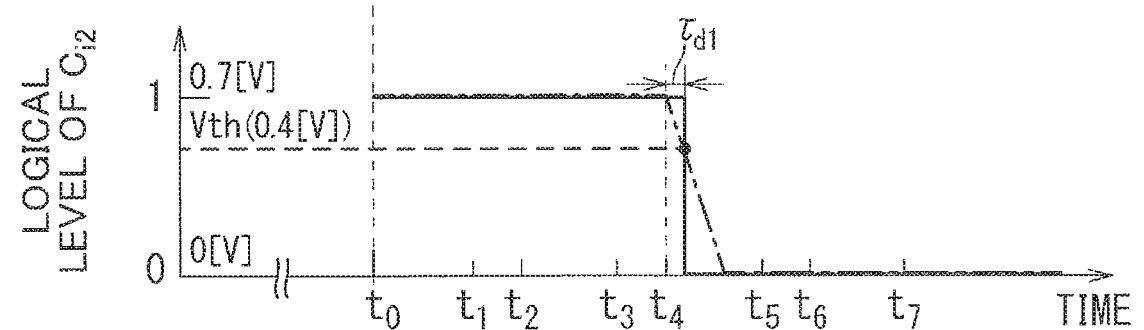
[Fig. 6E]

[Fig. 6F]
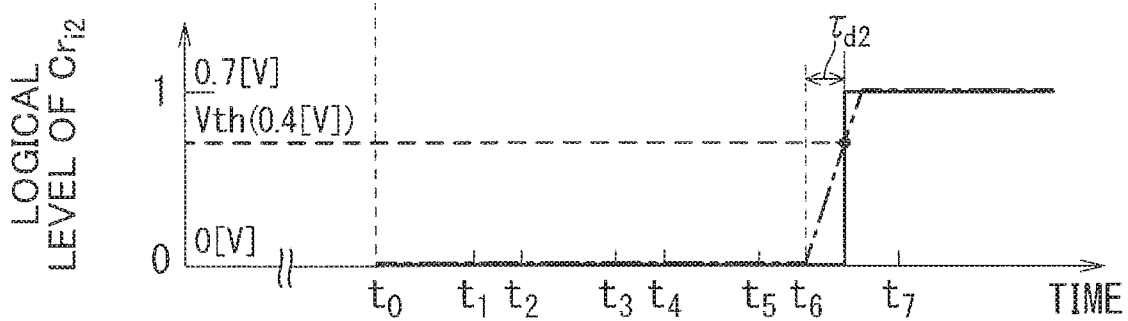
[Fig. 7A]
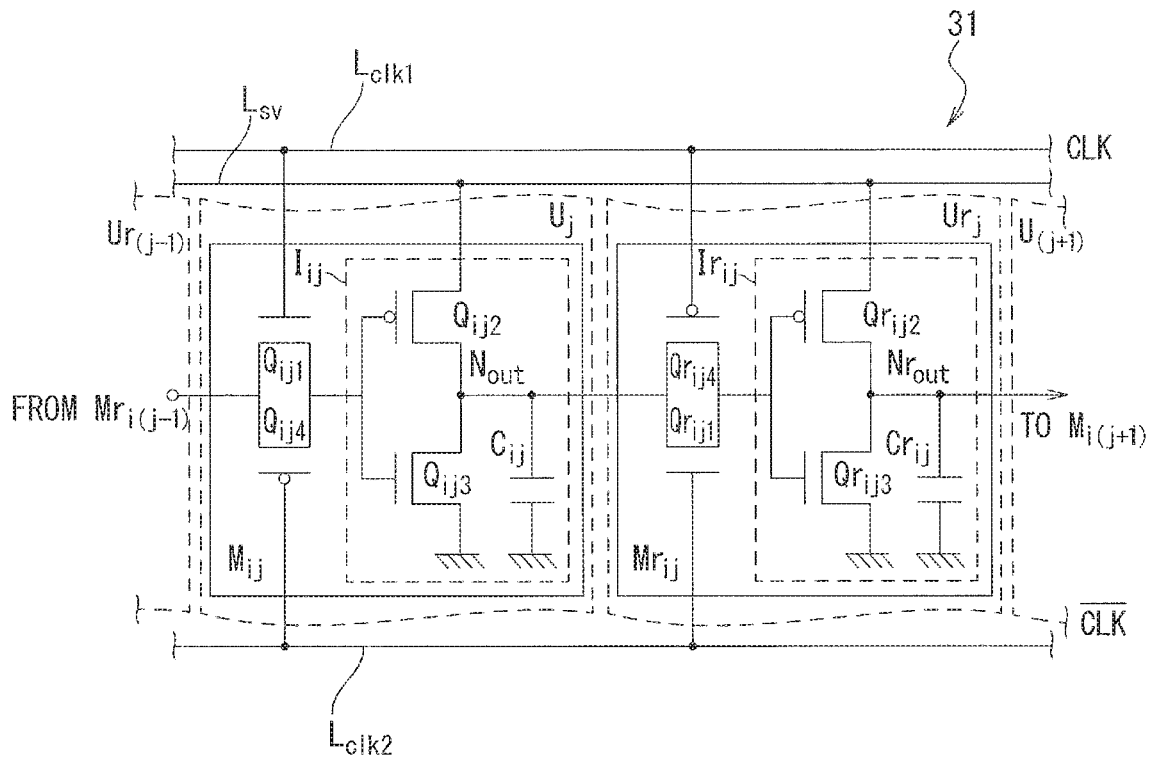
[Fig. 7B]
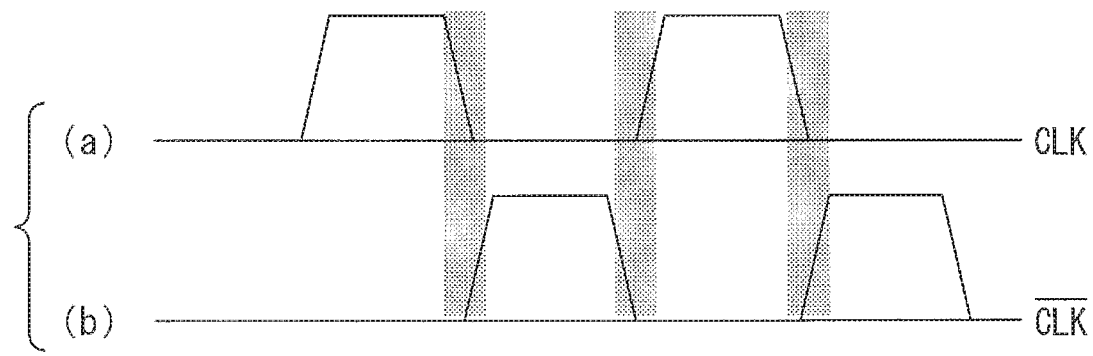

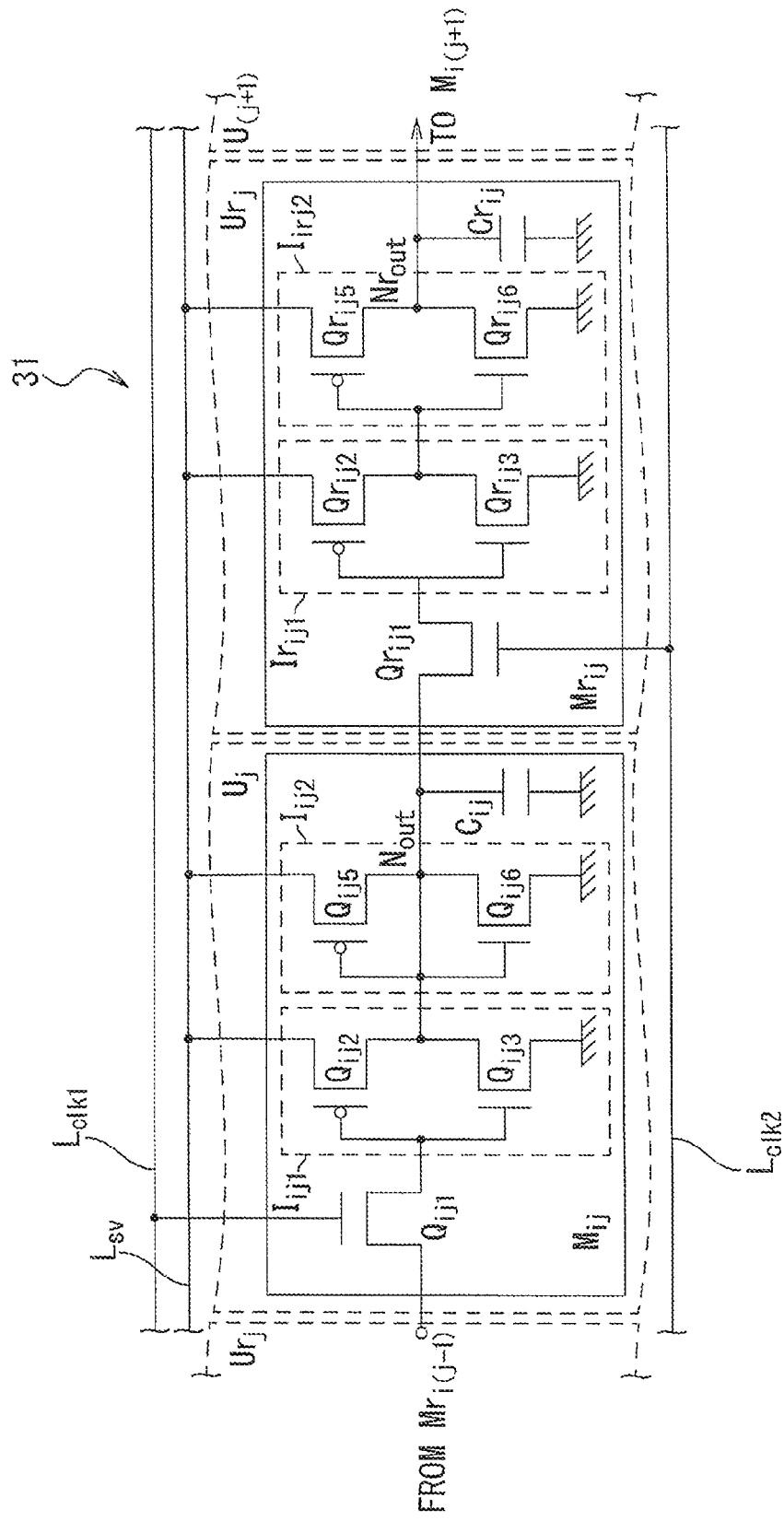
[Fig. 8]

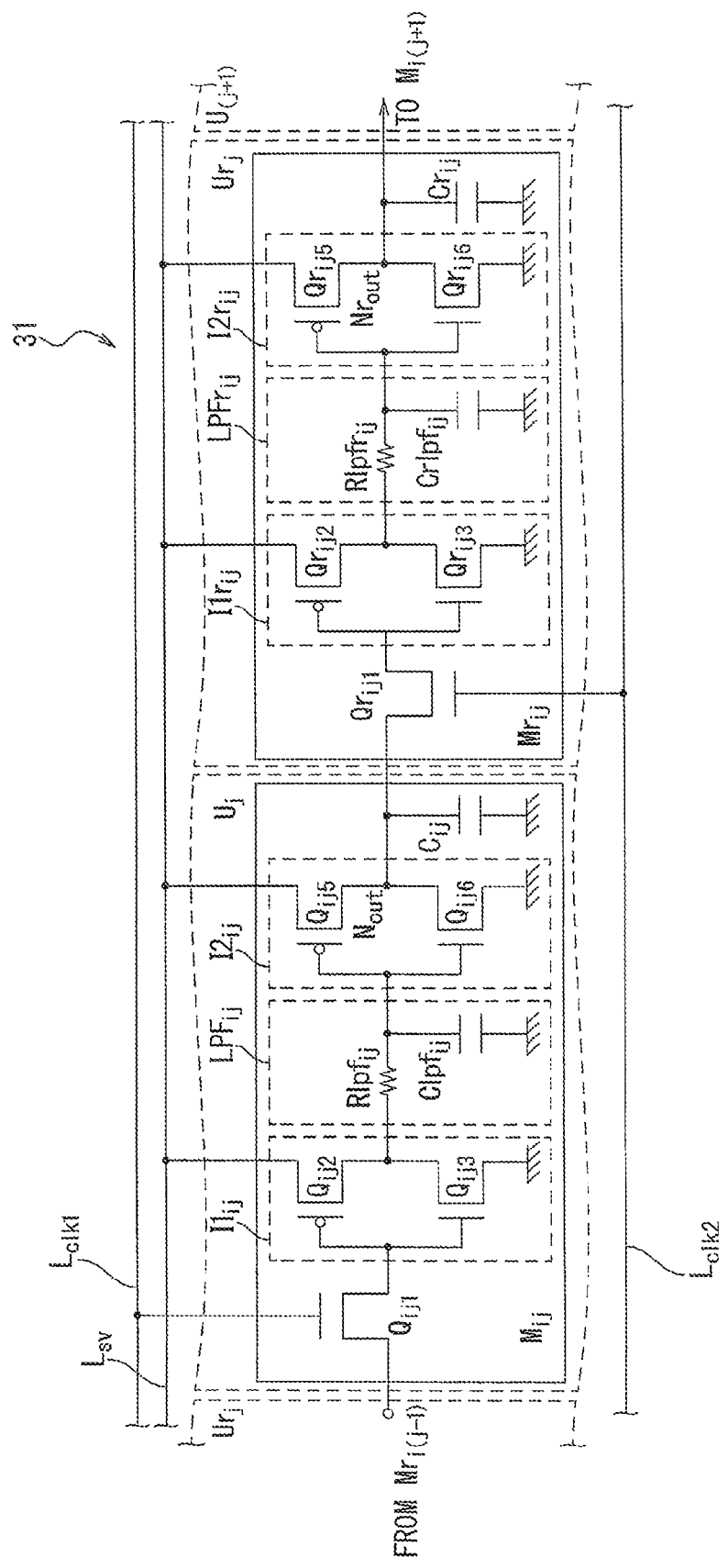
[Fig. 9]

[Fig. 10]
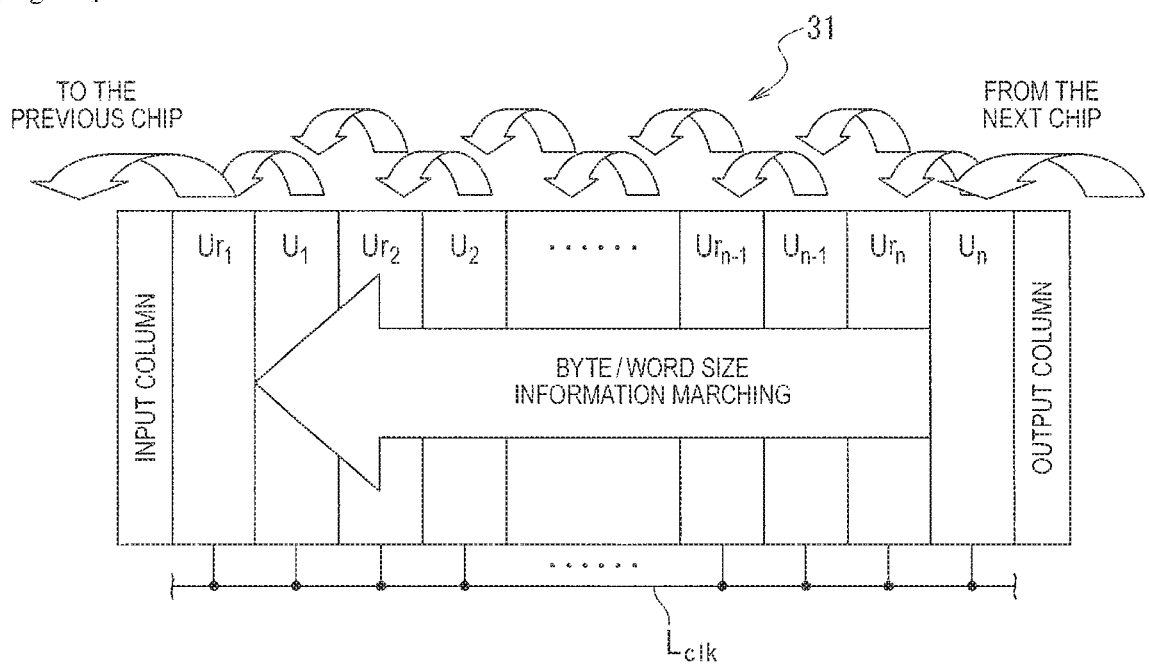

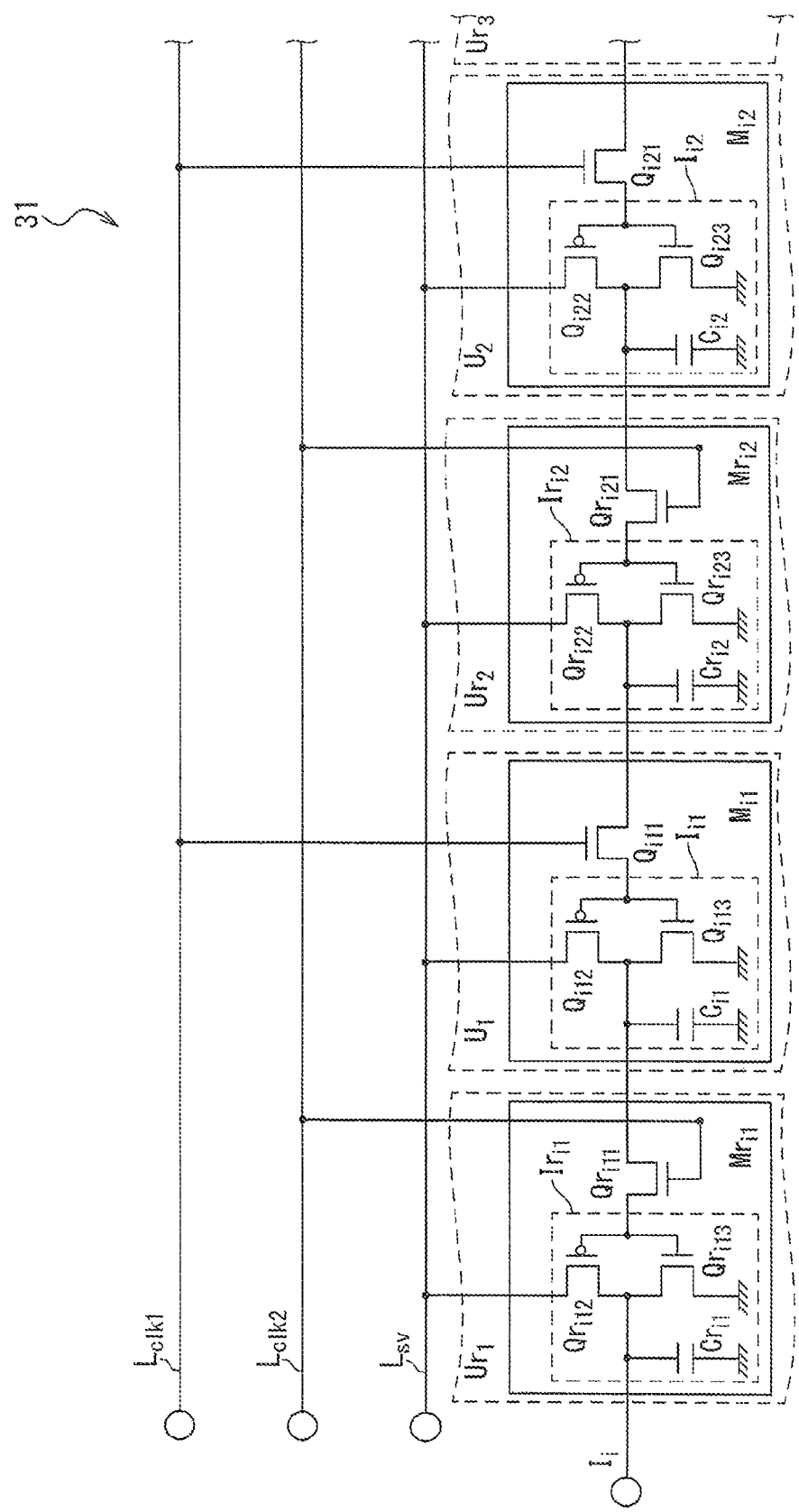
[Fig. 11A]

[Fig. 11B]
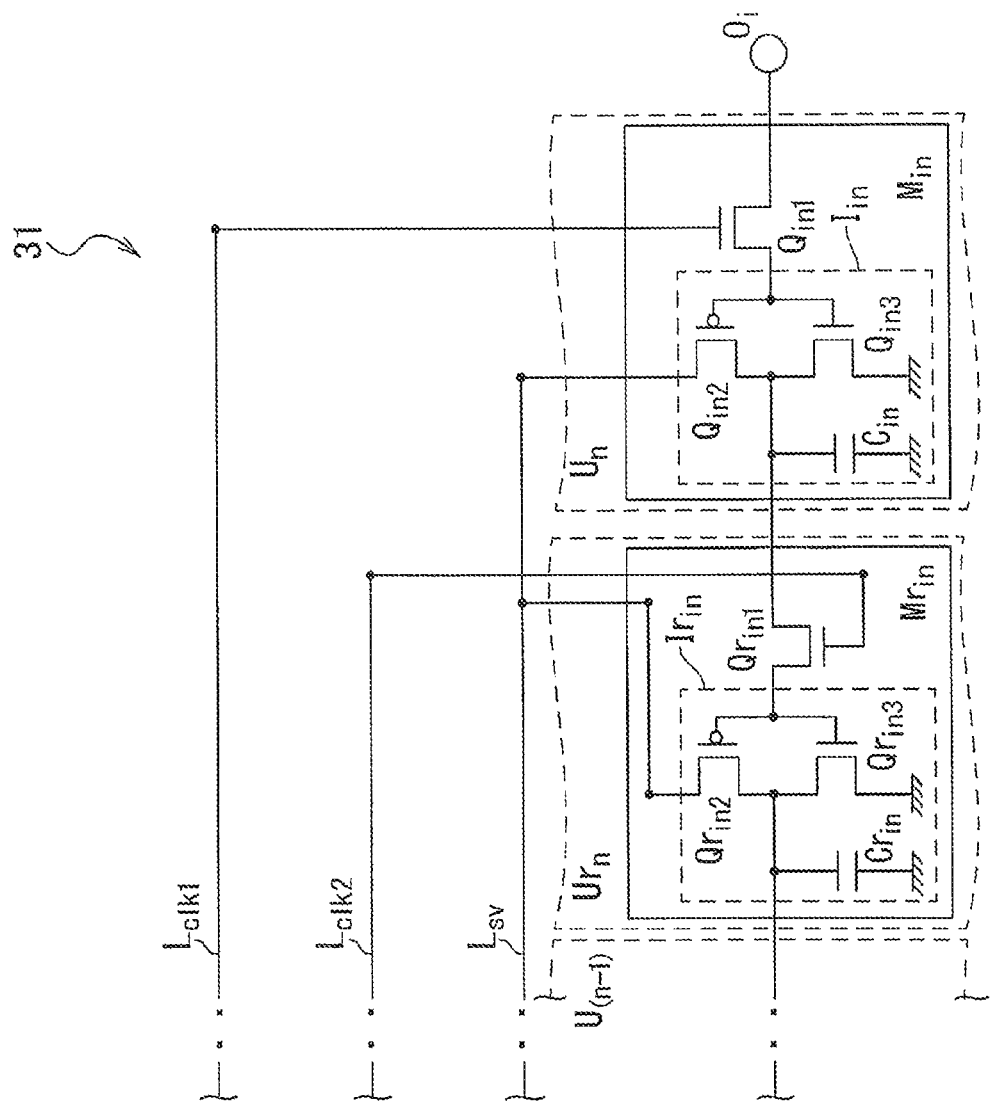

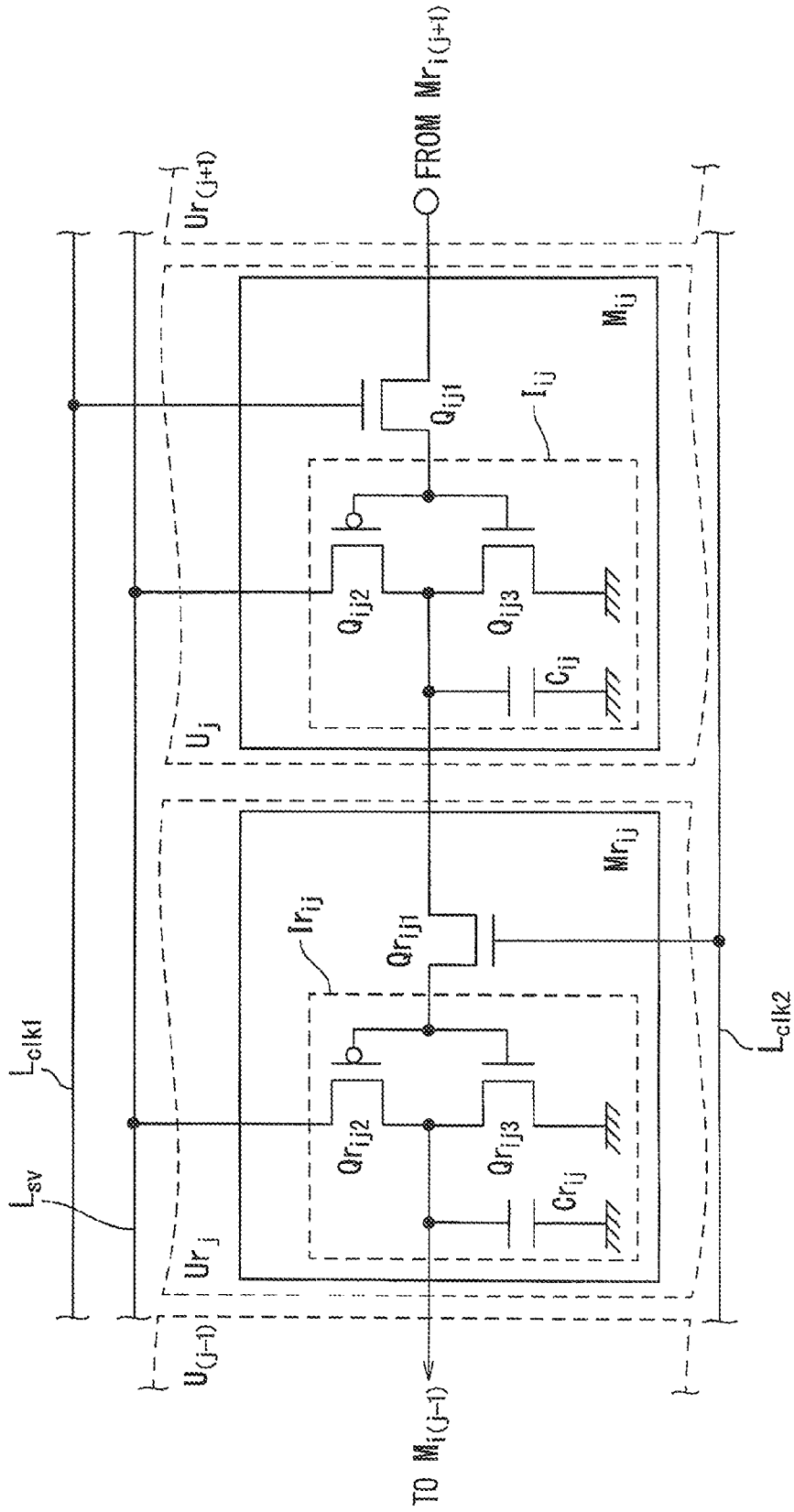
[Fig. 12]

[Fig. 13]
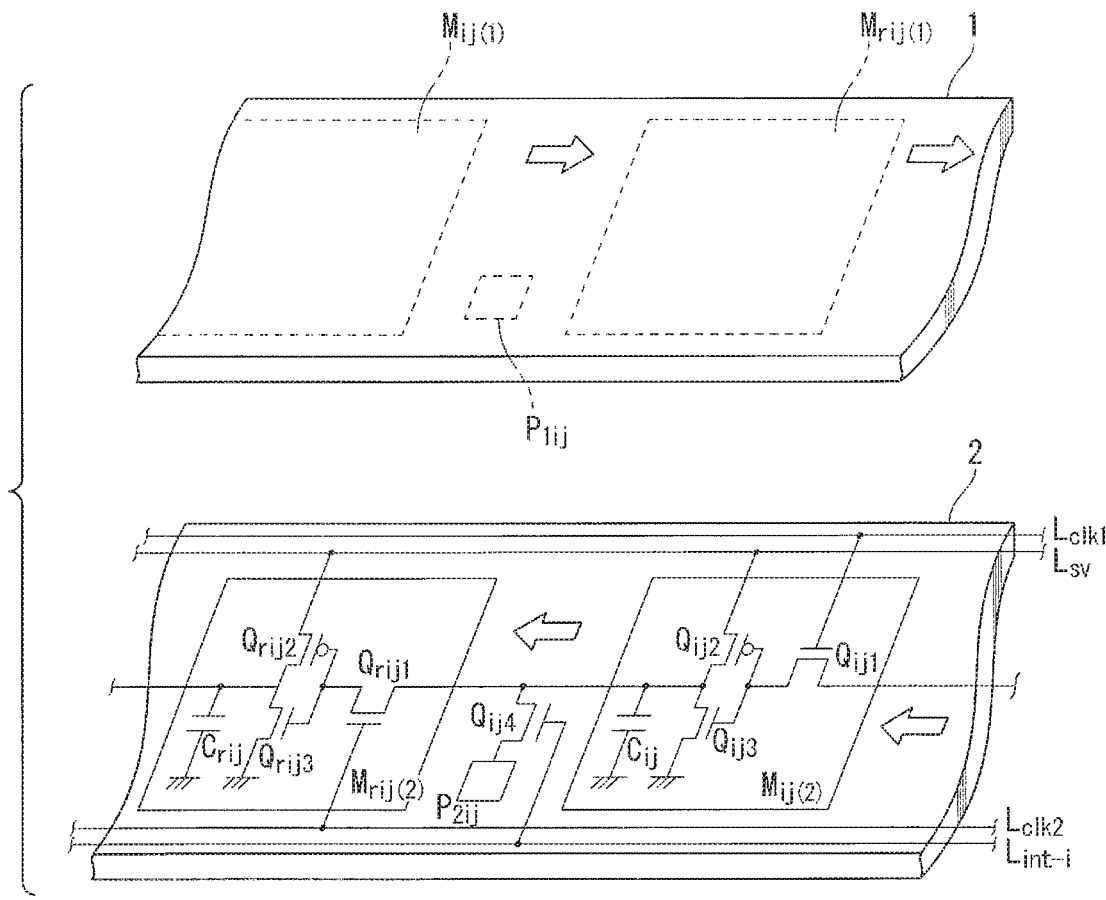
[Fig. 14]
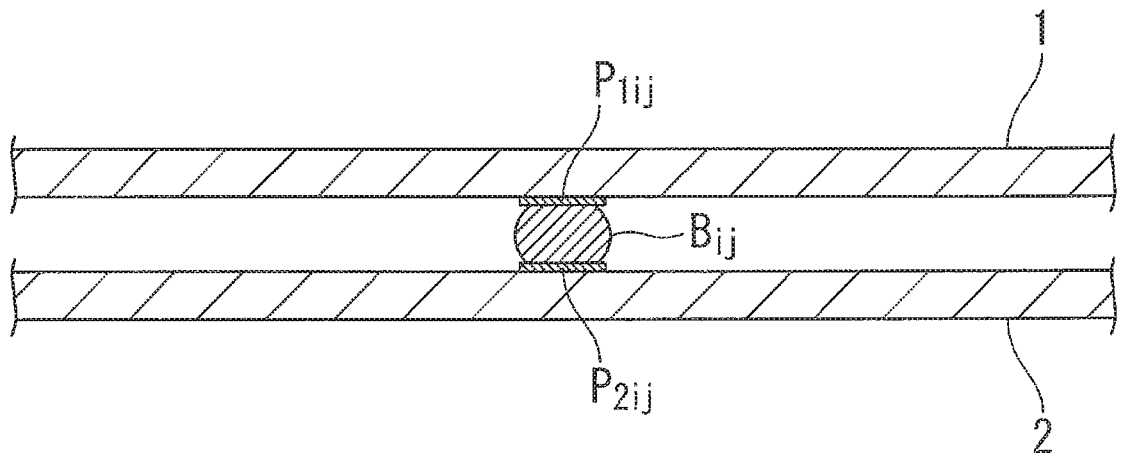

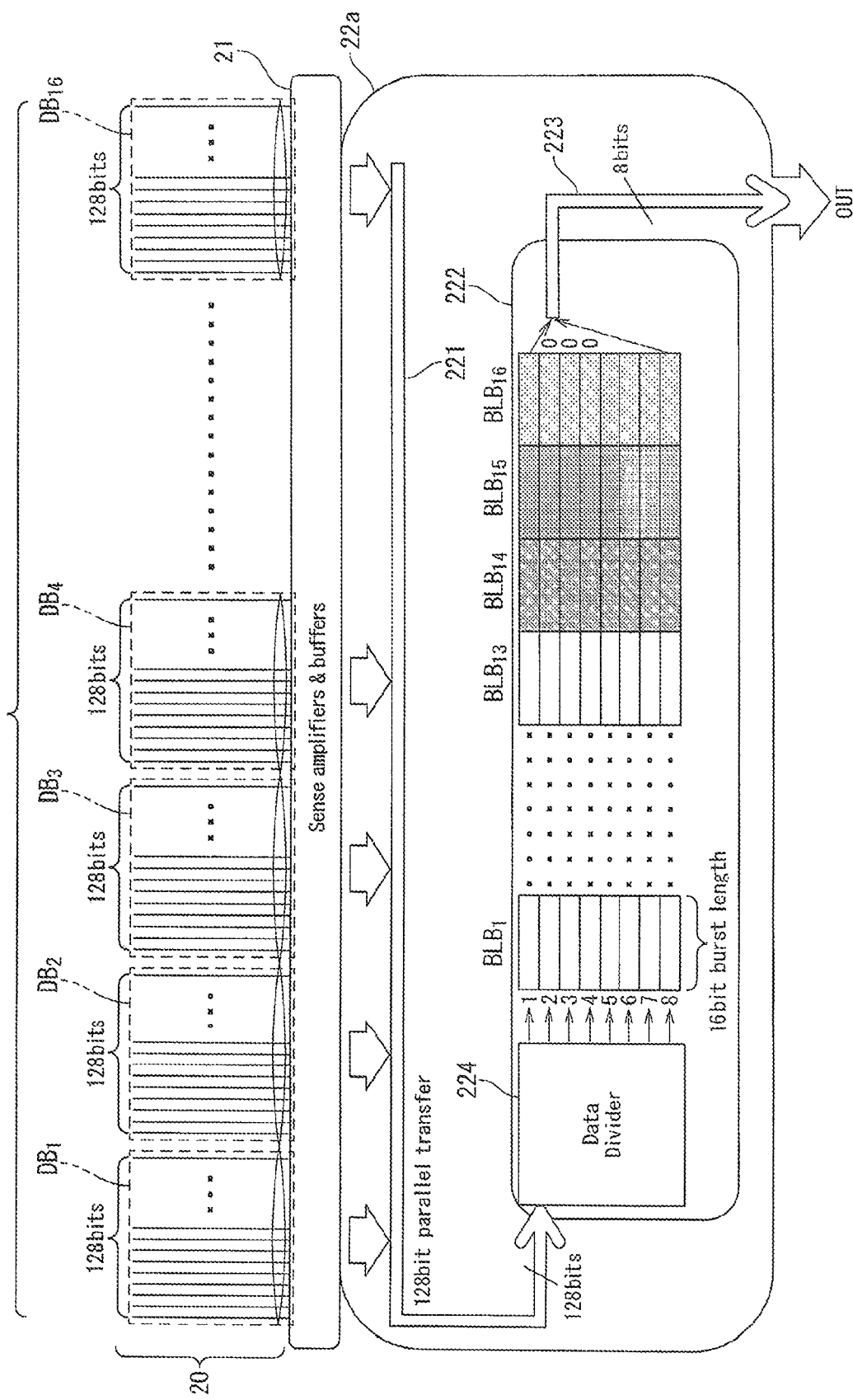
[Fig. 15]

[Fig. 16]
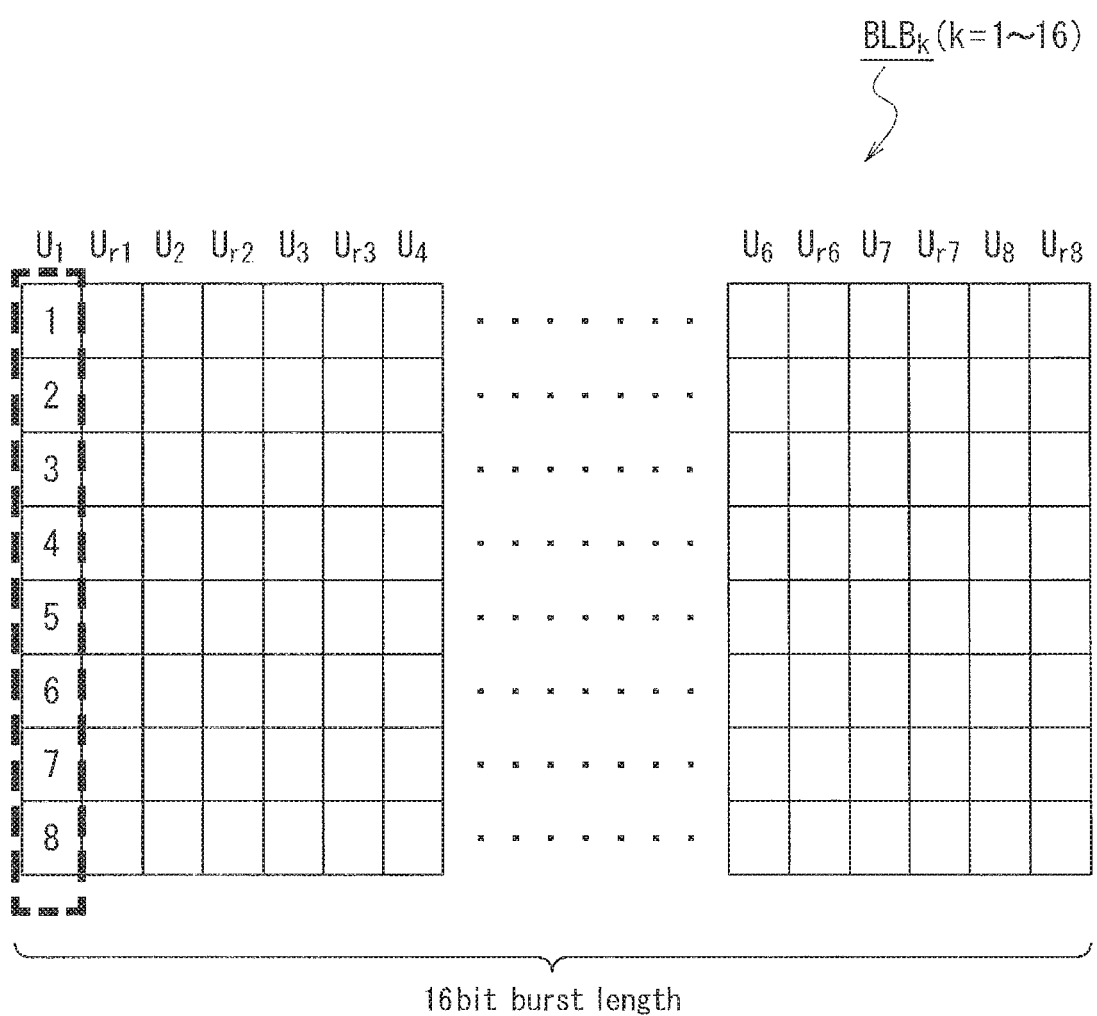

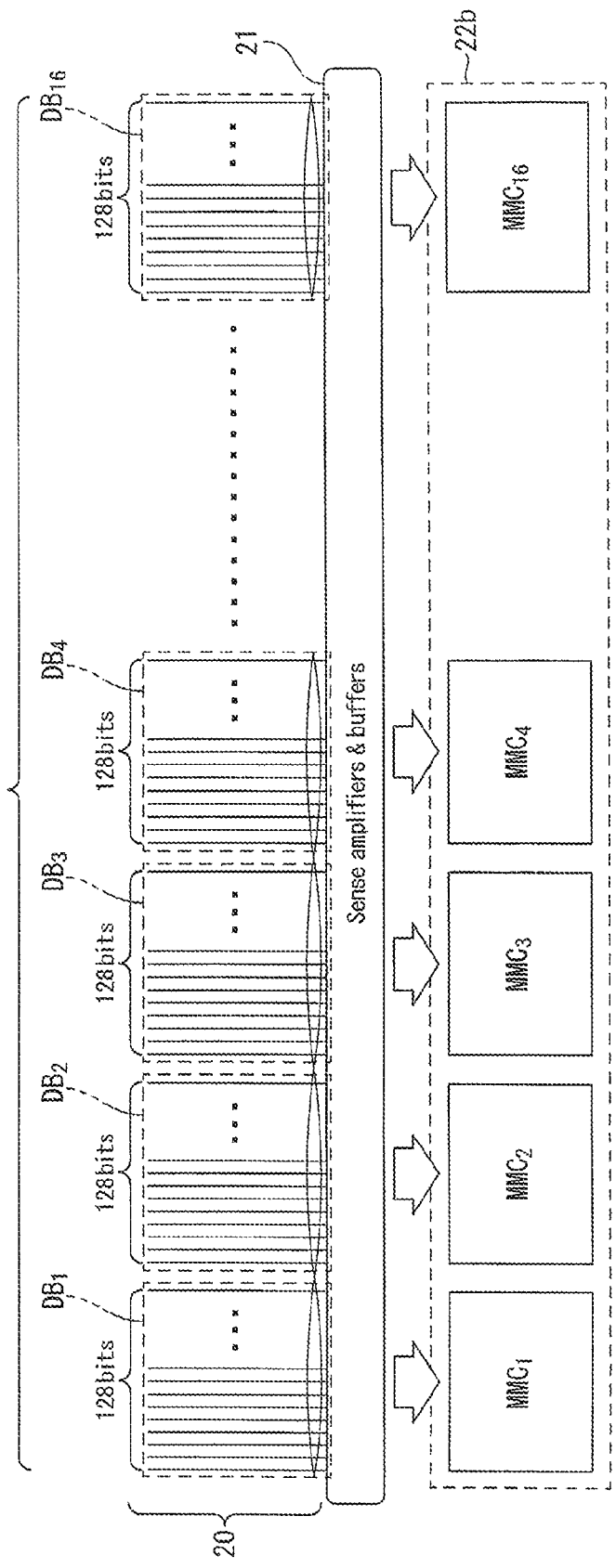
[Fig. 17]

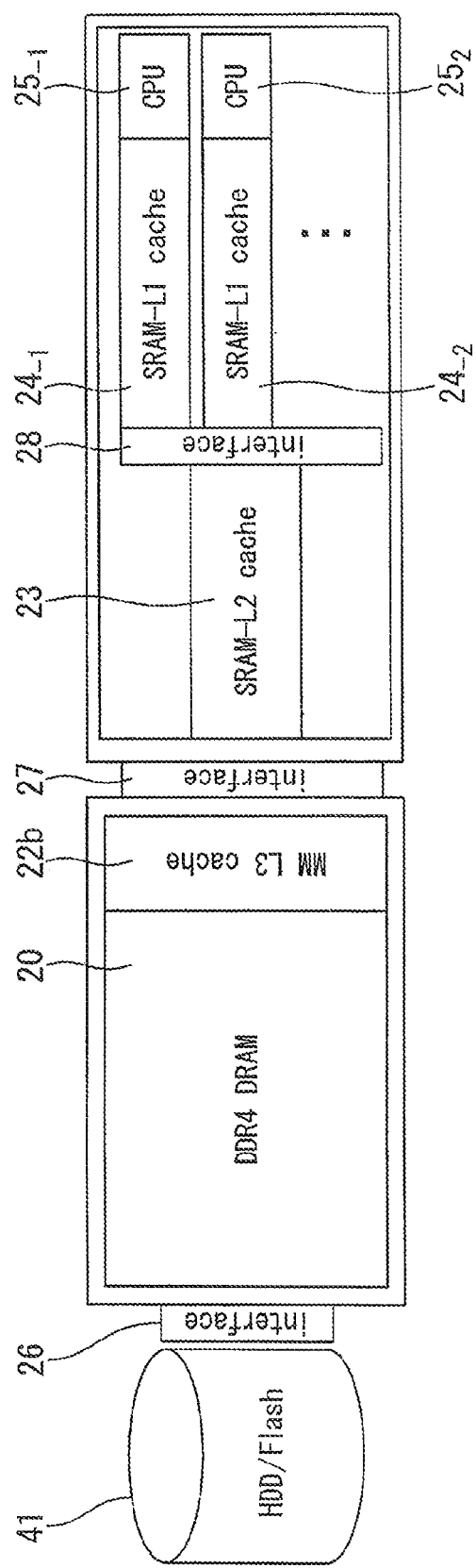
[Fig. 18]

[Fig. 19]
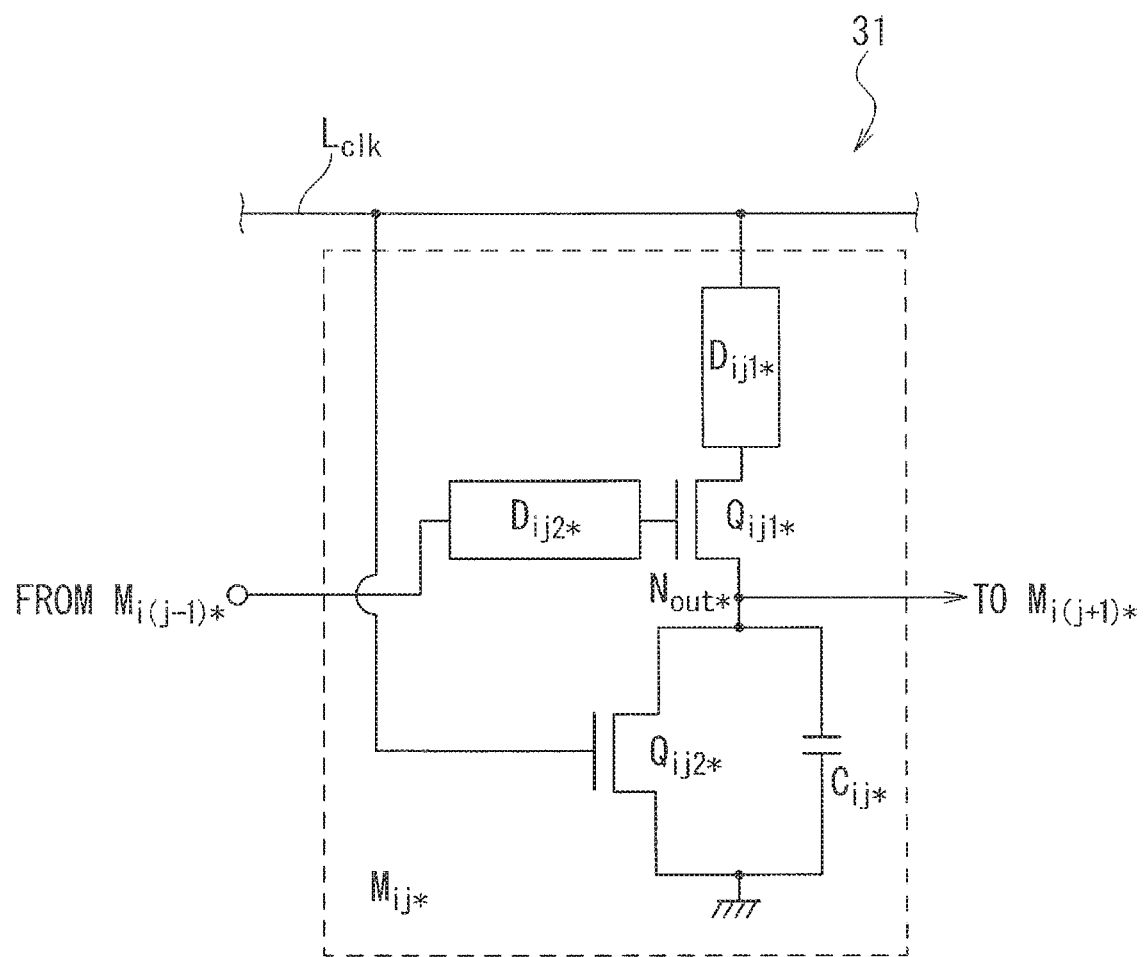

MARCHING MEMORY AND COMPUTER SYSTEM

TECHNICAL FIELD

The instant invention relates to new configurations of marching memories (MMs) and new computer systems using the new configurations of MMs, which operate at lower energy consumption and higher speed.

BACKGROUND ART

In patent literatures (PTLs) 1-3, T. Nakamura and M. J. Flynn have already proposed a MM computer system implemented by a marching main memory (MMM), which embraces an array of memory units. In PTLs 1-3, the term of "marching" is employed, because each of the memory units stores a moving parallel data of byte size or word size like an aligned matrix formation of moving troops, characterizing the operation of the MMM. The MMM transfers a continuous stream of the stored parallel data of the byte size or the word size, synchronously with a clock signal for driving a processor in the MM computer system, step by step in the manner of "marching" toward the output terminals of the MMM. The MMM provides the processor with the continuous stream of the stored parallel data actively and sequentially so that the processor can execute the arithmetic and logic operations with the stream of the stored parallel data.

In the MM computer architecture, as recited in PTLs 1-3, because the parallel data of the byte size or the word size is transferred synchronously with the clock signal for driving the processor, the random access operation of the individual bit-level cells is not required. Then, the von Neumann bottleneck between the processor and the conventional memory, which inherently exists in conventional von Neumann computer systems, can be removed, and therefore, a very high speed operation with very low power consumption can be achieved by the MM computer architecture.

FIG. 19 illustrates a j-th hit-level cell $M_{ij}^*$ on the i-th row of the m*2n matrix in the earlier MM recited in PTL 3. The bit-level cell $M_{ij}^*$ includes a first nMOS transistor $Q_{ij1}^*$, an nMOS transistor $Q_{ij2}^*$, and a capacitor $C_{ij}^*$ connected in parallel with the nMOS transistor $Q_{ij2}^*$. The first nMOS transistor $Q_{ij1}^*$ has a drain electrode connected to a clock-line $L_{clk}$ through a first delay element $D_{ij1}^*$ and a gate electrode connected to the output terminal of the preceding bit-level cell through a second delay element $D_{ij2}^*$. The nMOS transistor $Q_{ij2}^*$ has a drain electrode connected to a source electrode of the first nMOS transistor $Q_{ij1}^*$, a gate electrode connected to the clock-line $L_{clk}$, and a source electrode connected to the ground potential. In FIG. 19, an output node $N_{out}^*$ connecting the source electrode of the first nMOS transistor $Q_{ij1}^*$ and the drain electrode of the nMOS transistor $Q_{ij2}^*$ serves as an output terminal of the hit-level cell $M_{ij}^*$, and the output node $N_{out}^*$ delivers the signal stored in the capacitor $C_{ij}^*$ to the next bit-level cell $M_{i(j+1)}^*$.

In a situation that the earlier MM, which is recited in PTL 3, operates at lower supply voltage such as 1.1 volts levels, when a gate potential slightly larger than the threshold voltage $V_{th}$ of the first nMOS transistor $Q_{ij1}^*$ is applied to the gate electrode of the first nMOS transistor $Q_{ij1}^*$ so as to turn on the first nMOS transistor $Q_{ij1}^*$, because the first nMOS transistor $Q_{ij1}^*$ produces a relatively large voltage drop compared to the supply voltage of 1.1 volts levels, the gate potential applied to the gate electrode of the first nMOS transistor $Q_{i(j+1))1}^*$ of the next bit-level cell $M_{i(j+1)}^*$ drops greatly.

Therefore, if the difference between the supply voltage and the threshold voltage $V_{th}$ is small, there is a possibility that the potential at the source electrode of the first nMOS transistor $Q_{ij1}^*$ will be lower than the gate potential supposed to be applied to the gate electrode of the first nMOS transistor $Q_{i(j+1)1}^*$ of the next bit-level cell $M_{i(j+1)}^*$. Therefore, when passing through a plurality of stages of bit-level cells $M_{ij1}^*$, $M_{i(j+1)1}^*$, $M_{i(j+2)1}^*$, ..., which are chained in series in a propagation path, because each of the bit-level cells $M_{ij1}^*$, $M_{i(j+1)1}^*$, $M_{i(j+2)1}^*$, ..., in series is less saturated at its output than at its input, the potentials at the source electrodes of the first nMOS transistor $Q_{ij1}^*$, $Q_{i(j+1)1}^*$, $Q_{i(j+2)1}^*$, ..., gradually attenuate, although each of stages of bit-level cells $M_{ij1}^*$, $M_{i(j+1)1}^*$, $M_{i(j+2)1}^*$, ..., is required to restore the signal voltage to the full value. That is, potentials of the output terminals of the bit-level cells, eventually possibly becoming smaller than the threshold voltage $V_{th}$. As a result, the stored information cannot be transferred to the next bit-level cell.

CITATION LIST

Patent Literature

PTL 1: U.S. Pat. No. 8,949,650 B2
PTL 2: U.S. Pat. No. 9,361,957 B2
PTL 3: EP-2815403 B1,

SUMMARY OF INVENTION

Technical Problem

In view of the above problems, it is an object of the present invention to provide a marching memory and a marching memory computer system using the marching memory, which facilitates an accurate transferring of stored information with lower supply voltages.

Solution to Problem

A first aspect of the present invention inheres in a marching memory configured to store a stream of parallel data or instructions of byte size or word size, for transferring the stream of parallel data or instructions toward a processor in the computer system along a direction of the stream, synchronously at a clock frequency of the processor. The marching memory embraces an alternating periodic array of odd-numbered columns (hereinafter called "O-columns") and even-numbered columns (hereinafter called "E-columns"), Each of the O-columns has a sequence of front-stage cells aligned along a column direction in a matrix so as to invert and store a set of moving information of the byte size or the word size. And each of the E-columns has a sequence of rear-stage cells aligned along the column direction so as to re-invert and store a set of moving information inverted by adjacent odd-numbered columns.

A second aspect of the present invention inheres in a marching memory adapted for a random-access capable memory having a plurality of pipelined memory-array blocks, configured to store a stream of parallel data or instructions of byte size or word size, for transferring the stream of parallel data or instructions from the plurality of memory-array blocks toward a processor in the computer system along a direction of the stream, synchronously at a clock frequency of the processor. Here, the marching memory has a structure prescribed by the first aspect of the present invention.

A third aspect of the present invention inheres in a computer system, which encompasses a processor and the marching memory prescribed by the first aspect of the present invention.

A fourth aspect of the present invention inheres in a computer system, which encompasses a processor and a main memory. The main memory includes a random-access capable memory having a plurality of pipelined memory-array blocks, and a marching memory as an interface allocated at a path between the random-access capable memory and the processor. The marching memory stores a stream of parallel data or instructions of byte size or word size, for transferring the stream of parallel data or instructions synchronously along a direction of the stream at a clock frequency for driving the processor in the computer system, and the marching memory provides the processor with the stream of parallel data or instructions from the plurality of memory-array blocks actively and sequentially so that the processor can execute arithmetic and logic operations with the stored stream of parallel data or instructions. Here, the marching memory has a structure prescribed by the first aspect of the present invention.

A fifth aspect of the present invention inheres in a computer system, which encompasses a processor and a main memory. The main memory includes a random-access capable memory having a plurality of pipelined memory-array blocks, and a cache memory implemented by a marching memory. The marching memory stores a stream of parallel data or instructions of byte size or word size, for transferring the stream of parallel data or instructions synchronously along a direction of the stream at a clock frequency for driving the processor in the computer system, and the marching memory provides the processor with the stream of parallel data or instructions from the plurality of memory-array blocks actively and sequentially so that the processor can execute arithmetic and logic operations with the stored stream of parallel data or instructions. Here, the marching memory has a structure prescribed by the first aspect of the present invention.

BRIEF DESCRIPTION OF DRAWINGS

FIG. 1 illustrates a schematic block diagram illustrating a fundamental organization of a computer system pertaining to first to third embodiments of the present invention;

FIG. 2 illustrates a transferring behavior of information in an array of memory units, which implements a marching memory (MM) used in the computer system illustrated in FIG. 1, in relation with the first, the second and the third embodiments;

FIG. 3A illustrates an example of a detailed structure of a first column in a matrix of the MM used in the computer system focusing to a configuration used in the first embodiment, as an example;

FIG. 3B illustrates the detailed structure of a second column in the matrix of the MM, being aligned next to the first column illustrated in FIG. 3A;

FIG. 3C illustrates the detailed structure of an n-th column in the matrix of the MM, being aligned at output terminal side;

FIG. 4A illustrates a transistor-level representation of the cell-array in a portion of the MM pertaining to the first embodiment, focusing to four neighboring bit-level cells;

FIG. 4B illustrates a transistor-level representation of the cell-array in another portion of the MM pertaining to the first embodiment, focusing to four neighboring bit-level cells;

FIG. 5A illustrates schematic examples of the transient response of the bit-level cell against to the waveforms of clock signals being applied to the MM of the first embodiment;

FIG. 5B illustrates schematic examples of the transient response of the bit-level cell against to the clock signals being applied to the MM of the first embodiment;

FIG. 5C illustrates schematic examples of the transient response of the bit-level cell against to the clock signals so as to explain the operation of the MM pertaining to the first embodiment;

FIG. 5D illustrates schematic examples of the transient response of the bit-level cell against to the clock signals so as to explain the operation of the MM pertaining to the first embodiment;

FIG. 5E illustrates schematic examples of the transient response of the bit-level cell against to the clock signals so as to explain the operation of the MM pertaining to the first embodiment;

FIG. 6A illustrates an example of the waveforms of clock signals being applied to the MM of the first embodiment;

FIG. 6B illustrates a logical level of the input signal being applied to a bit-level cell in the MM of the first embodiment;

FIG. 6C illustrates the actual responses of the bit-level cell against to the waveforms of clock signals being applied to the MM of the first embodiment;

FIG. 6D illustrates the actual responses of the bit-level cell against to the waveforms of clock signals being applied to the MM of the first embodiment;

FIG. 6E illustrates the actual responses of the bit-level cell against to the waveforms of clock signals being applied to the MM of the first embodiment;

FIG. 6F illustrates the actual responses of the bit-level cell against to the waveforms of clock signals being applied to the MM of the first embodiment;

FIG. 7A illustrates a transistor-level representation of the bit-level cells in a MM adapted for a computer system pertaining to a second embodiment of the present invention;

FIG. 7B represents waveforms of clock signals being applied to the bit-level cells illustrated in FIG. 7A;

FIG. 8 illustrates a transistor-level representation of the bit-level cells in a MM adapted for a computer system pertaining to a comparative example of a third embodiment of the present invention;

FIG. 9 illustrates a transistor-level representation of the bit-level cells in a MM adapted for a computer system pertaining to the third embodiment of the present invention;

FIG. 10 illustrates a behavior of "a reverse directional transfer" of information in an array of memory units implementing a reverse directional MM, adapted for the computer system pertaining to an additional embodiment of the present invention;

FIG. 11A illustrates an example of a transistor-level circuit configuration of cell array at input terminal side of a forward directional MM, which serves as the output terminal side of the reverse directional MM illustrated in FIG. 10 pertaining to the additional embodiment;

FIG. 11B illustrates a transistor-level circuit configuration in a cell array at output terminal side of the forward directional MM, which serves as the input terminal side of the reverse directional MM illustrated in FIG. 10;

FIG. 12 illustrates a transistor-level representation of hit-level cells in the reverse directional MM adapted for the computer system pertaining to the additional embodiment;

FIG. 13 illustrates a bird's-eye view of a bi-directional MM implemented by a stacked structure with first and second semiconductor chips, pertaining to a further additional embodiment of the present invention;

FIG. 14 illustrates a side view of an electrical connection between the first and second semiconductor chips illustrated in FIG. 13;

FIG. 15 illustrates a schematic plan view of a marching memory (MM) assisted dynamic random-access memory (DRAM) pertaining to a still further additional embodiment of the present invention;

FIG. 16 illustrates a schematic plan view of one of the burst-length blocks illustrated in FIG. 15, each of the burst-length blocks is implemented by the marching memory architecture.

FIG. 17 illustrates a schematic plan view of another example of the MM assisted DRAM pertaining to a yet still additional embodiment of the present invention;

FIG. 18 illustrates an example of a memory hierarchy of a computer system pertaining to a yet still additional embodiment of the present invention; and FIG. 19 illustrates a transistor-level representation of an earlier single bit-level cell in the MM used in an earlier MM computer system.

DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another or inside a given figure.

In the following description specific details are set forth, such as specific materials, processes and equipment in order to provide a thorough understanding of the present invention. It will be apparent, however, to one skilled in the art that the present invention may be practiced without these specific details. In other instances, well-known manufacturing materials, processes and equipment are not set forth in detail in order not to unnecessarily obscure the present invention.

Outline of MMM & MM Computer System

As illustrated in FIG. 1, a computer system which is supposed to be used in first to third embodiments of the present invention encompasses a processor 11 and a marching main memory (MMM) 31. The processor 11 includes a control unit 111 having a clock generator 113 configured to generate a clock signal, and an arithmetic logic unit (ALU) 112 configured to execute arithmetic and logic operations synchronized with the clock signal.

For example, the MMM 31, which will be explained in the first, the second and the third embodiments, may encompass an array of odd-numbered columns (O-columns) $U_1, U_2, U_3, \ldots, U_{n-1}, U_n$ as illustrated in FIG. 2. Each of the O-columns $U_1, U_2, U_3, \ldots, U_{n-1}, U_n$ stores and transfers a set of moving information in parallel, the set of moving information includes inverted data of byte-size data, word-size data, byte-size instructions or word-size instructions in succession.

That is, each of the O-columns $U_1, U_2, U_3, \ldots, U_{n-1}, U_n$ stores a continuous stream of parallel data or instructions of byte size or word size. The MMM 31 further encompasses input terminals of the array and output terminals of the array. Each of the O-columns $U_1, U_2, U_3, \ldots, U_{n-1}, U_n$ shapes the corresponding pulse waveform of the entered information even at lower supply voltages.

In addition, from the left to the right, even-numbered columns (E-columns) $Ur_1, Ur_2, Ur_3, \ldots, Ur_{n-1}, Ur_n$ are further inserted alternately between the adjacent O-columns $U_1, U_2, U_3, \ldots, U_{n-1}$ in turn. And the far-right E-column $Ur_n$ is further attached after the last stage O-column $U_n$ as illustrated FIG. 2. That is, E-columns $Ur_1, Ur_2, Ur_3, \ldots, Ur_{n-1}, Ur_n$ are arranged at alternating periodic positions to O-columns $U_1, U_2, U_3, \ldots, U_{n-1}, U_n$ along the direction of the stream of the parallel data or instructions.

As illustrated in FIG. 2, each of the E-columns $Ur_1, Ur_2, Ur_3, \ldots, Ur_{n-1}, Ur_n$ re-inverts and stores a set of moving information in parallel, the set of moving information includes the inverted byte-size data, the inverted word-size data, the inverted byte-size instructions or the inverted word-size instructions of the corresponding adjacent O-columns $U_1, U_2, U_3, \ldots, U_{n-1}, U_n$ in succession. That is, each of the E-columns $Ur_1, Ur_2, Ur_3, \ldots, Ur_{n-1}, Ur_n$ stores the continuous stream of parallel data or instructions of byte size or word size.

Then, each of the pairs of the O-column and the corresponding E-column $U_1$ and $Ur_1$; $U_2$ and $Ur_2$; $U_3$ and $Ur_3$; . . . , $U_{n-1}$ and $Ur_{n-1}$; $U_n$ and $Ur_n$ can shape the attenuated input waveforms to recover the original pulse-height, because the attenuated pulse-heights of signal "1" can be amplified to the voltage level of the supply voltage, through each of the combined operations of the O-columns $U_1, U_2, U_3, \ldots, U_{n-1}, U_n$ and the corresponding E-columns $Ur_1, Ur_2, Ur_3, \ldots, Ur_{n-1}, Ur_n$.

Since the set of inverted information stored in the respective O-columns $U_1, U_2, U_3, \ldots, U_{n-1}, U_n$ are re-inverted and transferred sequentially in parallel along the direction toward the output terminal, in synchronization with the clock signal, via E-columns $Ur_1, Ur_2, Ur_3, \ldots, Ur_{n-1}, Ur_n$, and the stored information is actively and sequentially transferred in parallel to the ALU 112.

That is, MMM 31 stores the continuous stream of parallel data or instructions of byte size or word size, for transferring the stream of parallel data or instructions toward the processor 11 in the computer system along the direction of the stream, synchronously at the clock frequency of the processor 11. Then, the ALU 112 executes the arithmetic and logic operation in synchronization with the clock signal according to the information sequentially transferred from the MMM 31.

As illustrated in FIG. 1, the MMM 31 and the processor 11 are electrically connected by a plurality of joint members 54. For example, each of joint members 54 may be implemented by a first terminal pin attached to the MMM 31, a second terminal pin attached to the processor 11, and an electrical conductive bump interposed between the first and second terminal pins. For the material of the electrical conductive bumps, solder balls, gold (Au) bumps, silver (Ag) bumps, copper (Cu) bumps, nickel-gold (Ni—Au) alloy bumps or nickel-gold-indium (Ni—Au—In) alloy bumps, etc. are acceptable.

The resultant data of the processing in the ALU 112 are sent out to the MMM 31 through the joint members 54. Therefore, as represented by bidirectional arrow PHI [GREEK]$_{12}$ in FIG. 1, data are transferred bi-directionally between the MMM 31 and the processor 11 through the joint members 54. On the contrary, as represented by uni-directional arrow Eta [Greek]$_{11}$ FIG. 1, as to the instructions movement, there is only one way of instruction-flow from the MMM 31 to the processor 11.

As illustrated in FIG. 1, the organization of the MM computer system pertaining to the first to third embodiments further encompasses a secondary memory 41 such as disk, an input unit 61, an output unit 62 and input/output (I/O) interface circuit 63. Similar to a conventional von Neumann computer, the signals or data are received by the input unit 61, and the signals or data are sent toward the output unit 62. For instance, known keyboards and known mice can be considered as the input unit 61, while known monitors and printers can be considered as the output unit 62. Known devices for communication between computers, such as modems and network cards, typically serve for both the input unit 61 and the output unit 62.

Note that the designation of a device as either the input unit 61 or the output unit 62 depends on the perspective. The input unit 61 takes as input physical movement that the human user provides and converts it into signals that the MM computer system pertaining to the first to third embodiments can understand. For example, the input unit 61 converts incoming data and instructions into a pattern of electrical signals in binary code that are comprehensible to the MM computer system pertaining to the first to third embodiments, and the output from the input unit 61 is fed to the MMM 31 through the I/O interface circuit 63.

The output unit 62 takes as input signals that the MMM 31 provides through the I/O interface circuit 63. The output unit 62 then converts these signals into representations that human users can see or read, reversing the process of the input unit 61, translating the digitized signals into a form intelligible to the user. The I/O interface circuit 63 is required whenever the processor 11 drives the input unit 61 and the output unit 62. The processor 11 can communicate with the input unit 61 and the output unit 62 through the I/O interface circuit 63. If in the case of different data formatted being exchanged, the I/O interface circuit 63 converts serial data to parallel form and vice versa is provision for generating interrupts and the corresponding type numbers for further processing by the processor 11 if required.

The secondary memory 41 stores data and information on a more long-term basis than the MMM 31. While the MMM 31 is concerned mainly with storing programs currently executing and data currently being employed, the secondary memory 41 is generally intended for storing anything that needs to be kept even if the computer is switched off or no programs are currently executing. The examples of the secondary memory 41 are known hard disks (or hard drives) and known external media drives (such as CD-ROM drives).

These storage architectures are most commonly used to store the computer's operating system, the user's collection of software and any other data user wishes. While the hard drive is used to store data and software on a semi-permanent basis and the external media drives are used to hold other data, this setup varies wildly depending on the different forms of storage available and the convenience of using each. As represented by bidirectional arrow PHI [GREEK]$_1$ in FIG. 1, data are transferred bi-directionally between the secondary memory 41 and the MMM 31 and the processor 11 through existing wire connection 53.

Although the illustration is omitted, in the MM computer system of the first to third embodiments illustrated in FIG. 1, the processor 11 may include a plurality of arithmetic pipelines configured to receive the stored information (data) through the output terminals from the MMM 31, and as represented by bidirectional arrow PHI [GREEK]$_{12}$ in FIG. 1, data are transferred bi-directionally between the MMM 31 and the plurality of arithmetic pipelines through the joint members 54.

In the MM computer system of the first to third embodiments illustrated in FIG. 1, there are no buses consisting of the data bus and address bus because the whole computer system has no global wires even in any data exchange between the processor 11 and the MMM 31, while the wires or the buses implement the bottleneck in the conventional computer system. There are only short local wires within the MMM 31 or connecting portions of the MMM 31 with a corresponding ALU 112. As there are no global wires, which generate time delay and stray capacitors between these wires, the MM computer system of the first to third embodiments can achieve much higher processing speed and lower power consumption.

Entire Matrix Configuration of MM

In conventional von Neumann computers, the unit of address resolution is either a character (e.g. a byte) or a word. If the unit is a word, then a larger amount of memory can be accessed using an address of a given size. On the other hand, if the unit is a byte, then individual characters can be addressed (i.e. selected during the memory operation). Machine instructions are normally fractions or multiples of the architecture's byte size or word size. This is a natural choice since instructions and data usually share the same memory subsystem.

Although the MMM 31 is illustrated in FIG. 1 for the purpose of convenience, the marching memory (MM) of the present invention is not limited to the MMM 31 illustrated in FIG. 1, and the MM is applicable to smaller sizes of storage mediums such as a conventional cache memory and a conventional register file, etc.

Before explaining detailed transistor-level representations of triple-transistors cell (1st embodiment), quadruple-transistors cell (2nd embodiment) and 2.5-transistors cell (3rd embodiment), which implement respectively the MMs of the present invention, we will explain an outline of a full structure of the MM illustrated in FIG. 2, referring to FIGS. 3A, 3B and 3C.

As illustrated in FIGS. 3A, 3B and 3C, the MM is implemented by m*2n matrix, which include an array of O-columns $U_1$, $U_2$, $U_3$, . . . , $U_{n-1}$, $U_n$, and an array of E-columns $Ur_1$, $Ur_2$, $Ur_3$, . . . , $Ur_{n-1}$, $U_n$ that are inserted alternately between the adjacent O-columns $U_1$, $U_2$, $U_3$, . . . , $U_{n-1}$, $U_n$. Here, "m" is an integer determined by byte size or word size. As the choice of a byte size or a word size is arbitrary, when computer architecture is designed, byte size or word sizes are naturally multiples of eight bits, with 16, 32, and 64 bits being commonly used.

Namely, as illustrated in FIG. 3A, a first E-column $Ur_1$ is inserted between the first O-column $U_1$ and the second O-column $U_2$. The combination of the first O-column $U_1$ and the first E-column $Ur_1$ implements a first double-bit memory-unit. In the double-bit memory-unit, horizontally neighboring pairs of bit-level cells are vertically arrayed so as to implement dual columns. Therefore, the successive two bit-level data in a data stream are shared by two neighboring bit-level cells in the double-bit memory-unit.

And, as illustrated in FIG. 3B, a second E-column $Ur_2$ is inserted between the second O-column $U_2$ and the third O-column $U_3$. The combination of the second O-column $U_2$ and the second E-column $Ur_2$ implements a second double-bit memory-unit. Similarly, a third E-column $Ur_3$ is inserted between the third O-column $U_3$ and the fourth O-column $U_4$. The combination of the third O-column $U_3$ and the third E-column $Ur_3$, implements a third double-bit memory-unit. And, as illustrated in FIG. 3C, an n-th E-column $Ur_n$ is arranged behind the n-th O-column $U_n$. The combination of the n-th O-column $U_n$ and the n-th E-column $Ur_n$ implements an n-th double-bit memory-unit.

Therefore, if we focus to an array of double-bit memory-units, the MM is implemented by m*n matrix. In the m*n matrix, each of the pairs of the O-column and the corresponding E-column $U_1$ and $Ur_1$; $U_2$ and $Ur_2$; $U_3$ and $Ur^3$; . . . ; $U_{n-1}$, and $Ur_{n-1}$; $U_n$ and $Ur_n$ shapes the respective distorted input waveforms, by amplifying the attenuated voltage levels of the signal "1" to the voltage level of the supply voltage, through the combined operations of the O-columns $U_1$, $U_2$, $U_3$, . . . , $U_{n-1}$, $U_n$ and the corresponding E-columns $Ur_1$, $Ur_2$, $Ur_3$, . . . , $Ur_{n-1}$, $Ur_n$.

The first column from the left side in the m*2n matrix is implemented by a vertical array of front-stage cells $M_{11}$, $M_{21}$, $M_{31}$, . . . , $M_{(m-1)1}$, $M_{m1}$ as illustrated in FIG. 3A, which represent the first O-column $U_1$ illustrated in FIG. 2. That is, the front-stage cells $M_{11}$, $M_{21}$, $M_{31}$, . . . , $M_{(m-1)1}$, $M_{m1}$ aligned along a column direction in the m*2n matrix. Each of the front-stage cells $M_{11}$, $M_{21}$, $M_{31}$, . . . , $M_{(m-1)1}$, $M_{m1}$ is a bit-level cell configured to store data of a single bit.

The second column from the left side in the m*2n matrix is implemented by a vertical array of rear-stage cells $Mr_{11}$, $Mr_{21}$, $Mr_{31}$, . . . , $Mr_{(m-1)1}$, $Mr_{m1}$ as illustrated in FIG. 3A, which represent the first E-column $Ur_1$ illustrated in FIG. 2. That is, the rear-stage cells $Mr_{11}$, $Mr_{21}$, $Mr_{31}$, . . . , $Mr_{(m-1)1}$, $Mr_{m1}$, aligned along the column direction in the m*2n matrix. Each of the rear-stage cells $Mr_{11}$, $Mr_{21}$, $Mr_{31}$, . . . , $Mr_{(m-1)1}$, $Mr_{m1}$ is a bit-level cell configured to store data of a single bit.

Similarly, the third column from the left side in the m*2n matrix, which is implemented by a vertical array of front-stage cells $M_{12}$, $M_{22}$, $M_{32}$, . . . , $M_{(m-1)2}$, $M_{m2}$ as illustrated in FIG. 3B, which represent the second O-column $U_2$ illustrated in FIG. 2. Each of the front-stage cells $M_{12}$, $M_{22}$, $M_{32}$, . . . , $M_{(m-1)2}$, $M_{m2}$ is a bit-level cell configured to store data of a single bit. The fourth column in the m*2n matrix, which is implemented by a vertical array of rear-stage cells $Mr_{12}$, $Mr_{22}$, $Mr_{32}$, . . . , $Mr_{(m-1)2}$, $Mr_{m2}$, which represent the second E-column $Ur_2$. Each of the rear-stage cells $Mr_{12}$, $Mr_{22}$, $Mr_{32}$, . . . , $Mr_{(m-1)2}$, $Mr_{m2}$ is a bit-level cell configured to store data of a single bit.

Although the illustration is omitted, the fifth column from the left side in the m*2n matrix, which shall be implemented by a vertical array of front-stage cells $M_{13}$, $M_{23}$, $M_{33}$, . . . , $M_{(m-1)3}$, $M_{m3}$, which may be understood by the illustration of FIGS. 3A and 3B. The fifth column from the left side in the m*2n matrix represents the third O-column $U_3$ illustrated in FIG. 2.

Each of the front-stage cells $M_{13}$, $M_{23}$, $M_{33}$, . . . , $M_{(m-1)3}$, $M_{m3}$ is a bit-level cell configured to store data of a single bit. Although the illustration is omitted, the sixth column in the m*2n matrix, which shall be implemented by a vertical array of rear-stage cells $Mr_{13}$, $Mr_{23}$, $Mr_{33}$, . . . , $M_{(m-1)3}$, $Mr_{m3}$, which may be understood by the illustration of FIGS. 3A and 3B. The sixth column from the left side in the m*2n matrix represents the third E-column $Ur_{\_}$, illustrated in FIG. 2. Each of the rear-stage cells $Mr_{13}$, $Mr_{23}$, $Mr_{33}$, . . . , $Mr_{(m-1)3}$, $Mr_{m3}$ is a bit-level cell configured to store data of a single bit.

Similarly, although the illustration is omitted, the fourth column from the right side in the m*2n matrix shall be implemented by a vertical array of front-stage cells $M_{1(n-1)}$, $M_{2(n-1)}$, $M_{3(n-1)}$, . . . , $M_{(m-1)(n-1)}$, $M_{m(n-1)}$, which represent the (n-1)-th O-column $U_{(n-1)}$ illustrated in FIG. 2. Each of the front-stage cells $M_{1(n-1)}$, $M_{2(n-1)}$, $M_{3(n-1)}$, . . . , $M_{(m-1)(n-1)}$, $M_{m(n-1)}$ is a bit-level cell configured to store data of a single bit.

Similarly, although the illustration is omitted, the third column from the right side in the m*2n matrix shall be implemented by a vertical array of rear-stage cells $Mr_{1(n-1)}$, $Mr_{2(n-1)}$, $M_{3(n-1)}$, . . . , $Mr_{(m-1)(n-1)}$, $Mr_{m(n-1)}$, which represent the (n-1)-th E-column $Ur_{(n-1)}$. Each of the rear-stage cells $Mr_{1(n-1)}$, $Mr_{2(n-1)}$, $Mr_{3(n-1)}$, . . . , $Mr_{(m-1)2(n-1)}$, $Mr_{m(n-1)}$ is a bit-level cell configured to store data of a single bit.

The second column from the right side in the m*2n matrix is implemented by a vertical array of front-stage cells $M_{1n}$, $M_{2n}$, $M_{3n}$, . . . , $M_{(m-1)n}$, $M_{mn}$ as illustrated in FIG. 3C, which represent the n-th O-column $U_n$ illustrated in FIG. 2. Each of the front-stage cells $M_{1n}$, $M_{2n}$, $M_{3n}$, . . . , $M_{(m-1)n}$, $M_{mn}$ is a bit-level cell configured to store data of a single bit. The first column from the right side in the m*2n matrix is implemented by a vertical array of rear-stage cells $Mr_{1n}$, $Mr_{2n}$, $Mr_{3n}$, . . . , $Mr_{(m-1)n}$, $Mr_{mn}$ as illustrated in FIG. 3C, which represent the n-th E-column $Ur_n$ illustrated in FIG. 2. Each of the rear-stage cells $Mr_{1n}$, $Mr_{2n}$, $Mr_{3n}$, . . . , $Mr_{(m-1)n}$, $Mr_{mn}$ is a bit-level cell configured to store data of a single bit.

First Row in First Column

Namely, as illustrated in FIG. 3A, in the first O-column $U_1$ in the matrix, the front-stage cell $M_{11}$ on the first row encompasses a coupling-element $Ts_{11}$ having an input terminal connected to the output terminal of a first bit-level input terminal $IN_1$ on an array of an input column and a control terminal connected to a clock-line $L_{clk}$. As illustrated in FIG. 5A, the first clock signal CLK swings between a high-level of logical level "1" and a low-level of logical level "0". The front-stage cell $M_{11}$ further encompasses a front-inverter $I_{11}$, has an input terminal of the front-inverter is connected to an output terminal of the coupling-element $Tc_{11}$.

The front-inverter $I_{11}$, has a first power-supply terminal connected to a power-supply line, an input terminal connected to an output terminal of the coupling-element $Tc_{11}$, and a second power-supply terminal to a ground potential. Due to the inherent performance of the inverter, the front-inverter $I_{11}$ can shape the pulse waveform of the entered input signal, even if the front-inverter $I_{11}$ is driven at lower supply voltage of one volt, by amplifying the attenuated pulse-height up to the voltage level of the supply voltage.

A storage capacitor $C_{11}$ is connected between the output terminal and the ground potential. In a miniaturized structure of integrated circuit, because the storage capacitor $C_{11}$ may be implemented by a stray capacitor parasitic in the front-inverter $I_{11}$, the representation of the storage capacitor $C_{11}$ shall be considered as an equivalent virtual circuit element. Although FIGS. 3A to 3C illustrate the storage capacitor $C_{11}$, the storage capacitor $C_{11}$ depends on the physical construction of the front-inverter $I_{11}$, and if the storage capacitor $C_{11}$ is implemented by the stray capacitor, the storage capacitor $C_{11}$ is not realized by an actual electronic component such as a physical capacitive element or the like.

Further, the other storage capacitors $C_{21}$, $C_{31}$, . . . , $C_{(m-1)1}$, $C_{m1}$ and the like, which will be described later, may be implemented by stray capacitors respectively, and the storage capacitors $C_{21}$, $C_{31}$, . . . , $C_{(m-1)1}$, $C_{m1}$ are also not realized by actual electronic components such as physical capacitive elements or like. The output terminal delivers the signal stored in the storage capacitor $C_{11}$ to the rear-stage cell $Mr_{11}$, which is arranged before the next front-stage cell $M_{12}$ in the second O-column $U_2$.

And, as illustrated in FIG. 3A, in the first E-column $Ur_1$ in the matrix, the first row rear-stage cell $Mr_{11}$ is inserted between the front-stage cell $M_{11}$ and the front-stage cell $M_{12}$ in the second O-column $U_2$. The first row rear-stage cell $Mr_{11}$ encompasses a buffer-element, or the rear-stage coupling-element $Tr_{11}$ having an input terminal connected to the output terminal of the preceding front-stage cell $M_{11}$, a control terminal connected to the clock-line $L_{clk}$, and an output terminal connected to an input terminal of a rear-inverter $Ir_{11}$.

As illustrated in FIG. 5A, each of the first clock signal CLK and the second clock signal CLK periodically swings between the high-level and the low-level with a clock cycle Tau [Greek]$_{clock}$ such that the first clock signal CLK and the second clock signal CLK are Tau [Greek]$_{clock}$/2 apart temporary from each other. Therefore, the first and the second clock signals swing quasi-complementary in a mode such that the second clock signal CLK rises after a predetermined time of Tau [Greek]$_{clock}$/6 from the falling edge of the first clock signal CLK and falls before the predetermined time of Tau [Greek]$_{clock}$/6 from the rising edge of the first clock signal CLK.

Then, a single common clock-line $L_{clk}$ can supply a clock pulse which swings complementary in the mode such that the second clock signal CLK rises after the predetermined time of Tau [Greek]$_{clock}$/6 from the falling edge of the first clock signal CLK and falls before the predetermined time of Tau [Greek]$_{clock}$/6 from the rising edge of the first clock signal CLK. Here, the clock cycle Tau [Greek]$_{clock}$ of the first clock signal CLK and the second clock signal CLK illustrated in FIG. 5A is same as the clock cycle controlling the arithmetic and logic operations in the ALU 112.

As described above, the input terminal of the rear-inverter $Ir_{11}$ is connected to the output terminal of the buffer-element $Tr_{11}$. That is, the buffer-element $Tr_{11}$ controls transferring of one of the signals in a set of moving information from an output terminal of the adjacent front-stage cell $M_{11}$ allocated in one of the first O-column $U_1$ arranged adjacent to an input side of the first E-column $Ur_1$. The rear-inverter $Ir_{11}$ encompasses a first power-supply terminal connected to a power-supply line $L_{sv}$ and an input terminal connected to the output terminal of the buffer-element $Tr_{11}$, and a second power-supply terminal to a ground potential.

Because the first and the second clock signals swing periodically in the quasi-complementary mode, the coupling-element $Tc_{11}$ and the buffer-element $Tr_{11}$ operate quasi-complementary such that when the coupling-element $Tc_{11}$ is conductive state, the buffer-element $Tr_{11}$, is cut-off state, and vice versa. Therefore, the "Domino transportation" of the signal, which is unintentionally transferred from the storage capacitor $C_{11}$ of the front-inverter $I_{11}$ to the rear-inverter $Ir_{11}$ as if the transfer of the signal were Domino falling is prevented.

Because the Domino transportation from the front-inverter $I_{11}$ to the rear-inverter $Ir_{11}$ is protected, each of the front-stage cell $M_{11}$ and the rear-stage cell $Mr_{11}$ can serve as an active independent bit-level cell. Since the successive two bit-level data in a data stream can be shared by neighboring bit-level cells $M_{11}$ and $Mr_{11}$ in the first double-bit memory-unit, the data-packing density can be maximized so that the memory capacity can be increased.

Between the ground potential and the output terminal of the rear-inverter $Ir_{11}$, a storage capacitor $Cr_{11}$ assigned in the rear-inverter $Ir_{11}$ is connected. The storage capacitor $Cr_{11}$ may be implemented by a stray capacitor, which is parasitic in the rear-inverter $Ir_{11}$. The other storage capacitors $Cr_{21}$, $Cr_{31}$, ..., $Cr_{(m-1)1}$, $Cr_{m1}$ may be implemented by stray capacitors respectively in minute structures of the rear-inverter $Ir_{21}$, $Ir_{31}$, ..., $Ir_{(m-1)1}$, $Ir_{m1}$.

The output terminal of the rear-stage cell $Mr_{11}$ delivers the signal stored in the storage capacitor $Cr_{11}$ to the next front-stage cell $M_{12}$. That is, the rear-inverter $Ir_{11}$ re-inverts the inverted signal transferred from a front-stage cell $M_{11}$ arranged in the same row, and transfers further the re-inverted signal to the second O-columns $U_2$ arranged adjacent to an output side of the rear-stage cell $Mr_{11}$. And, the storage capacitor $Cr_{11}$ stores the re-inverted signal.

Second Row in First Column

Similarly, as illustrated in FIG. 3A, the front-stage cell $M_{21}$ on the second row encompasses a coupling-element $Tc_{21}$ having an input terminal connected to the output terminal of a second bit-level input terminal $IN_2$ on the array of the input column and a control terminal connected to the clock-line $L_{clk}$, and a front-inverter $I_{21}$, an input terminal of the front-inverter is connected to an output terminal of the coupling-element $Tc_{21}$. The front-inverter $I_{21}$ encompasses a first power-supply terminal connected to a power-supply line $L_{sv}$ and an input terminal connected to the output terminal of the coupling-element $Tc_{21}$, and a second power-supply terminal to a ground potential.

Due to the inherent performance of the inverter, the front-inverter $I_{21}$ can shape the pulse waveform of the entered input signal, even if the front-inverter $I_{21}$ is driven at lower supply voltage of one volt, by amplifying the attenuated pulse-height up to the voltage level of the supply voltage. Between the ground potential and the output terminal of the front-inverter $I_{21}$, the storage capacitor $C_{21}$ assigned in the front-inverter $I_{21}$ is connected. The output terminal delivers the signal stored in the storage capacitor $C_{21}$ to the rear-stage cell $Mr_{21}$, which is arranged before the next front-stage cell $M_{22}$ in the second O-column $U_2$.

As illustrated in FIG. 3A, the second row rear-stage cell $Mr_{21}$ inserted between the front-stage cell $M_{21}$ and the front-stage cell $M_{22}$ encompasses a buffer-element $Tr_{21}$ having an input terminal connected to the output terminal of the preceding front-stage cell $M_{21}$ and a control terminal connected to the clock-line $L_{clk}$, and a rear-inverter $Ir_{21}$ having an input terminal connected to an output terminal of the buffer-element $Tr_{21}$. That is, the buffer-element $Tr_{21}$ controls transferring the signal from an output terminal of the adjacent front-stage cell $M_{21}$ allocated in the O-column $U_1$ arranged adjacent to an input side of the E-column $Ur_1$. The rear-inverter $Ir_{21}$ has a first power-supply terminal connected to a power-supply line $L_{sv}$ and an input terminal connected to the output terminal of the buffer-element $Tr_{21}$, and a second power-supply terminal to a ground potential.

Between the ground potential and the output terminal of the rear-inverter $Ir_{21}$, the storage capacitor $Cr_{21}$ assigned in the rear-inverter $Ir_{21}$ is connected. The output terminal of the rear-stage cell $Mr_{21}$ delivers the signal stored in the storage capacitor $Cr_{21}$ to the next front-stage cell $M_{22}$. That is, the rear-inverter $Ir_{21}$ re-inverts the inverted signal transferred from a front-stage cell $M_{21}$ arranged in the same row, and transfers further the re-inverted signal to the O-column $U_2$ arranged adjacent to an output side of the rear-stage cell $Mr_{21}$. And, the storage capacitor $Cr_{21}$ stores the re-inverted signal.

As the first and the second clock signals swing periodically in the quasi-complementary mode, the coupling-element $Tc_{21}$ in the first O-column $U_1$ and the buffer-element $Tr_{21}$ in the first E-column $Ur_1$ operate quasi-complementary, respectively, such that when the coupling-element $Tc_{21}$ is conductive state, the buffer-element $Tr_{21}$ in the first E-column $Ur_1$ is cut-off state, and vice versa. Therefore, similar to the protection of the Domino transport from the storage capacitor $C_{11}$ of the front-inverter $I_{11}$ to the rear-inverter $Ir_{11}$, the Domino transportation of the signals from the storage capacitor $C_{21}$ of the front-inverter $I_{21}$ to the rear-inverter $Ir_{21}$ is prevented. And, by the pair of the front-inverter $I_{21}$ and the rear-inverter $Ir_{21}$, the voltage levels of the attenuated signal "1" are amplified respectively up to the voltage level of the supply voltage so as to wave-shape the distorted input signals.

Third Row in First Column

As illustrated in FIG. 3A, the front-stage cell $M_{31}$ on the third row encompasses a coupling-element $Tc_{31}$ having an input terminal connected to the output terminal of a third bit-level input terminal $IN_3$ on the array of the input column and a control terminal connected to the clock-line $L_{clk}$, and a front-inverter $I_{31}$, an input terminal of the front-inverter is connected to an output terminal of the coupling-element $Tc_{31}$. The front-inverter $I_{31}$ encompasses a first power-supply terminal connected to a power-supply line $L_{sv}$, and an input terminal connected to the output terminal of the coupling-element $Tc_{31}$, and a second power-supply terminal to a ground potential.

Due to the inherent performance of the inverter, the front-inverter $I_{31}$ can shape the pulse waveform of the entered input signal, even if the front-inverter $I_{31}$ is driven at lower supply voltage of one volt. Between the ground potential and the output terminal of the front-inverter $I_{31}$, the storage capacitor $C_{31}$ assigned in the front-inverter $I_{31}$ is connected. The output terminal delivers the signal stored in the storage capacitor $C_{31}$ to the rear-stage cell $Mr_{31}$, which is arranged before the next front-stage cell $M_{32}$ in the second O-column $U_2$.

As illustrated in FIG. 3A, the third row rear-stage cell $Mr_{31}$ is inserted between the front-stage cell $M_{31}$ and the front-stage cell $M_{32}$. The third row rear-stage cell $Mr_{31}$ encompasses a buffer-element $Tr_{31}$ having an input terminal connected to the output terminal of the preceding front-stage cell $M_{31}$ and a control terminal connected to the clock-line $L_{clk}$, and a rear-inverter $Ir_{31}$ having an input terminal connected to an output terminal of the buffer-element $Tr_{31}$.

That is, the buffer-element $Tr_{31}$ controls transferring the signal from an output terminal of the adjacent front-stage cell $M_{31}$ allocated in the O-column $U_1$ arranged adjacent to an input side of the E-column $Ur_1$. The rear-inverter $Ir_{31}$ has a first power-supply terminal connected to a power-supply line $L_{sv}$ and an input terminal connected to the output terminal of the buffer-element $Tr_{31}$, and a second power-supply terminal to a ground potential. Between the ground potential and the output terminal of the rear-inverter $Ir_{31}$, the storage capacitor $Cr_{31}$ assigned in the rear-inverter $Ir_{31}$ is connected.

The output terminal of the rear-stage cell $Mr_{31}$ delivers the signal stored in the storage capacitor $Cr_{31}$ to the next front-stage cell $M_{32}$. That is, the rear-inverter $Ir_{31}$ re-inverts the inverted signal transferred from a front-stage cell $M_{31}$ arranged in the same row, and transfers further the re-inverted signal to the O-column $U_2$ arranged adjacent to an output side of the rear-stage cell $Mr_{31}$. And, the storage capacitor $Cr_{31}$ stores the re-inverted signal.

As the first and the second clock signals swing periodically, the coupling-element $Tc_{31}$ in the first O-column $U_1$ and the buffer-element $Tr_{31}$ in the first E-column $Ur_1$ operate such that when the coupling-element $Tc_{31}$ is conductive state, the buffer-element $Tr_{31}$ in the first E-column $Ur_1$ is cut-off state, and vice versa. Therefore, the Domino transportation of the signals from the storage capacitor $C_{31}$ of the front-inverter $I_{31}$ to the rear-inverter $Ir_{31}$ is prevented. And, by the pair of the front-inverter $I_{31}$ and the rear-inverter $Ir_{31}$, the voltage levels of the attenuated signal "1" are amplified respectively up to the voltage level of the supply voltage so as to wave-shape the distorted input signals.

(m−1)-th Row in First Column

The front-stage cell $M_{(m-1)1}$ on the (m−1)-th row encompasses a coupling-element $Tc_{(m-1)1}$ having an input terminal connected to the output terminal of a (m−1)-th bit-level input terminal $IN_{(m-1)}$ on the array of the input column and a control terminal connected to the clock-line $L_{clk}$, and a front-inverter $I_{(m-1)1}$, an input terminal of the front-inverter is connected to an output terminal of the coupling-element $Tc_{(m-1)1}$. The front-inverter $I_{(m-1)1}$ has a first power-supply terminal connected to a power-supply line $L_{sv}$, an input terminal connected to the output terminal of the coupling-element $Tc_{(m-1)1}$, and a second power-supply terminal to a ground potential.

Due to the inherent performance of the inverter, the front-inverter $I_{(m-1)1}$ can shape the pulse waveform of the entered input signal, even if the front-inverter $I_{(m-1)1}$ is driven at lower supply voltage of one volt. Between the ground potential and the output terminal of the front-inverter $I_{(m-1)1}$, a storage capacitor $C_{(m-1)1}$ assigned in the front-inverter $I_{(m-1)1}$ is connected. The output terminal of the front-stage cell $M_{(m-1)1}$, delivers the signal stored in the storage capacitor $C_{(m-1)1}$ to the rear-stage cell $Mr_{(m-1)1}$, which is arranged before the next front-stage cell $M_{(m-1)1}$ in the second O-column $U_2$.

As illustrated in FIG. 3A, the (m−1)-th row rear-stage cell $Mr_{(m-1)1}$ inserted between the front-stage cell $M_{(m-1)1}$ and the front-stage cell $M_{(m-1)2}$ encompasses a buffer-element $Tr_{(m-1)1}$ having an input terminal connected to the output terminal of the preceding front-stage cell $M_{(m-1)1}$ and a control terminal connected to the clock-line $L_{clk}$, and a rear-inverter $Ir_{(m-1)1}$ having an input terminal connected to an output terminal of the buffer-element $Tr_{(m-1)1}$. That is, the buffer-element $Tr_{(m-1)1}$ controls transferring the signal from an output terminal of the adjacent front-stage cell $M_{(m-1)1}$ allocated in the O-column $U_1$ arranged adjacent to an input side of the E-column $Ur_1$. The rear-inverter $Ir_{(m-1)1}$ has a first power-supply terminal connected to a power-supply line $L_{sv}$, an input terminal connected to the output terminal of the buffer-element $Tr_{(m-1)1}$, and a second power-supply terminal to a ground potential.

Between the ground potential and the output terminal of the rear-inverter $Ir_{(m-1)1}$, the storage capacitor $Cr_{(m-1)1}$ assigned in the rear-inverter $Ir_{(m-1)1}$ is connected. The output terminal of the rear-stage cell $Mr_{(m-1)1}$ delivers the signal stored in the storage capacitor $Cr_{(m-1)1}$ to the next front-stage cell $M_{(m-1)2}$. That is, the rear-inverter $Ir_{(m-1)1}$ re-inverts the inverted signal transferred from a front-stage cell $M_{(m-1)1}$ arranged in the same row, and transfers further the re-inverted signal to the O-column $U_2$ arranged adjacent to an output side of the rear-stage cell $Mr_{(m-1)1}$. And, the storage capacitor $Cr_{(m-1)1}$ stores the re-inverted signal.

As the first and the second clock signals swing periodically, the coupling-element $Tc_{(m-1)1}$ in the first O-column $U_1$ and the buffer-element $Tr_{(m-1)1}$ in the first E-column $Ur_1$ operate such that when the coupling-element $Tc_{(m-1)1}$ is conductive state, the buffer-element $Tr_{(m-1)1}$ in the first E-column $Ur_1$ is cut-off state, and vice versa. Therefore, the Domino transportation of the signals from the storage capacitor $C_{(m-1)1}$ of the front-inverter $I_{(m-1)1}$ to the rear-inverter $Ir_{(m-1)1}$ is prevented. And, by the pair of the front-inverter $I_{(m-1)1}$ and the rear-inverter $Ir_{(m-1)1}$, the voltage levels of the attenuated signal "1" are amplified respectively up to the voltage level of the supply voltage so as to wave-shape the distorted input signals.

m-th Row in First Column

The front-stage cell $M_{m1}$ on the m-th row encompasses a coupling-element $Tc_{m1}$ having an input terminal connected to the output terminal of a m-th bit-level input terminal $IN_m$ on the array of the input column and a control terminal connected to the clock-line $L_{clk}$, and a front-inverter $I_{m1}$, an input terminal of the front-inverter is connected to an output terminal of the coupling-element $Tc_{m1}$. The front-inverter $I_{m1}$ has a first power-supply terminal connected to a power-supply line $L_{sv}$, an input terminal connected to the output terminal of the coupling-element $Tc_{m1}$, and a second power-supply terminal to a ground potential.

Due to the inherent performance of the inverter, the front-inverter $I_{m1}$ can shape the pulse waveform of the entered input signal, even if the front-inverter $I_{m1}$ is driven at lower supply voltage of one volt. Between the ground potential and the output terminal of the front-inverter $I_{m1}$, the storage capacitor $C_{m1}$ assigned in the front-inverter $I_{m1}$ is connected. The output terminal of the front-stage cell $M_{m1}$ delivers the signal stored in the storage capacitor $C_{m1}$ to the rear-stage cell $Mr_{m1}$, which is arranged before the next front-stage cell $M_{m2}$ in the second O-column $U_2$.

As illustrated in FIG. 3A, the m-th row rear-stage cell $Mr_{m1}$ inserted between the front-stage cell $M_{m1}$ and the front-stage cell $M_{m2}$ encompasses a buffer-element $Tr_{m1}$ having an input terminal connected to the output terminal of the preceding front-stage cell $M_{m1}$ and a control terminal connected to the clock-line $L_{clk}$, and a rear-inverter $Ir_{m1}$ having an input terminal connected to an output terminal of the buffer-element $Tr_{m1}$. That is, the buffer-element $Tr_{m1}$ controls transferring the signal from an output terminal of the adjacent front-stage cell $M_{m1}$ allocated in the O-column $U_1$ arranged adjacent to an input side of the E-column $Ur_1$.

The rear-inverter $Ir_{m1}$ has a first power-supply terminal connected to a power-supply line $L_{sv}$, an input terminal connected to the output terminal of the buffer-element $Tr_{m1}$, and a second power-supply terminal to a ground potential. Between the ground potential and the output terminal of the rear-inverter $Ir_{m1}$, the storage capacitor $Cr_{m1}$ assigned in the rear-inverter $Ir_{m1}$ is connected. The output terminal of the rear-stage cell $Mr_{m1}$ delivers the signal stored in the storage capacitor $Cr_{m1}$ to the next front-stage cell $M_{m2}$. That is, the rear-inverter $Ir_{m1}$ re-inverts the inverted signal transferred from a front-stage cell $M_{m1}$ arranged in the same row, and transfers further the re-inverted signal to the O-column $U_2$ arranged adjacent to an output side of the rear-stage cell $Mr_{m1}$. And, the storage capacitor $Cr_{m1}$ stores the re-inverted signal.

As the first and the second clock signals swing periodically, the coupling-element $Tc_{m1}$ in the first O-column $U_1$ and the buffer-element $Tr_{m1}$ in the first E-column $Ur_1$ operate such that when the coupling-element $Tc_{m1}$ is conductive state, the buffer-element $Tr_{m1}$ in the first E-column $Ur_1$ is cut-off state, and vice versa. Therefore, the Domino transportation of the signals from the storage capacitor $C_{m1}$ of the front-inverter $I_{m1}$ to the rear-inverter $Ir_{m1}$ is prevented. And, by the pair of the front-inverter $I_{m1}$ and the rear-inverter $Ir_{m1}$, the voltage levels of the attenuated signal "1" are amplified respectively up to the voltage level of the supply voltage so as to wave-shape the distorted input signals.

First Row in Second Column

As illustrated in FIG. 3B, in the second O-column $U_2$ in the matrix, the front-stage cell $M_{12}$ on the first row encompasses a coupling-element $Tc_{12}$ having an input terminal connected to the output terminal of the rear-stage cell $Mr_{11}$ in the first E-column $Ur_1$ and a control terminal connected to the clock-line $L_{clk}$. The front-stage cell $M_{12}$ further encompasses a front-inverter $I_{12}$, an input terminal of the front-inverter is connected to an output terminal of the coupling-element $Tc_{12}$.

The front-inverter $I_{12}$ has a first power-supply terminal connected to a power-supply line $L_{sv}$, an input terminal connected to the output terminal of the coupling-element $Tc_{12}$, and a second power-supply terminal to a ground potential.

The front-inverter $I_{12}$ can shape the pulse waveform of the entered input signal, even if the front-inverter $I_{12}$ is driven at lower supply voltage of one volt. At the output terminal of the front-inverter $I_{12}$, a storage capacitor $C_{12}$ is connected between the output terminal and the ground potential$_{123}$. The storage capacitor $C_{12}$ may be implemented by a stray capacitor parasitic in the front-inverter $I_{12}$. The other storage capacitors $C_{22}, C_{32}, \ldots, C_{(m-1)2}, C_{m2}$ may be implemented by stray capacitors respectively. The output terminal delivers the signal stored in the storage capacitor $C_{12}$ to the rear-stage cell $Mr_{12}$, which is arranged before the next front-stage cell $M_{13}$ in the third O-column $U_3$.

And, as illustrated in FIG. 3B, in the first E-column $Ur_2$ in the matrix, the first row rear-stage cell $Mr_{12}$ is inserted between the front-stage cell $M_{12}$ and the front-stage cell $M_{13}$ in the third O-column $U_3$. The first row rear-stage cell $Mr_{12}$ encompasses a buffer-element, or the rear-stage coupling-element $Tr_{12}$ having an input terminal connected to the output terminal of the preceding front-stage cell $M_{12}$ and a control terminal connected to the clock-line $L_{clk}$, and an output terminal connected to an input terminal of a rear-inverter $Ir_{12}$.

The input terminal of the rear-inverter $Ir_{12}$ is connected to the output terminal of the buffer-element $Tr_{12}$. That is, the buffer-element $Tr_{12}$ controls transferring the signal from the output terminal of the adjacent front-stage cell $M_{12}$ allocated in the second O-column $U_1$ arranged adjacent to an input side of the second E-column $Ur_2$. The rear-inverter $Ir_{12}$ has a first power-supply terminal connected to a power-supply line $L_{sv}$, an input terminal connected to the output terminal of the buffer-element $Tr_{12}$, and a second power-supply terminal to a ground potential. Because the first and the second clock signals swing periodically in the quasi-complementary mode, the coupling-element $Tc_{12}$ and the buffer-element $Tr_{12}$ operate quasi-complementary such that when the coupling-element $Tc_{12}$ is conductive state, the buffer-element $Tr_{12}$ is cut-off state, and vice versa. Therefore, the "Domino transportation" of the signal, which is unintentionally transferred from the storage capacitor $C_{12}$ of the front-inverter $I_{12}$ to the rear-inverter $Ir_{12}$ is prevented.

Because the Domino transportation from the front-inverter $I_{12}$ to the rear-inverter $Ir_{12}$ is protected, each of the front-stage cell $M_{12}$ and the rear-stage cell $Mr_{12}$ can serve as an active independent bit-level cell. Since the successive two bit-level data in a data stream can be shared by neighboring bit-level cells $M_{12}$ and $Mr_{12}$, the data-packing density can be maximized so that the memory capacity can be increased. Between the ground potential and the output terminal of the rear-inverter $Ir_{12}$, a storage capacitor $Cr_{12}$ assigned in the rear-inverter $Ir_{12}$ is connected. The storage capacitor $Cr_{12}$ may be implemented by a stray capacitor, which is parasitic in the rear-inverter $Ir_{12}$. The other storage capacitors $Cr_{22}$, $Cr_{32}$, ..., $Cr_{(m-1)2}$, $Cr_{m2}$ may be implemented by stray capacitors respectively in minute structures of the rear-inverter $Ir_{22}$, $Ir_{32}$, ..., $Ir_{(m-1)2}$, $Ir_{m2}$.

The output terminal of the rear-stage cell $Mr_{12}$ delivers the signal stored in the storage capacitor $Cr_{12}$ to the next front-stage cell $M_{13}$. That is, the rear-inverter $Ir_{12}$ re-inverts the inverted signal transferred from the front-stage cell $M_{12}$ arranged in the same row, and transfers further the re-inverted signal to the third O-column $U_3$ arranged adjacent to an output side of the rear-stage cell $Mr_{12}$. And, the storage capacitor $Cr_{12}$ stores the re-inverted signal.

Second Row in Second Column

Similarly, as illustrated in FIG. 3B, the front-stage cell $M_{22}$ on the second row encompasses a coupling-element $Tc_{22}$ having an input terminal connected to the output terminal of the rear-stage cell $Mr_{22}$ in the first E-column $Ur_1$ and a control terminal connected to the clock-line $L_{clk}$, and a front-inverter $I_{22}$, an input terminal of the front-inverter $I_{22}$ is connected to an output terminal of the coupling-element $Tc_{22}$. The front-inverter $I_{22}$ has a first power-supply terminal connected to a power-supply line $L_{sv}$, an input terminal connected to the output terminal of the coupling-element $Tc_{22}$, and a second power-supply terminal to a ground potential.

The front-inverter $I_{22}$ can shape the pulse waveform of the entered input signal, even if the front-inverter $I_{22}$ is driven at lower supply voltage of one volt, by amplifying the attenuated pulse-height up to the voltage level of the supply voltage. Between the ground potential and the output terminal of the front-inverter $I_{22}$, the storage capacitor $C_{22}$ assigned in the front-inverter $I_{22}$ is connected. The output terminal delivers the signal stored in the storage capacitor $C_{22}$ to the rear-stage cell $Mr_{22}$, which is arranged before the next front-stage cell $M_{23}$ in the third O-column $U_3$.

As illustrated in FIG. 3B, the second row rear-stage cell $Mr_{22}$ inserted between the front-stage cell $M_{22}$ and the front-stage cell $M_{22}$ encompasses a buffer-element $Tr_{22}$ having an input terminal connected to the output terminal of the preceding front-stage cell $M_{22}$ and a control terminal connected to the clock-line $L_{clk}$, and a rear-inverter $Ir_{22}$ having an input terminal connected to an output terminal of the buffer-element $Tr_{22}$. That is, the buffer-element $Tr_{22}$ controls transferring the signal from the output terminal of the adjacent front-stage cell $M_{22}$ allocated in the O-column $U_1$ arranged adjacent to an input side of the E-column $Ur_1$. The rear-inverter $Ir_{22}$ has a first power-supply terminal connected to a power-supply line $L_{sv}$, an input terminal connected to the output terminal of the buffer-element $Tr_{22}$, and a second power-supply terminal to a ground potential.

Between the ground potential and the output terminal of the rear-inverter $Ir_{22}$, the storage capacitor $Cr_{22}$ assigned in the rear-inverter $Ir_{22}$ is connected. The output terminal of the rear-stage cell $Mr_{22}$ delivers the signal stored in the storage capacitor $Cr_{22}$ to the next front-stage cell $M_{22}$. That is, the rear-inverter $Ir_{22}$ re-inverts the inverted signal transferred from the front-stage cell $M_{22}$ arranged in the same row, and transfers further the re-inverted signal to the O-column $U_3$ arranged adjacent to an output side of the rear-stage cell $Mr_{22}$. And, the storage capacitor $Cr_{22}$ stores the re-inverted signal.

As the first and the second clock signals swing periodically in the quasi-complementary mode, the coupling-element $Tc_{22}$ in the second O-column $U_2$ and the buffer-element $Tr_{22}$ in the second E-column $Ur_2$ operate quasi-complementary, respectively, such that when the coupling-element $Tc_{22}$ is conductive state, the buffer-element $Tr_{22}$ in the second E-column $Ur_2$ is cut-off state, and vice versa. Therefore, the Domino transportation of the signals from the storage capacitor $C_{22}$ of the front-inverter $I_{22}$ to the rear-inverter $Ir_{22}$ is prevented. And, by the pair of the front-inverter $I_{22}$ and the rear-inverter $Ir_{22}$, the voltage levels of the attenuated signal "1" are amplified respectively up to the voltage level of the supply voltage so as to wave-shape the distorted input signals.

Third Row in Second Column

As illustrated in FIG. 3B, the front-stage cell $M_{32}$ on the third row encompasses a coupling-element $Tc_{32}$ having an input terminal connected to the output terminal of the rear-stage cell $Mr_{31}$ in the first E-column $Ur_1$ and a control terminal connected to the clock-line $L_{clk}$, and a front-inverter $I_{32}$, an input terminal of the front-inverter is connected to an output terminal of the coupling-element $Tc_{32}$. The front-inverter $I_{32}$ has a first power-supply terminal connected to a power-supply line $L_{sv}$, an input terminal connected to the output terminal of the coupling-element $Tc_{32}$, and a second power-supply terminal to a ground potential.

The front-inverter $I_{32}$ can shape the pulse waveform of the entered input signal, even if the front-inverter $I_{32}$ is driven at lower supply voltage of one volt. Between the ground potential and the output terminal of the front-inverter $I_{32}$, the storage capacitor $C_{32}$ assigned in the front-inverter $I_{32}$ is connected. The output terminal delivers the signal stored in the storage capacitor $C_{32}$ to the rear-stage cell $Mr_{32}$, which is arranged before the next front-stage cell $M_{33}$ in the third O-column $U_3$.

As illustrated in FIG. 3B, the third row rear-stage cell $Mr_{32}$ is inserted between the front-stage cell $M_{32}$ and the front-stage cell $M_{33}$. The third row rear-stage cell $Mr_{32}$ encompasses a buffer-element $Tr_{32}$ having an input terminal connected to the output terminal of the preceding front-stage cell $M_{32}$ and a control terminal connected to the clock-line $L_{clk}$, and a rear-inverter $Ir_{32}$ having an input terminal connected to an output terminal of the buffer-element $Tr_{32}$. That is, the buffer-element $Tr_{32}$ controls transferring the signal from the output terminal of the adjacent front-stage cell $M_{32}$ allocated in the O-column $U_2$ arranged adjacent to an input side of the E-column $Ur_2$. The rear-inverter $Ir_{32}$ has a first power-supply terminal connected to a power-supply line $L_{sv}$, an input terminal connected to the output terminal of the buffer-element $Tr_{32}$, and a second power-supply terminal to a ground potential.

Between the ground potential and the output terminal of the rear-inverter $Ir_{32}$, the storage capacitor $Cr_{32}$ assigned in the rear-inverter $Ir_{32}$ is connected. The output terminal of the rear-stage cell $Mr_{32}$ delivers the signal stored in the storage capacitor $Cr_{32}$ to the next front-stage cell $M_{33}$. That is, the rear-inverter $Ir_{32}$ re-inverts the inverted signal transferred from the front-stage cell $M_{32}$ arranged in the same row, and transfers further the re-inverted signal to the O-column $U_3$ arranged adjacent to an output side of the rear-stage cell $Mr_{32}$. And, the storage capacitor $Cr_{32}$ stores the re-inverted signal.

As the first and the second clock signals swing periodically, the coupling-element $Tc_{32}$ in the second O-column $U_2$ and the buffer-element $Tr_{32}$ in the second E-column $Ur_2$ operate such that when the coupling-element $Tc_{32}$ is conductive state, the buffer-element $Tr_{32}$ in the second E-column $Ur_1$ is cut-off state, and vice versa. Therefore, the Domino transportation of the signals from the storage capacitor $C_{32}$ of the front-inverter $I_{32}$ to the rear-inverter $Ir_{32}$ is prevented, And, by the pair of the front-inverter $I_{32}$ and the rear-inverter $Ir_{32}$, the voltage levels of the attenuated signal "1" are amplified respectively up to the voltage level of the supply voltage so as to wave-shape the distorted input signals.

(m−1)-th Row in Second Column

The front-stage cell $M_{(m-1)2}$ on the (m−1)-th row encompasses a coupling-element $Tc_{(m-1)2}$ having an input terminal connected to the output terminal of the rear-stage cell $Mr_{(m-1)2}$ in the first E-column $Ur_1$ and a control terminal connected to the clock-line $L_{clk}$, and a front-inverter $I_{(m-1)2}$, an input terminal of the front-inverter $I_{(m-1)2}$ is connected to an output terminal of the coupling-element $Tc_{(m-1)2}$. The front-inverter $I_{(m-1)2}$ has a first power-supply terminal connected to a power-supply line $L_{sv2}$, an input terminal connected to the output terminal of the coupling-element $Tc_{(m-1)2}$, and a second power-supply terminal to a ground potential.

The front-inverter $I_{(m-1)2}$ can shape the pulse waveform of the entered input signal, even if the front-inverter $I_{(m-1)2}$ is driven at lower supply voltage of one volt. Between the ground potential and the output terminal of the front-inverter $I_{(m-1)2}$, the storage capacitor $C_{(m-1)2}$ assigned in the front-inverter $I_{(m-1)2}$ is connected. The output terminal of the front-stage cell $M_{(m-1)2}$ delivers the signal stored in the storage capacitor $C_{(m-1)2}$ to the rear-stage cell $Mr_{(m-1)2}$, which is arranged before the next front-stage cell $M_{(m-1)3}$ in the third O-column $U_3$.

As illustrated in FIG. 3B, the (m−1)-th row rear-stage cell $M_{(m-1)2}$ inserted between the front-stage cell $M_{(m-1)2}$ and the front-stage cell $M_{(m-1)3}$ encompasses a buffer-element $Tr_{(m-1)2}$ having an input terminal connected to the output terminal of the preceding front-stage cell $M_{(m-1)2}$ and a control terminal connected to the clock-line $L_{clk}$, and a rear-inverter $Ir_{(m-1)2}$ having an input terminal connected to an output terminal of the buffer-element $Tr_{(m-1)2}$. That is, the buffer-element $Tr_{(m-1)2}$ controls transferring the signal from the output terminal of the adjacent front-stage cell $M_{(m-1)2}$ allocated in the O-column $U_2$ arranged adjacent to an input side of the E-column $Ur_2$.

The rear-inverter $Ir_{(m-1)2}$ has a first power-supply terminal connected to a power-supply line $L_{sv}$, an input terminal connected to the output terminal of the buffer-element $Tr_{(m-1)2}$, and a second power-supply terminal to a ground potential. Between the ground potential and the output terminal of the rear-inverter $Ir_{(m-1)2}$, the storage capacitor $Cr_{(m-1)2}$ assigned in the rear-inverter $Ir_{(m-1)2}$ is connected. The output terminal of the rear-stage cell $Mr_{(m-1)2}$ delivers the signal stored in the storage capacitor $Cr_{(m-1)2}$ to the next front-stage cell $M_{(m-1)3}$. That is, the rear-inverter $Ir_{(m-1)2}$ re-inverts the inverted signal transferred from the front-stage cell $M_{(m-1)2}$ arranged in the same row, and transfers further the re-inverted signal to the O-column $U_3$ arranged adjacent to an output side of the rear-stage cell $Mr_{(m-1)2}$. And, the storage capacitor $Cr_{(m-1)2}$ stores the re-inverted signal.

As the first and the second clock signals swing periodically, the coupling-element $Tc_{(m-1)2}$ in the second O-column $U_2$ and the buffer-element $Tr_{(m-1)2}$ in the second E-column $Ur_2$ operate such that when the coupling-element $Tc_{(m-1)2}$ is conductive state, the buffer-element $Tr_{(m-1)2}$ is cut-off state, and vice versa. Therefore, the Domino transportation of the signals from the storage capacitor $C_{(m-1)2}$ of the front-inverter $I_{(m-1)2}$ to the rear-inverter $Ir_{(m-1)2}$ is prevented. And, by the pair of the front-inverter $I_{(m-1)2}$ and the rear-inverter $Ir_{(m-1)2}$, the voltage levels of the attenuated signal "1" are amplified respectively up to the voltage level of the supply voltage so as to wave-shape the distorted input signals.

m-th Row in Second Column

The front-stage cell $M_{m2}$ on the m-th row encompasses a coupling-element $Tc_{m2}$ having an input terminal connected to the output terminal of the rear-stage cell $Mr_{m1}$ in the first E-column $Ur_1$ and a control terminal connected to the clock-line $L_{clk}$, and a front-inverter $I_{m2}$, an input terminal of the front-inverter is connected to an output terminal of the coupling-element $Tc_{m2}$. The front-inverter $I_{m2}$ has a first power-supply terminal connected to a power-supply line $L_{sv}$, an input terminal connected to the output terminal of the coupling-element $Tc_{m2}$, and a second power-supply terminal to a ground potential.

The front-inverter $I_{m2}$ can shape the pulse waveform of the entered input signal, even if the front-inverter $I_{m2}$ is driven at lower supply voltage of one volt. Between the ground potential and the output terminal of the front-inverter $I_{m2}$, the storage capacitor $C_{m2}$ assigned in the front-inverter $I_{m2}$ is connected. The output terminal of the front-stage cell $M_{m2}$ delivers the signal stored in the storage capacitor $C_{m2}$ to the rear-stage cell $Mr_{m2}$, which is arranged before the next front-stage cell $M_{m3}$ in the third O-column $U_3$.

As illustrated in FIG. 3B, the m-th row rear-stage cell $Mr_{m2}$ is inserted between the front-stage cell $M_{m2}$ and the front-stage cell $M_{m3}$. The m-th row rear-stage cell $Mr_{m2}$ encompasses a buffer-element $Tr_{m2}$ having an input terminal connected to the output terminal of the preceding front-stage cell $M_{m2}$ and a control terminal connected to the clock-line $L_{clk}$, and a rear-inverter $Ir_{m2}$ having an input terminal connected to an output terminal of the buffer-element $Tr_{m2}$. That is, the buffer-element $Tr_{m2}$ controls transferring the signal from the output terminal of the adjacent front-stage cell $M_{m2}$ allocated in the O-column $U_1$ arranged adjacent to an input side of the E-column $Ur_1$.

The rear-inverter $Ir_{m2}$ has a first power-supply terminal connected to a power-supply line $L_{sv}$, an input terminal connected to the output terminal of the buffer-element $Tr_{m2}$, and a second power-supply terminal to a ground potential. Between the ground potential and the output terminal of the rear-inverter $Ir_{m2}$, the storage capacitor $Cr_{m2}$ assigned in the rear-inverter $Ir_{m2}$ is connected. The output terminal of the rear-stage cell $Mr_{m2}$ delivers the signal stored in the storage capacitor $Cr_{m2}$ to the next front-stage cell $M_{m2}$. That is, the rear-inverter $Ir_{m2}$ re-inverts the inverted signal transferred from the front-stage cell $M_{m2}$ arranged in the same row, and transfers further the re-inverted signal to the O-column $U_3$ arranged adjacent to an output side of the rear-stage cell $Mr_{m2}$. And, the storage capacitor $Cr_{m2}$ stores the re-inverted signal.

As the first and the second clock signals swing periodically, the coupling-element $Tc_{m2}$ in the second O-column $U_2$ and the buffer-element $Tr_{m2}$ in the second E-column $Ur_2$ operate such that when the coupling-element $Tc_{m2}$ is conductive state, the buffer-element $Tr_{m2}$ is cut-off state, and vice versa. Therefore, the Domino transportation of the signals from the storage capacitor $C_{m2}$ of the front-inverter $I_{m2}$ to the rear-inverter $Ir_{m2}$ is prevented. And, by the pair of the front-inverter $I_{m2}$ and the rear-inverter $Ir_{m2}$, the voltage levels of the attenuated signal "1" are amplified respectively up to the voltage level of the supply voltage so as to wave-shape the distorted input signals.

First Row in n-th Column

Still furthermore, as illustrated in FIG. 3C, in the n-th O-column $U_n$ in the matrix, the front-stage cell $M_{1n}$, on the first row encompasses a coupling-element $Tc_{1n2}$ having an input terminal connected to the output terminal of the rear-stage cell $Mr_{1(n-1)}$ in the preceding (n−1)-th E-column $Ur_1$ and a control terminal connected to the clock-line $L_{clk}$. The front-stage cell $M_{1n}$ further encompasses a front-inverter $I_{1n}$, an input terminal of the front-inverter is connected to an output terminal of the coupling-element $Tc_{1n}$.

The front-inverter $I_{1n}$ has a first power-supply terminal connected to a power-supply line $L_{sv}$, an input terminal connected to the output terminal of the coupling-element $Tc_{1n}$, and a second power-supply terminal to a ground potential. The front-inverter $I_{1n}$ can shape the pulse waveform of the entered input signal, even if the front-inverter $I_{1n}$ is driven at lower supply voltage of one volt. At the output terminal of the front-inverter $I_{1n}$, a storage capacitor $C_{1n}$ is connected between the output terminal and the ground potential$_{1n3}$. The storage capacitor $C_{1n}$ may be implemented by a stray capacitor parasitic in the front-inverter $I_{1n}$. The other storage capacitors $C_{2n}, C_{3n}, \ldots, C_{(m-1)n}, C_{mn}$ may be implemented by stray capacitors respectively. The output terminal delivers the signal stored in the storage capacitor $C_{1n}$ to the rear-stage cell $Mr_{1n}$, which is arranged before an output terminal $OUT_1$ in the output column.

And, as illustrated in FIG. 3C, in the n-th E-column $Ur_n$ in the matrix, the first row rear-stage cell $Mr_{1n}$ is inserted between the front-stage cell $M_{1n}$ and the output terminal $OUT_1$ in the output column. The first row rear-stage cell $Mr_{1n}$ encompasses a buffer-element, or the rear-stage coupling-element $Tr_{1n}$ having an input terminal connected to the output terminal of the front-stage cell $M_{1n}$ and a control terminal connected to the clock-line $L_{clk}$, and an output terminal connected to an input terminal of a rear-inverter $Ir_{1n}$ implemented by a CMOS inverter.

The input terminal of the CMOS inverter is connected to the output terminal of the buffer-element $Tr_{1n}$. That is, the buffer-element $Tr_{1n}$ controls transferring the signal from the output terminal of the front-stage cell $M_{1n}$ allocated in the n-th O-column $U_n$ arranged adjacent to an input side of the n-th E-column $Ur_n$. The rear-inverter $Ir_{1n}$ has a first power-supply terminal connected to a power-supply line $L_{sv}$, an input terminal connected to the output terminal of the buffer-element $Tr_{1n}$, and a second power-supply terminal to a ground potential. Because the first and the second clock signals swing periodically in the quasi-complementary mode, the coupling-element $Tc_{1n}$ and the buffer-element $Tr_{1n}$ operate quasi-complementary such that when the coupling-element $Tc_{1n}$ is conductive state, the buffer-element $Tr_{1n}$ is cut-off state, and vice versa.

Therefore, the "Domino transportation" of the signal is protected, and each of the front-stage cell $M_{1n}$ and the rear-stage cell $Mr_{1n}$ can serve as an active independent bit-level cell. Since the successive two bit-level data in a data stream can be shared by neighboring bit-level cells $M_{1n}$ and $Mr_{1n}$, the data-packing density can be maximized so that the memory capacity can be increased. Between the ground potential and the output terminal of the rear-inverter $Ir_{1n}$, a storage capacitor $Cr_{1n}$ assigned in the rear-inverter $Ir_{1n}$ is connected. The storage capacitor $Cr_{1n}$ may be implemented by a stray capacitor, which is parasitic in the rear-inverter $Ir_{1n}$. The other storage capacitors $Cr_{2n}, Cr_{3n}, \ldots, Cr_{(m-1)n}, Cr_{mn}$ and the like may be implemented by stray capacitors respectively in minute structures of the rear-inverter $Ir_{2n}, Ir_{3n}, \ldots, Ir_{(m-1)n}, Ir_{mn}$.

The output terminal of the rear-stage cell $Mr_{1n}$ delivers the signal stored in the storage capacitor $Cr_{1n}$ to the output terminal $OUT_1$. That is, the rear-inverter $Ir_{1n}$ re-inverts the inverted signal transferred from the front-stage cell $M_{1n}$ arranged in the same row, and transfers further the re-inverted signal to the output terminal $OUT_1$ in the output column. And, the storage capacitor $Cr_{1n}$ stores the re-inverted signal.

Second Row in n-th Column

Similarly, as illustrated in FIG. 3C, the front-stage cell $M_{2n}$ on the second row encompasses a coupling-element $Tc_{2n1}$ having an input terminal connected to the output terminal of the rear-stage cell $Mr_{2(n-1)}$ in the preceding (n−1)-th E-column Ur(n−1) and a control terminal connected to the clock-line $L_{clk}$, and a front-inverter $I_{2n}$, an input terminal of the front-inverter is connected to an output terminal of the coupling-element $Tc_{2n}$. The front-inverter $I_{2n}$ has a first power-supply terminal connected to a power-supply line $L_{sv}$, an input terminal connected to the output terminal of the coupling-element $Tc_{2n}$, and a second power-supply terminal to a ground potential.

The front-inverter $I_{2n}$ can shape the pulse waveform of the entered input signal, even if the front-inverter $I_{2n}$ is driven at lower supply voltage of one volt, by amplifying the attenuated pulse-height up to the voltage level of the supply voltage. Between the ground potential and the output terminal of the front-inverter $I_{2n}$, the storage capacitor $C_{2n}$ assigned in the front-inverter $I_{2n}$ is connected. The output terminal delivers the signal stored in the storage capacitor $C_{2n}$ to the rear-stage cell $Mr_{2n}$, which is arranged before an output terminal $OUT_2$ in the output column.

As illustrated in FIG. 3C, the second row rear-stage cell $Mr_{2n}$ inserted between the front-stage cell $M_{2n}$ and the output terminal $OUT_2$ encompasses a buffer-element $Tr_{2n}$ having an input terminal connected to the output terminal of the front-stage cell $M_{2n}$ and a control terminal connected to the clock-line $L_{clk}$, and a rear-inverter $Ir_{2n}$ having an input terminal connected to an output terminal of the buffer-element $Tr_{2n}$. That is, the buffer-element $Tr_{2n}$ controls transferring the signal from the output terminal of the front-stage cell $M_{2n}$ allocated in the O-column $U_n$ arranged adjacent to an input side of the E-column $Ur_n$. The rear-inverter $Ir_{2n}$ has a first power-supply terminal connected to a power-supply line $L_{sv}$, an input terminal connected to the output terminal of the buffer-element $Tr_{2n}$, and a second power-supply terminal to a ground potential.

Between the ground potential and the output terminal of the rear-inverter $Ir_{2n}$, the storage capacitor $Cr_{2n}$ assigned in the rear-inverter $Ir_{2n}$ is connected. The output terminal of the rear-stage cell $Mr_{2n}$ delivers the signal stored in the storage capacitor $Cr_{2n}$ to the output terminal $OUT_2$. That is, the rear-inverter $Ir_{2n}$ re-inverts the inverted signal transferred from the front-stage cell $M_{2n}$ arranged in the same row, and transfers further the re-inverted signal to the output terminal $OUT_2$ in the output column. And, the storage capacitor $Cr_{2n}$ stores the re-inverted signal.

As the first and the second clock signals swing periodically in the quasi-complementary mode, the coupling-element $Tc_{2n}$ in the n-th O-column $U_n$ and the buffer-element $Tr_{2n}$ in the n-th E-column $Ur_n$ operate quasi-complementary, respectively, such that when the coupling-element $Tc_{2n}$ is conductive state, the buffer-element $Tr_{2n}$ is cut-off state, and vice versa. Therefore, the Domino transportation of the signals from the storage capacitor $C_{2n}$ of the front-inverter $I_{2n}$ to the rear-inverter $Ir_{2n}$ is prevented. And, by the pair of the front-inverter $I_{2n}$ and the rear-inverter $Ir_{2n}$, the voltage levels of the attenuated signal "1" are amplified respectively up to the voltage level of the supply voltage so as to wave-shape the distorted input signals.

Third Row in n-th Column

As illustrated in FIG. 3C, the front-stage cell $M_{3n}$ on the third row encompasses a coupling-element $Tc_{3n}$ having an input terminal connected to the output terminal of the rear-stage cell $Mr_{31}$ in the preceding (n−1)-th E-column $Ur_1$ and a control terminal connected to the clock-line $L_{clk}$, and a front-inverter $I_{3n}$, an input terminal of the front-inverter is connected to an output terminal of the coupling-element $Tc_{3n}$. The front-inverter $I_{3n}$ has a first power-supply terminal connected to a power-supply line $L_{sv}$, an input terminal connected to the output terminal of the coupling-element $Tc_{3n}$, and a second power-supply terminal to a ground potential.

The front-inverter $I_{3n}$ can shape the pulse waveform of the entered input signal, even if the front-inverter $I_{3n}$ is driven at lower supply voltage of one volt. Between the ground potential and the output terminal of the front-inverter $I_{3n}$, the storage capacitor $C_{3n}$ assigned in the front-inverter $I_{3n}$ is connected. The output terminal delivers the signal stored in the storage capacitor $C_{3n}$ to the rear-stage cell $Mr_{3n}$, which is arranged before an output terminal $OUT_3$ in the output column.

As illustrated in FIG. 3C, the third row rear-stage cell $Mr_{3n}$ is inserted between the front-stage cell $M_{3n}$ and the front-stage cell $M_{33}$. The third row rear-stage cell $Mr_{3n}$ encompasses a buffer-element $Tr_{3n}$ having an input terminal connected to the output terminal of the front-stage cell $M_{3n}$ and a control terminal connected to the clock-line $L_{clk}$, and a rear-inverter $Ir_{3n}$ having an input terminal connected to an output terminal of the buffer-element $Tr_{3n}$. That is, the buffer-element $Tr_{3n}$ controls transferring the signal from the output terminal of the front-stage cell $M_{3n}$ allocated in the O-column $U_2$ arranged adjacent to an input side of the E-column $Ur_2$.

The rear-inverter $Ir_{3n}$ has a first power-supply terminal connected to a power-supply line $L_{sv}$, an input terminal connected to the output terminal of the buffer-element $Tr_{3n}$, and a second power-supply terminal to a ground potential. Between the ground potential and the output terminal of the rear-inverter $Ir_{3n}$, the storage capacitor $Cr_{3n}$ assigned in the rear-inverter $Ir_{3n}$ is connected. The output terminal of the rear-stage cell $Mr_{3n}$ delivers the signal stored in the storage capacitor $Cr_{3n}$ to the output terminal $OUT_3$. That is, the rear-inverter $Ir_{3n}$ re-inverts the inverted signal transferred from the front-stage cell $M_{3n}$ arranged in the same row, and transfers further the re-inverted signal to the output terminal $OUT_3$ in the output column. And, the storage capacitor $Cr_{3n}$ stores the re-inverted signal.

As the first and the second clock signals swing periodically, the coupling-element $Tc_{3n}$ in the n-th O-column $U_2$ and the buffer-element $Tr_{3n}$ in the n-th E-column $Ur_2$ operate such that when the coupling-element $Tc_{3n}$ is conductive state, the buffer-element $Tr_{3n}$ in the n-th E-column $Ur_1$ is cut-off state, and vice versa. Therefore, the Domino transportation of the signals from the storage capacitor $C_{3n}$ of the front-inverter $I_{3n}$ to the rear-inverter $Ir_{3n}$ is prevented. And, by the pair of the front-inverter $I_{3n}$ and the rear-inverter $Ir_{3n}$, the voltage levels of the attenuated signal "1" are amplified respectively up to the voltage level of the supply voltage so as to wave-shape the distorted input signals.

(m−1)-th Row in n-th Column

The front-stage cell $M_{(m-1)n}$ on the (m−1)-th row encompasses a coupling-element $Tc_{(m-1)n}$ having an input terminal connected to the output terminal of the rear-stage cell $Mr_{(m-1)n}$ in the preceding (n−1)-th E-column $Ur_1$ and a control terminal connected to the clock-line $L_{clk}$, and a front-inverter $I_{(m-1)n}$, an input terminal of the front-inverter is connected to an output terminal of the coupling-element $Tc_{(m-1)n}$. The front-inverter $I_{(m-1)n}$ has a first power-supply terminal connected to a power-supply line $L_{sv}$, an input terminal connected to the output terminal of the coupling-element $Tc_{(m-1)n}$, and a second power-supply terminal to a ground potential.

The front-inverter $I_{(m-1)n}$ can shape the pulse waveform of the entered input signal, even if the front-inverter $I_{(m-1)n}$ is driven at lower supply voltage of one volt. Between the ground potential and the output terminal of the front-inverter $I_{(m-1)n}$, the storage capacitor $C_{(m-1)n}$ assigned in the front-inverter $I_{(m-1)n}$ is connected. The output terminal of the front-stage cell $M_{(m-1)n}$ delivers the signal stored in the storage capacitor $C_{(m-1)n}$ to the rear-stage cell $Mr_{(m-1)n}$, which is arranged before an output terminal $OUT_{(m-1)}$ in the output column.

As illustrated in FIG. 3C, the (m−1)-th row rear-stage cell $Mr_{(m-1)n}$ inserted between the front-stage cell $M_{(m-1)n}$ and the front-stage cell $M_{(m-1)3}$ encompasses a buffer-element $Tr_{(m-1)n}$ having an input terminal connected to the output terminal of the front-stage cell $M_{(m-1)n}$ and a control terminal connected to the clock-line $L_{clk}$, and a rear-inverter $Ir_{(m-1)n}$ having an input terminal connected to an output terminal of the buffer-element $Tr_{(m-1)n}$. That is, the buffer-element $Tr_{(m-1)n}$ controls transferring the signal from the output terminal of the front-stage cell $M_{(m-1)n}$ allocated in the O-column $U_2$ arranged adjacent to an input side of the E-column $Ur_2$.

The rear-inverter $Ir_{(m-1)n}$ has a first power-supply terminal connected to a power-supply line $L_{sv}$, an input terminal connected to the output terminal of the buffer-element $Tr_{(m-1)n}$, and a second power-supply terminal to a ground potential. Between the ground potential and the output terminal of the rear-inverter $Ir_{(m-1)n}$, the storage capacitor $Cr_{(m-1)n}$ assigned in the rear-inverter $Ir_{(m-1)n}$ is connected. The output terminal of the rear-stage cell $Mr_{(m-1)n}$ delivers the signal stored in the storage capacitor $Cr_{(m-1)n}$ to the output terminal $OUT_{(m-1)}$. That is, the rear-inverter $Ir_{(m-1)n}$ re-inverts the inverted signal transferred from the front-stage cell $M_{(m-1)n}$ arranged in the same row, and transfers further the re-inverted signal to the output terminal $OUT_{(m-1)}$ in the output column. And, the storage capacitor $Cr_{(m-1)n}$ stores the re-inverted signal.

As the first and the second clock signals swing periodically, the coupling-element $Tc_{(m-1)n}$ in the n-th O-column $U_2$ and the buffer-element $Tr_{(m-1)n}$ in the n-th E-column $Ur_2$ operate such that when the coupling-element $Tc_{(m-1)n}$ is conductive state, the buffer-element $Tr_{m-1)n}$ is cut-off state, and vice versa. Therefore, the Domino transportation of the signals from the storage capacitor $C_{(m-1)n}$ of the front-inverter to the rear-inverter $Ir_{(m-1)n}$ is prevented. And, by the pair of the front-inverter $I_{(m-1)n}$ and the rear-inverter $Ir_{(m-1)n}$, the voltage levels of the attenuated signal "1" are amplified respectively up to the voltage level of the supply voltage so as to wave-shape the distorted input signals.

m-th Row in n-th Column

The front-stage cell $M_{mn}$ on the m-th row encompasses a coupling-element $Tc_{mn}$ having an input terminal connected to the output terminal of the rear-stage cell $Mr_{m1}$ in the preceding (n–1)-th E-column $Ur_1$ and a control terminal connected to the clock-line $L_{clk}$, and a front-inverter $I_{mn}$, an input terminal of the front-inverter is connected to an output terminal of the coupling-element $Tc_{mn}$. The front-inverter $I_{mn}$ has a first power-supply terminal connected to a power-supply line $L_{sv}$, an input terminal connected to the output terminal of the coupling-element $Tc_{mn}$, and a second power-supply terminal to a ground potential.

The front-inverter $I_{mn}$ can shape the pulse waveform of the entered input signal, even if the front-inverter $I_{mn}$ is driven at lower supply voltage of one volt. Between the ground potential and the output terminal of the front-inverter $L_{mn}$, the storage capacitor $C_{mn}$ assigned in the front-inverter $I_{mn}$ is connected. The output terminal of the front-stage cell $M_{mn}$ delivers the signal stored in the storage capacitor $C_{mn}$ to the rear-stage cell $Mr_{mn}$, which is arranged before an output terminal $OUT_{mn}$ in the output column.

As illustrated in FIG. 3C, the m-th row rear-stage cell $Mr_{mn}$ is inserted between the front-stage cell $M_{mn}$ and the front-stage cell $M_{m3}$. The m-th row rear-stage cell $Mr_{mn}$ encompasses a buffer-element $Tr_{mn}$ having an input terminal connected to the output terminal of the front-stage cell $M_{mn}$ and a control terminal connected to the clock-line $L_{clk}$, and a rear-inverter $Ir_{mn}$ having an input terminal connected to an output terminal of the buffer-element $Tr_{mn}$. That is, the buffer-element $Tr_{mn}$ controls transferring the signal from the output terminal of the front-stage cell $M_{mn}$ allocated in the O-column $U_1$ arranged adjacent to an input side of the E-column $U_1$.

The rear-inverter $Ir_{mn}$ has a first power-supply terminal connected to a power-supply line $L_{sv}$, an input terminal connected to the output terminal of the buffer-element $Tr_{mn}$, and a second power-supply terminal to a ground potential. Between the ground potential and the output terminal of the rear-inverter $Ir_{mn}$, the storage capacitor $Cr_{mn}$ assigned in the rear-inverter $Ir_{mn}$ is connected. The output terminal of the rear-stage cell $Mr_{mn}$ delivers the signal stored in the storage capacitor $Cr_{mn}$ to the output terminal $OUT_m$. That is, the rear-inverter $Ir_{mn}$ re-inverts the inverted signal transferred from the front-stage cell $M_{mn}$ arranged in the same row, and transfers further the re-inverted signal to the output terminal $OUT_m$ in the output column. And, the storage capacitor $Cr_{mn}$ stores the re-inverted signal.

As the first and the second clock signals swing periodically, the coupling-element $Tc_{mn}$ in the n-th O-column $U_2$ and the buffer-element $Tr_{mn}$ in the n-th E-column $Ur_2$ operate such that when the coupling-element $Tc_{mn}$ is conductive state, the buffer-element $Tr_{mn}$ is cut-off state, and vice versa. Therefore, the Domino transportation of the signals from the storage capacitor $C_{mn}$ of the front-inverter $I_{mn}$ to the rear-inverter $Ir_{mn}$ is prevented. And, by the pair of the front-inverter $I_{mn}$ and the rear-inverter $Ir_{mn}$, the voltage levels of the attenuated signal "1" are amplified respectively up to the voltage level of the supply voltage so as to wave-shape the distorted input signals.

In FIGS. 3A to 3C, although the coupling-element $Tc_{ij}$ (i=1 to m; j=1 to n) and the buffer-element $Tr_{ij}$, each of which having a single control terminal, are illustrated. However, the circuit topologies illustrated in FIG. 3A to 3C are mere examples, and the coupling-element $Tc_{ij}$, and the buffer-element $Tr_{ij}$ may have double control terminals such as a complementary pass-transistor logic, or a CMOS transmission gate.

For example, to a first control terminal of the CMOS transmission gate, a first clock signal may be applied, while to a second control terminal of the CMOS transmission gate, a second clock signal, which is an inverted signal of the first clock signal is applied, so that the double control terminals of the coupling-element $Tc_{ij}$, and the buffer-element $Tr_{ij}$ are biased in a complementary manner. Even in the case that each of the coupling-element $Tc_{ij}$ and the buffer-element $Tr_{ij}$ has the double control terminals, a single clock line illustrated in FIGS. 3A to 3C is available for providing the first and second clock signals, because if an inverter is inserted between the first and second control terminals, the first clock signal is easily inverted to obtain the second clock signal.

First Embodiment: Triple-Tr Cell Scheme

FIGS. 4A and 4B illustrate an example of transistor-level representations of representative 2*2 arrays of the MM cells including the array of the rear-stage cells, which are used in the MM computer system pertaining to the first embodiment. In the circuit configurations illustrated in FIGS. 4A and 4B, although transistor symbols for MOS field effect transistors (FETs) are used as the active elements, the MOSFETs can be replaced by MOS static induction transistors (SITs).

And, furthermore, the MOSFET and the MOSSIT can be replaced respectively by a metal-insulator-semiconductor (MIS) FET and a MISSIT, which have gate insulating films other than silicon oxide film ($SiO_2$ film). The same replacement of the active elements implementing the transistor-level configuration of the MM can be applied to the second and third embodiments.

Therefore, the "MOS transistors" referred in the first to third embodiments shall be called as "MIS transistors". For example, the insulating film for the MIS transistor may be an ONO film having a triple-layered structure including a silicon oxide film ($SiO_2$ film), a silicon nitride film $Si_3N_4$ film), and a silicon oxide film ($SiO_2$ film). Further, a gate insulating film used for the MIS transistor may include an oxide containing at least one element selected from strontium (Sr), aluminum (Al), magnesium (Mg), yttrium (Y), hafnium (Hf), zirconium (Zr), tantalum (Ta), and bismuth (Bi), or silicon nitride containing at least one element selected from the above-listed elements.

At the top left position in FIG. 4A, a j-th front-stage cell $M_{ij}$ on the i-th row in the matrix of MM is illustrated (i=1 to m; j=1 to n). The front-stage cell encompasses a coupling-element implemented by an nMOS transistor $Q_{ij1}$, which has a first main-electrode connected to an output terminal of the rear-stage cell $Mr_{i(j-1)}$ inserted between the preceding front-stage cell $M_{i(j-1)}$ and a gate electrode connected to the first clock-line $L_{clk1}$, and a front-inverter $I_{ij}$ having an input terminal connected to a second main-electrode of the coupling-element $Q_{ij1}$.

That is, a coupling-element $Q_{ij1}$ controls transferring the signal from an output terminal of the adjacent rear-stage cell $Mr_{i(j-1)}$ allocated in the E-column $Ur_{(j-1)}$ arranged adjacent to an input side of the O-column $U_j$. The front-inverter $I_{ij}$ is implemented by a CMOS inverter encompassing a pMOS transistor $Q_{ij2}$, which has a first main-electrode connected to a power-supply line $L_{sv}$ and a gate electrode connected to the second main-electrode of the coupling-element $Q_{ij1}$, and an nMOS transistor $Q_{ij3}$, which has a first main-electrode connected to a second main-electrode of the pMOS transistor $Q_{ij2}$, a gate electrode connected to the second main-electrode of the coupling-element $Q_{ij1}$, and a second main-electrode connected to a ground potential.

To the output terminal of the front-inverter $I_{ij}$, the storage capacitor $C_{ij}$ assigned in the front-inverter $I_{ij}$ is connected in parallel with the nMOS transistor $Q_{ij3}$. And an output node connecting the second main-electrode of the pMOS transistor $Q_{ij2}$ and the first main-electrode of the nMOS transistor $Q_{ij3}$ serves as an internal output terminal of the front-stage cell $M_{ij}$.

The internal output terminal of the front-stage cell $M_{ij}$ delivers the signal stored in the storage capacitor $C_{ij}$ to the rear-stage cell $Mr_{ij}$, which is arranged before the next front-stage cell $M_{i(j+1)}$. That is, a front-inverter $I_{ij}$ inverts the signal transferred through the coupling-element $Q_{ij1}$, and transfers further the inverted signal to the E-column $Ur_j$ arranged adjacent to an output side of the front-stage cell $M_{ij}$. And front-stage storage capacitor $C_{ij}$ stores the inverted signal.

And, the rear-stage cell $Mr_{ij}$ inserted between the front-stage cell $M_{ij}$ and the front-stage cell $M_{i(j+1)}$ encompasses a buffer-element implemented by an nMOS transistor $Qr_{ij1}$, which has a first main-electrode connected to an internal output terminal of the preceding front-stage cell $M_{ij}$ and a gate electrode connected to a second clock-line $L_{clk2}$, and a rear-inverter $Ir_{ij}$ having an input terminal connected to a second main-electrode of the buffer-element $Qr_{ij1}$. As already discussed, the first second clock-line $L_{clk1}$ and the second clock-line $L_{clk2}$ $CLK_2$ can be merged into a single common clock-line $L_{clk}$ as illustrated in FIG. 2.

That is, the buffer-element $Qr_{ij1}$ controls transferring the signal from an output terminal of the adjacent front-stage cell $M_{ij}$ allocated in the O-column $U_j$ arranged adjacent to an input side of the E-column $Ur_j$. The rear-inverter $Ir_{ij}$ is implemented by a CMOS inverter encompassing a pMOS transistor $Qr_{ij2}$ having a first main-electrode connected to a power-supply $L_{sv}$ and a gate electrode connected to the second main-electrode of the buffer-element $Qr_{ij1}$, and an nMOS transistor $Qr_{ij3}$ having a first main-electrode connected to a second main-electrode of the pMOS transistor $Qr_{ij2}$, a gate electrode connected to the second main-electrode of the buffer-element $Qr_{ij1}$, and a second main-electrode connected to a ground potential.

To the output terminal of the rear-inverter $Ir_{ij}$, the storage capacitor $Cr_{ij}$ assigned in the rear-inverter $Ir_{ij}$ is connected in parallel with the nMOS transistor $Qr_{ij3}$. And an output node connecting the second main-electrode of the pMOS transistor $Qr_{ij2}$ and the first main-electrode of the nMOS transistor $Qr_{ij3}$ serves as an output terminal of the rear-stage cell $Mr_{ij}$. The output terminal of the rear-stage cell $Mr_{ij}$ delivers the signal stored in the storage capacitor $Cr_{ij}$ to the next front-stage cell $M_{i(j+1)}$. That is, the rear-inverter $Ir_{ij}$ re-inverts the inverted signal transferred from the front-stage cell $M_{ij}$ arranged in the same row, and transfers further the re-inverted signal to the O-column $U_{(j+1)}$ arranged adjacent to an output side of the rear-stage cell $Mr_{ij}$. And, the storage capacitor $Cr_{ij}$ stores the re-inverted signal.

And, as illustrated in FIG. 4A, a j-th front-stage cell $M_{(i+1)j}$ on the (i+1)-th row encompasses a coupling-element implemented by an nMOS transistor $Q_{(i+1)j1}$, which has a first main-electrode connected to an output terminal of the rear-stage cell $Mr_{(i+1)(j-1)}$ inserted between the preceding front-stage cell $M_{(i+1)(j-1)}$ and a gate electrode connected to the first clock-line $L_{clk1}$, and a front-inverter $I_{(i+1)j}$ having an input terminal connected to a second main-electrode of the coupling-element $Q_{(i+1)j1}$.

That is, a coupling-element $Q_{(i+1)j1}$ controls transferring the signal from an output terminal of the adjacent rear-stage cell $Mr_{i(j-1)}$, $Mr_{(i+1)(j-1)}$ allocated in the E-column $Ur_{(j-1)}$ arranged adjacent to an input side of the O-column $U_j$. The front-inverter $I_{(i+1)j}$ is implemented by a CMOS inverter encompassing a pMOS transistor $Q_{(i+1)j2}$ having a first main-electrode connected to a power-supply line $L_{sv}$ and a gate electrode connected to the second main-electrode of the coupling-element $Q_{(i+1)j1}$, and an nMOS transistor $Q_{(i+1)j3}$ having a first main-electrode connected to a second main-electrode of the pMOS transistor $Q_{(i+1)j2}$, a gate electrode connected to the second main-electrode of the coupling-element $Q_{(i+1)j1}$, and a second main-electrode connected to a ground potential.

To the output terminal of the front-inverter $I_{(i+1)j}$, the storage capacitor $C_{(i+1)j}$ assigned in the front-inverter $I_{(i+1)j}$ is connected in parallel with the nMOS transistor $Q_{(i+1)j3}$. And an output node connecting the second main-electrode of the pMOS transistor $Q_{(i+1)j2}$ and the first main-electrode of the nMOS transistor $Q_{(i+1)j3}$ serves as an internal output terminal of the front-stage cell $M_{(i+1)j}$. The internal output terminal of the front-stage cell $M_{(i+1)j}$ delivers the signal stored in the storage capacitor $C_{(i+1)j}$ to the rear-stage cell $Mr_{(i+1)j}$, which is arranged before the next front-stage cell $M_{(i+1)(j+1)}$. That is, a front-inverter $I_{(i+1)j}$ inverts the signal transferred through the coupling-element $Q_{(i+1)j1}$, and transfers further the inverted signal to the E-column $Ur_j$ arranged adjacent to an output side of the front-stage cell $M_{(i+1)j}$. And front-stage storage capacitor $C_{(i+1)j}$ stores the inverted signal.

And, the rear-stage cell $Mr_{(i+1)j}$ inserted between the front-stage cell $M_{(i+1)j}$ and the front-stage cell $M_{(i+1)(j+1)}$ encompasses a buffer-element implemented by an nMOS transistor $Qr_{(i+1)j1}$, which has a first main-electrode connected to an internal output terminal of the preceding front-stage cell $M_{(i+1)j}$ and a gate electrode connected to a second clock-line $L_{clk2}$, and a rear-inverter $Ir_{(i+1)j}$ having an input terminal connected to a second main-electrode of the buffer-element $Qr_{(i+1)j1}$.

That is, the buffer-element $Qr_{(i+1)j1}$ controls transferring the signal from an output terminal of the adjacent front-stage cell $M_{(i+1)j}$ allocated in the O-column $U_j$ arranged adjacent to an input side of the E-column $Ur_j$. The rear-inverter $Ir_{(i+1)j}$ is implemented by a CMOS inverter encompassing a pMOS transistor $Qr_{(i+1)j2}$ having a first main-electrode connected to a power-supply line $L_{sv}$ and a gate electrode connected to the second main-electrode of the buffer-element $Qr_{(i+1)j1}$, and an nMOS transistor $Qr_{(i+1)j3}$ having a first main-electrode connected to a second main-electrode of the pMOS transistor $Qr_{(i+1)j2}$, a gate electrode connected to the second main-electrode of the buffer-element $Qr_{(i+1)j1}$, and a second main-electrode connected to a ground potential.

To the output terminal of the rear-inverter $Ir_{(i+1)j}$, the storage capacitor $Cr_{(i+1)j}$ assigned in the rear-inverter $Ir_{(i+1)j}$ is connected in parallel with the nMOS transistor $Qr_{(i+1)j3}$. And an output node connecting the second main-electrode of the pMOS transistor $Qr_{(i+1)j2}$ and the first main-electrode of the nMOS transistor $Qr_{(i+1)j3}$ serves as an output terminal of the rear-stage cell $Mr_{(i+1)j}$. The output terminal of the rear-stage cell $Mr_{(i+1)j}$ delivers the signal stored in the storage capacitor $Cr_{(i+1)j}$ to the next front-stage cell $M_{(i+1)(j+1)}$. That is, the rear-inverter $Ir_{(i+1)j}$ re-inverts the inverted signal transferred from the front-stage cell $M_{(i+1)j}$ arranged in the same row, and transfers further the re-inverted signal to the O-column $U_{(j+1)}$ arranged adjacent to an output side of the rear-stage cell $Mr_{(i+1)j}$. And, the storage capacitor $Cr_{(i+1)j}$ stores the re-inverted signal.

As illustrated in FIG. 4B, a (j+1)-th front-stage cell $M_{i(j+1)}$ on the i-th row encompasses a coupling-element implemented by an nMOS transistor $Q_{i(j+1)1}$, which has a first main-electrode connected to an output terminal of the rear-stage cell $Mr_{ij}$ inserted between the preceding front-stage cell $M_{ij}$ and a gate electrode connected to the first clock-line $L_{clk1}$, and a front-inverter $I_{i(j+1)}$ having an input terminal connected to a second main-electrode of the coupling-element $Q_{i(j+1)1}$. That is, a coupling-element $Q_{i(j+1)1}$ controls transferring the signal from an output terminal of the adjacent rear-stage cell $Mr_{ij}$ allocated in the E-column $Ur_j$ arranged adjacent to an input side of the O-column $U_{(j+1)}$.

The front-inverter $I_{i(j+1)}$ is implemented by a CMOS inverter encompassing a pMOS transistor $Q_{i(j+1)2}$ having a first main-electrode connected to a power-supply line $L_{sv}$ and a gate electrode connected to the second main-electrode of the coupling-element $Q_{i(j+1)1}$, and an nMOS transistor $Q_{i(j+1)3}$ having a first main-electrode connected to a second main-electrode of the pMOS transistor $Q_{i(j+1)2}$, a gate electrode connected to the second main-electrode of the coupling-element $Q_{i(j+1)1}$ and a second main-electrode connected to a ground potential. To the output terminal of the front-inverter $I_{i(j+1)}$, the storage capacitor $C_{i(j+1)}$ assigned in the front-inverter $I_{i(j+1)}$ is connected in parallel with the nMOS transistor $Q_{i(j+1)3}$.

And an output node connecting the second main-electrode of the pMOS transistor $Q_{i(j+1)2}$ and the first main-electrode of the nMOS transistor $Q_{i(j+1)3}$ serves as an internal output terminal of the front-stage cell $M_{i(j+1)}$. The internal output terminal of the front-stage cell $M_{i(j+1)}$ delivers the signal stored in the storage capacitor $C_{i(j+1)}$ to the rear-stage cell $Mr_{i(j+1)}$, which is arranged before the next front-stage cell $M_{i(j+2)}$. That is, a front-inverter $I_{i(j+1)}$ inverts the signal transferred through the coupling-element $Q_{i(j+1)1}$, and transfers further the inverted signal to the E-column $Ur_{(j+1)}$ arranged adjacent to an output side of the front-stage cell $M_{i(j+1)}$. And front-stage storage capacitor $C_{i(j+1)}$ stores the inverted signal.

And, the rear-stage cell $Mr_{i(j+1)}$ inserted between the front-stage cell $M_{i(j+1)}$ and the front-stage cell $M_{i(j+2)}$ encompasses a buffer-element implemented by an nMOS transistor $Qr_{i(j+1)1}$, which has a first main-electrode connected to an internal output terminal of the preceding front-stage cell $M_{i(j+1)}$ and a gate electrode connected to a second clock-line $L_{clk2}$, and a rear-inverter $Ir_{i(j+1)}$ having an input terminal connected to a second main-electrode of the buffer-element $Qr_{i(j+1)1}$. That is, the buffer-element $Qr_{i(j+1)1}$ controls transferring the signal from an output terminal of the adjacent front-stage cell $M_{i(j+1)}$ allocated in the O-column $U_{(j+1)}$ arranged adjacent to an input side of the E-column $Ur_{(j+1)}$.

The rear-inverter $Ir_{i(j+1)}$ is implemented by a CMOS inverter encompassing a pMOS transistor $Qr_{i(j+1)2}$ having a first main-electrode connected to a power-supply line $L_{sv}$ and a gate electrode connected to the second main-electrode of the buffer-element $Qr_{i(j+1)1}$, and an nMOS transistor $Qr_{i(j+1)3}$ having a first main-electrode connected to a second main-electrode of the pMOS transistor $Qr_{i(j+1)2}$, a gate electrode connected to the second main-electrode of the buffer-element $Qr_{i(j+1)1}$, and a second main-electrode connected to a ground potential. To the output terminal of the rear-inverter $Ir_{i(j+1)}$, the storage capacitor $Cr_{i(j+1)}$ assigned in the rear-inverter is connected in parallel with the nMOS transistor $Qr_{i(j+1)3}$. And an output node connecting the second main-electrode of the pMOS transistor $Qr_{i(j+1)2}$ and the first main-electrode of the nMOS transistor $Qr_{i(j+1)3}$ serves as an output terminal of the rear-stage cell $Mr_{i(j+1)}$.

The output terminal of the rear-stage cell $Mr_{i(j+1)}$ delivers the signal stored in the storage capacitor $Cr_{i(j+1)}$ to the next front-stage cell $M_{i(j+2)}$. That is, the rear-inverter $Ir_{i(j+1)}$ re-inverts the inverted signal transferred from the front-stage cell $M_{i(j+1)}$ arranged in the same row, and transfers further the re-inverted signal to the O-column $U_{(j+2)}$ arranged adjacent to an output side of the rear-stage cell $Mr_{i(j+1)}$. And, the storage capacitor $Cr_{i(j+1)}$ stores the re-inverted signal.

Furthermore, as illustrated in FIG. 4B, a (j+1)-th front-stage cell $M_{(i+1)(j+1)}$ on the (i+1)-th row encompasses a coupling-element implemented by an nMOS transistor $Q_{(i+1)(j+1)1}$, which has a first main-electrode connected to an output terminal of the rear-stage cell $Mr_{(i+1)j}$ inserted between the preceding front-stage cell $M_{(i+1)j}$ and a gate electrode connected to the first clock-line $L_{clk1}$, and a front-inverter $I_{(i+1)(j+1)}$ having an input terminal connected to a second main-electrode of the coupling-element $Q_{(i+1)(j+1)1}$.

That is, a coupling-element $Q_{(i+1)(j+1)1}$ controls transferring the signal from an output terminal of the adjacent rear-stage cell $Mr_{(i+1)j}$ allocated in the E-column $Ur_j$ arranged adjacent to an input side of the O-column $U_{(j+1)}$. The front-inverter $I_{(i+1)(j+1)}$ is implemented by a CMOS inverter encompassing a pMOS transistor $Q_{(i+1)(j+1)2}$ having a first main-electrode connected to a power-supply line $L_{sv}$ and a gate electrode connected to the second main-electrode of the coupling-element $Q_{(i+1)(j+1)1}$, and an nMOS transistor $Q_{(i+1)(j+1)3}$ having a first min-electrode connected to a second main-electrode of the pMOS transistor $Q_{(i+1)(j+1)2}$, a gate electrode connected to the second main-electrode of the coupling-element $Q_{(i+1)(j+1)1}$, and a second main-electrode connected to a ground potential.

To the output terminal of the front-inverter $I_{(i+1)(j+1)}$, the storage capacitor $C_{(i+1)(j+1)}$ assigned in the front-inverter $I_{(i+1)(j+1)}$ is connected in parallel with the nMOS transistor $Q_{(i+1)(j+1)3}$. And an output node connecting the second main-electrode of the pMOS transistor $Q_{(i+1)(j+1)2}$ and the first main-electrode of the nMOS transistor $Q_{(i+1)(j+1)3}$ serves as an internal output terminal of the front-stage cell $M_{(i+1)(j+1)}$. The internal output terminal of the front-stage cell $M_{(i+1)(j+1)}$ delivers the signal stored in the storage capacitor $C_{(i+1)(j+1)}$ to the rear-stage cell $Mr_{(i+1)(j+1)}$, which is arranged before the next front-stage cell $M_{(i+1)(j+2)}$. That is, a front-inverter $I_{(i+1)(j+1)}$ inverts the signal transferred through the coupling-element $Q_{(i+1)(j+1)1}$, and transfers further the inverted signal to the E-column $Ur_{(j+1)}$ arranged adjacent to an output side of the front-stage cell $M_{(i+1)(j+1)}$. And front-stage storage capacitor $C_{(i+1)(j+1)}$ stores the inverted signal.

And, the rear-stage cell $Mr_{(i+1)(j+1)}$ inserted between the front-stage cell $M_{(i+1)(j+1)}$ and the front-stage cell $M_{(i+1)(j+2)}$ encompasses a buffer-element implemented by an nMOS transistor $Qr_{(i+1)(j+1)1}$, which has a first main-electrode connected to an internal output terminal of the preceding front-stage cell $M_{(i+1)(j+1)}$ and a gate electrode connected to a second clock-line $L_{clk2}$, and a rear-inverter $Ir_{(i+1)(j+1)}$ having an input terminal connected to a second main-electrode of the buffer-element $Qr_{(i+1)(j+1)1}$.

That is, the buffer-element $Qr_{(i+1)(j+1)1}$ controls transferring the signal from an output terminal of the adjacent front-stage cell $M_{(i+1)(j+1)}$ allocated in the O-column $U_{(j+1)}$ arranged adjacent to an input side of the E-column $Ur_{(j+1)}$. The rear-inverter $Ir_{(i+1)(j+1)}$ is implemented by a CMOS inverter encompassing a pMOS transistor $Qr_{(i+1)(j+1)2}$ having a first main-electrode connected to a power-supply line $L_{sv}$ and a gate electrode connected to the second main-electrode of the buffer-element $Qr_{(i+1)(j+1)1}$, and an nMOS transistor $Qr_{(i+1)(j+1)3}$ having a first main-electrode connected to a second main-electrode of the pMOS transistor $Qr_{(i+1)(j+1)2}$, a gate electrode connected to the second main-electrode of the buffer-element $Qr_{(i+1)(j+1)1}$, and a second main-electrode connected to a ground potential.

To the output terminal of the rear-inverter $Ir_{(i+1)(j+1)}$, the storage capacitor $Cr_{(i+1)(j+1)}$ assigned in the rear-inverter $Ir_{(i+1)(j+1)}$ is connected in parallel with the nMOS transistor $Qr_{(i+1)(j+1)3}$. And an output node connecting the second main-electrode of the pMOS transistor $Qr_{(i+1)(j+1)2}$ and the first main-electrode of the nMOS transistor $Qr_{(i+1)(j+1)3}$ serves as an output terminal of the rear-stage cell $Mr_{(i+1)(j+1)}$. The output terminal of the rear-stage cell $Mr_{(i+1)(j+1)}$ delivers the signal stored in the storage capacitor $Cr_{(i+1)(j+1)}$ to the next front-stage cell $M_{(i+1)(j+2)}$. That is, the rear-inverter $Ir_{(i+1)(j+1)}$ re-inverts the inverted signal transferred from the front-stage cell $M_{(i+1)(j+1)}$ arranged in the same row, and transfers further the re-inverted signal to the O-column $U_{(j+2)}$ arranged adjacent to an output side of the rear-stage cell $Mr_{(i+1)(j+1)}$. And, the storage capacitor $Cr_{(i+1)(j+1)}$ stores the re-inverted signal.

Clock Signal of the First Embodiment

FIGS. 5A-5E illustrate timing charts of the front-stage cell and the rear-stage cell in the transistor-level. That is, the waveforms illustrated in FIGS. 5A-5E correspond to temporally variations associated with operations of the front-stage cell $M_{ij}$ and the rear-stage cell $Mr_{ij}$ represented by FIG. 4A, as an example of a structure in a periodic topology implemented by front-stage cells and rear-stage cells, for waveforms of the first clock signal $CLK_1$ and the second clock signal $CLK_2$. As illustrated in FIG. 5A, because each of the first clock signal $CLK_1$ and the second clock signal $CLK_2$ periodically swings between a logical level "1" and a logical level "0", in a period of a clock cycle Tau $[Greek]_{clock}$.

For example, the first clock signal $CLK_1$ maintains logical levels of "1" for a period of Tau $[Greek]_{clock}/3$. Then, the first clock signal CLK1 becomes logical levels of "0" for a period of $2$Tau $[Greek]_{clock}/3$, after maintaining logical levels of "1" for the period of Tau $[Greek]_{clock}/3$. On the contrary, for a period of Tau $[Greek]_{clock}/2$, the second clock signal $CLK_2$ maintains logical levels of "0". Then, the second clock signal $CLK_2$ becomes logical levels of "1" for a period of Tau $[Greek]_{clock}/3$, after maintaining logical levels of "0" for the period of Tau $[Greek]_{clock}/2$.

The first clock signal $CLK_1$ and the second clock signal $CLK_2$ are Tau $[Greek]_{clock}/2$ apart temporary from each other. Therefore, the second clock signal $CLK_2$ rises after a predetermined time of Tau $[Greek]_{clock}/6$ from the falling edge of the first clock signal $CLK_1$ and falls before the predetermined time of Tau $[Greek]_{clock}/6$ from the rising edge of the first clock signal $CLK_1$. In FIGS. 5A-5E, $t_1$-$t_0$ and $t_3$-$t_2$ are defined to be Tau $[Greek]_{clock}/3$, and $t_2$-$t_1$ and $t_4$-$t_3$ are defined to be Tau $[Greek]_{clock}/6$.

However, the square waveforms illustrated in FIG. 6A are ideal waveforms under a no-load condition, and actual waveforms of the first clock signal $CLK_1$ and the second clock signal $CLK_2$ in a semiconductor chip implanting the MM will be distorted as illustrated in FIG. 7B, which will be described below. In view of the distortions of waveforms of the first clock signal $CLK_1$ and the second clock signal $CLK_2$ due to delay times Tau $[Greek]_{d1}$, Tau $[Greek]_{d2}$ ascribable to stray capacitances and stray resistance, the first clock signal $CLK_1$ and the second clock signal $CLK_2$ can be delivered from the single common clock-line $L_{clk}$ as illustrated in FIG. 2.

NAND/AND Operation Between the Times "$t_0$" to "$t_2$"

As illustrated in FIG. 5A, if the logical level of the storage capacitor $Cr_{i(j-1)}$ of the preceding rear-stage cell $Mr_{i(j-1)}$ is supposed to be "1", or the output terminal of the preceding rear-stage cell $Mr_{i(j-1)}$ is supposed to be the logical level of "1", with regard to the front-stage cell $M_{ij}$ illustrated in FIG. 4A, at time "$t_0$", when the first clock signal $CLK_1$ becomes high-level, and the high-level signal is applied to the gate electrode of the coupling-element $Q_{ij1}$, the input terminal of the front-inverter $I_{ij}$ of the front-stage cell $M_{ij}$ become the logical level of "1". The coupling-element $Q_{ij1}$ establishes the conductive state between the output terminal of the rear-stage cell $Mr_{i(j-1)}$ and the input terminal of the front-inverter $I_{ij}$ of the front-stage cell $M_{ij}$, and maintain the conductive state until the first clock signal $CLK_1$ becomes low-level at the time "$t_1$".

Then, the signal stored in the storage capacitor $Cr_{i(j-1)}$ of the preceding rear-stage cell $Mr_{i(j-1)}$ is transferred from the storage capacitor $Cr_{i(j-1)}$ to the input terminal of the front-inverter $I_{ij}$ of the front-stage cell $M_{ij}$. When the signal stored in the storage capacitor $Cr_{i(j-1)}$ of the preceding rear-stage cell $Mr_{i(j-1)}$ is transferred to the input terminal of the front-inverter $I_{ij}$ of the front-stage cell $M_{ij}$, the front-inverter $I_{ij}$ begins to invert the signal stored in the storage capacitor $Cr_{i(j-1)}$ of the rear-stage cell $Mr_{i(j-1)}$, as illustrated in FIGS. 5B and 5C, lagging by delay times Tau $[Greek]_{d1}$, Tau $[Greek]_{d2}$ illustrated in FIGS. 5B and 5C.

As illustrated in FIG. 5B, the delay time Tau $[Greek]_{d1}$ is defined as a period between a rising edge of the first clock signal $CLK_1$ and a time when the signal level falls to a threshold voltage $V_{th}$ (=0.4 volt). And, as illustrated in FIG. 5C, the delay time Tau $[Greek]_{d2}$ is defined as a period between the rising edge of the first clock signal $CLK_1$ and a time when the signal level raises to a threshold voltage $V_{th}$. The delay times Tau $[Greek]_{d1}$, Tau $[Greek]_{d2}$ are determined by the storage capacitor $C_{ij}$ and the stray resistance. Here, a stray capacitance parasitic in the front-stage cell $M_{ij}$ may be available for the storage capacitor $C_{ij}$. And the inverted signal is transferred to a node at the storage capacitor $C_{ij}$ of the front-stage cell $M_{ij}$.

For example, if the logical level of "1" is transferred from the preceding rear-stage cell $Mr_{i(j-1)}$ to the input terminal of the front-inverter $I_{ij}$ of the front-stage cell $M_{ij}$, that is, if the logical level of "1" is applied to the gate electrode of the pMOS transistor $Q_{ij2}$ and to the gate electrode of the nMOS transistor $Q_{ij3}$, the pMOS transistor $Q_{ij2}$ becomes cut-off state, while the nMOS transistor $Q_{ij3}$ becomes conductive. As a result, the logical level of "0" is stored temporary in the storage capacitor $C_{ij}$.

In this way, the front-stage cell $M_{ij}$ begins inverting the signal of the logical level of "1" stored in the preceding rear-stage cell $Mr_{i(j-1)}$ to the logical level of "0", and transferring the inverted signal of the logical level of "0" to the storage capacitor $C_{ij}$, so as to execute NAND operation as illustrated in FIG. 5B.

That is, with an input signal of "1" provided by the first clock signal $CLK_1$ and another input signal of "1" provided by the preceding rear-stage cell $Mr_{i(j-1)}$, the conventional dual-input NAND operation of:

$$1+1=0 \tag{1}$$

can be executed. In the example of FIG. 5B, the ideal logical level of storage capacitor $C_{ij}$ is represented by a solid line, and the actual potential variation of the storage capacitor $C_{ij}$ is represented by a one-dot chain line, representing a transition when the logical level of "0" is stored temporary in the storage capacitor $C_{ij}$ in a period which begins from the time "$t_0$".

After the logical level of "0" is stored temporary in the storage capacitor $C_{ij}$ of the front-stage cell $M_{ij}$, the logical level of "0" is transferred from the front-stage cell $M_{ij}$ to the input terminal of the rear-inverter $Ir_{ij}$ of the rear-stage cell $Mr_{ij}$ in FIG. 4A. That is, because the logical level of "0" is applied to the gate electrode of the pMOS transistor $Qr_{ij2}$ and the gate electrode of the nMOS transistor $Qr_{ij3}$, the pMOS transistor $Qr_{ij2}$ becomes conductive, and between the first and the second main-electrodes of the nMOS transistor $Qr_{ij3}$ becomes cut-off state. As a result, the logical level of "1" is stored in the storage capacitor $Cr_{ij}$.

In this way, the rear-stage cell $Mr_{ij}$ inverts the signal of the logical level of "0" stored at the front-stage cell $M_{ij}$ to the logical level of "1", and the inverted signal of "1" is transferred to a node at the storage capacitor $Cr_{ij}$, so as to execute NAND operation as illustrated in FIG. 5E. That is, with an input signal of "1" provided by the second clock signal $CLK_2$ and another input signal of "0" provided through the input terminal of the front-stage cell $M_{ij}$, the conventional dual-input NAND operation of:

$$0+1=1 \tag{2}$$

can be executed.

In the example of FIG. 5E, the ideal logical level at storage capacitor $Cr_{ij}$ is represented by a solid line, and the actual potential variation of the storage capacitor $Cr_{ij}$ is represented by a one-dot chain line, while the logical level "0" is stored in the storage capacitor $Cr_{ij}$ in a period between the times "$t_0$" to "$t_2$". The output node $Nr_{out}$ connecting the second main-electrode of the pMOS transistor $Qr_{ij2}$ and the first main-electrode of the nMOS transistor $Qr_{ij3}$ functions as an output terminal of the rear-stage cell $Mr_{ij}$. The output terminal of the rear-stage cell $Mr_{ij}$ sends the signal stored in the storage capacitor $Cr_{ij}$ to the next front-stage cell $M_{i(j+1)}$.

As stated above, because a combination of a j-th O-column $U_j$ and a j-th E-column $Ur_j$ implements a j-th double-bit memory-unit, in view of the overall operation of the front-stage cell $M_{ij}$ (1+1=0) and the rear-stage cell $Mr_{ij}$ (0+1=1), the conventional dual-input AND operation of:

$$1+1=1 \tag{3}$$

is achieved through the front-stage cell $M_{ij}$ and the rear-stage cell $Mr_{ij}$ in the j-th double-bit memory-unit, if the signal of the logical level of "1" stored in the preceding rear-stage cell $Mr_{i(j-1)}$, of a (j−1)-th double-bit memory-unit is entered to the input terminal of the front-stage cell $M_{ij}$ of the j-th double-bit memory-unit.

Because each of the front-stage cell $M_{ij}$ and the rear-stage cell $Mr_{ij}$ serves as an independent bit-level cell, respectively, the successive two bit-level data in a data stream can be shared by neighboring bit-level cells $M_{ij}$ and $Mr_{ij}$ in the j-th double-bit memory-unit. That is, although the result by the dual-input AND operation appears at the rear-stage cell $Mr_{ij}$, the result by the inverted dual-input AND operation, or the result by the dual-input NAND operation is executed in the front-stage cell $M_{ij}$.

On the contrary, if the logical level of "0" is stored in the storage capacitor $Cr_{i(j-1)}$ of the preceding rear-stage cell $Mr_{i(j-1)}$, the logical level of "0" is transferred from the preceding rear-stage cell $Mr_{i(j-1)}$ to the input terminal of the front-inverter $I_{ij}$ of the front-stage cell $M_{ij}$, that is, the logical level of "0" is applied to the gate electrode of the pMOS transistor $Q_{ij2}$ and the gate electrode of the nMOS transistor $Q_{ij3}$, the pMOS transistor $Q_{ij2}$ becomes conductive, and the nMOS transistor $Q_{ij3}$ becomes cut-off state. As a result, the logical level of "1" is stored temporary in the storage capacitor $C_{ij}$.

In this way, the front-stage cell $M_{ij}$ begins to invert the signal of the logical level of "0" stored in the preceding rear-stage cell $Mr_{i(j-1)}$ to the logical level of "1", and the inverted signal of "1" is transferred to a node at the storage capacitor so as to execute NAND operation as illustrated in FIG. 5C. That is, with an input signal of "1" provided by the first clock signal $CLK_1$ and another input signal of "0" provided by the preceding rear-stage cell $Mr_{i(j-1)}$, the conventional dual-input NAND operation of:

$$0+1=1 \tag{4}$$

can be executed.

In the example of FIG. 5C, the ideal logical level of storage capacitor $C_{ij}$ is represented by a solid line, and the actual potential variation of the storage capacitor $C_{ij}$ is represented by a one-dot chain line, representing a transition when the logical level "1" is stored temporary in the storage capacitor $C_{ij}$ in a period which begins from the time "$t_0$".

The output node $N_{out}$ connecting the second main-electrode of the pMOS transistor $Q_{ij2}$ and the first main-electrode of the nMOS transistor $Q_{ij3}$ functions as an internal output terminal of the front-stage cell $M_{ij}$. The internal output terminal of the front-stage cell $M_{ij}$ sends the signal stored in the storage capacitor $C_{ij}$ to the rear-stage cell $Mr_{ij}$.

At a period between the time "$t_0$" and "$t_2$", as the low-level second clock signal $CLK_2$ is applied to the gate electrode of the nMOS transistor $Qr_{ij1}$ implementing the buffer-element, the buffer-element $Qr_{ij1}$ is set to be cut-off state so as to isolate the output terminal assigned at the storage capacitor $C_{ij}$ of the front-stage cell $M_{ij}$ from the input terminal of the rear-inverter $Ir_{ij}$ of the rear-stage cell $Mr_{ij}$, and the buffer-element $Qr_{ij1}$ maintains the cut-off state until the second clock signal $CLK_2$ becomes high-level at the time "$t_2$". Therefore, it is possible to prevent the signal stored in the storage capacitor $C_{ij}$ of the front-stage cell $M_{ij}$ from being transferred to the input terminal of the rear-inverter $Ir_{ij}$ unintentionally. That is, the rear-inverter maintains by itself the signal stored in the storage capacitor $Cr_{ij}$ until the second clock signal $CLK_2$ becomes high-level at the time "$t_2$".

And, at time "$t_2$", when the second clock signal $CLK_2$ becomes high-level, and the high-level signal is applied to the gate electrode of the nMOS transistor $Qr_{ij1}$ implementing the buffer-element, so that a signal path from the output terminal assigned at the storage capacitor $C_{ij}$ of the front-stage cell $M_{ij}$ to the input terminal of the rear-inverter $Ir_{ij}$ of the rear-stage cell $Mr_{ij}$ becomes conductive. The buffer-element $Qr_{ij1}$ becomes conductive and maintains the conductive state until the second clock signal $CLK_2$ becomes low-level at the time "$t_3$". Then, the signal stored in the storage capacitor $C_{ij}$ of the front-stage cell $M_{ij}$ is transferred from the storage capacitor $C_{ij}$ to the input terminal of the rear-inverter $Ir_{ij}$ of the rear-stage cell $Mr_{ij}$.

When the signal stored in the storage capacitor $C_{ij}$ of the front-stage cell $M_{ij}$ is transferred to the input terminal of the rear-inverter $Ir_{ij}$ of the rear-stage cell $Mr_{ij}$, the rear-inverter $Ir_{ij}$ begins to invert the signal stored in the storage capacitor $C_{ij}$ of the front-stage cell $M_{ij}$, as illustrated in FIGS. 5D and 5E, lagging by the delay time Tau [Greek]$_{d1}$, Tau [Greek]$_{d2}$. As illustrated in FIG. 5D, the delay time Tau [Greek]$_{d1}$ is defined as a period between a rising edge of the second clock signal $CLK_2$ and a time when the signal level falls to a threshold voltage $V_{th}$ (=0.4 volt).

And, as illustrated in FIG. 5E, the delay time Tau [Greek]$_{d2}$ is defined as a period between the rising edge of the second clock signal $CLK_2$ and a time when the signal level raises to a threshold voltage $V_{th}$. The delay time Tau [Greek]$_{d1}$, Tau [Greek]$_{d2}$ are determined by the storage capacitor $Cr_{ij}$ and the stray resistance. The storage capacitor $Cr_{ij}$ may be implemented by a stray capacitor, which is parasitic in the rear-inverter $Mr_{ij}$. And the inverted signal is transferred to a node at the storage capacitor $Cr_{ij}$ of the rear-stage cell $Mr_{ij}$.

When the logical level of "1" is stored temporary in the storage capacitor $C_{ij}$ of the front-stage cell $M_{ij}$, the logical level of "1" is transferred from the front-stage cell $M_{ij}$ to the input terminal of the rear-inverter $Ir_{ij}$ of the rear-stage cell $Mr_{ij}$. That is, because the logical level of "1" is transferred to the gate electrode of the pMOS transistor $Qr_{ij2}$ and the gate electrode of the nMOS transistor $Qr_{ij3}$, the pMOS transistor $Qr_{ij2}$ becomes cut-off state, while the first main-electrode and the second main-electrode of the nMOS transistor $Qr_{ij3}$ is set to be conductive state. As a result, the logical level of "0" is stored in the storage capacitor $Cr_{ij}$.

In this way, the rear-stage cell $Mr_{ij}$ begins to invert the signal of the logical level of "1" stored at the front-stage cell $M_{ij}$ to the logical level of "0", and the inverted signal of "0" is stored in the storage capacitor $Cr_{ij}$, so as to execute NAND operation as illustrated in FIG. 5D. That is, with an input signal of "1" provided by the second clock signal $CLK_2$ and another input signal of "1" through the input terminal of the front-stage cell $M_{ij}$, the conventional dual-input NAND operation of:

$$1+1=0 \qquad (5)$$

can be executed. In the example of FIG. 5D, the ideal logical level at storage capacitor $Cr_{ij}$ is represented by a solid line, and the actual potential variation of the storage capacitor $Cr_{ij}$ is represented by a one-dot chain line.

Because the combination of the j-th O-column $U_j$ and the j-th E-column $Ur_j$ implements the j-th double-bit memory-unit, in view of the overall operation of the front-stage cell $M_{ij}$ (0+1=1), and the rear-stage cell $Mr_{ij}$ (1+1=0), the conventional dual-input AND operation of:

$$0+1=0 \qquad (6)$$

is achieved through the front-stage cell $M_{ij}$ and the rear-stage cell $Mr_{ij}$ in the j-th double-bit memory-unit, if the signal of the logical level of "0" stored in the preceding rear-stage cell $Mr_{i(j-1)}$ of the (j−1)-th double-bit memory-unit is entered to the input terminal of the front-stage cell $M_{ij}$ of the j-th double-bit memory-unit.

Signal Hold Between the Times "$t_1$" and "$t_4$"

Next, as illustrated in FIG. 5A, with regard to the next front-stage cell $M_{i(j+1)}$, at a period between the times "$t_1$" and "$t_4$", as the first clock signal $CLK_1$ is sets to be low-level, and the low-level signal is applied to the gate electrode of the nMOS transistor $Q_{i(j+1)1}$ implementing the next coupling-element in the (j+1)-th double-bit memory-unit, a signal path from the output terminal assigned at the storage capacitor $Cr_{ij}$ of the rear-stage cell $Mr_{ij}$ to the input terminal of the next front-inverter $I_{i(j+1)}$ of the front-stage cell $M_{i(j+1)}$ is sets to be cut-off state.

The next coupling-element $Q_{i(j+1)1}$ maintains the cut-off state until the first clock signal $CLK_1$ becomes high-level at the time "$t_4$". Therefore, it is possible to prevent the signal stored in the storage capacitor $Cr_{ij}$ of the rear-stage cell $Mr_{ij}$ in the j-th double-bit memory-unit from being transferred unintentionally to the input terminal of the next front-inverter $I_{i(j+1)}$ in the (j+1)-th double-bit memory-unit. That is, the next front-inverter $I_{i(j+1)}$ maintains by itself the signal stored in the next storage capacitor $C_{i(j+1)}$ until the first clock signal $CLK_1$ becomes high-level at the time "$t_4$".

Marching of Byte/Word Size Signals in the 1$^{st}$ Embodiment

Turning back to FIGS. 3A, 3B and 3C, let's consider a case when the first clock signal $CLK_1$ illustrated in FIG. 6A becomes high-level, at time "$t_0$". That is, if the first clock signals $CLK_1$ at high-level are applied to the gate electrodes of nMOS transistors, each of which implementing the sequence of the coupling-elements $Q_{111}$, $Q_{211}$, $Q_{311}$, ..., $Q_{(m-1)11}$, $Q_{m11}$ in the first O-column $U_1$ illustrated in FIG. 3A, respectively, the coupling-elements $Q_{111}$, $Q_{211}$, $Q_{311}$, ..., $Q_{(m-1)11}$, $Q_{m11}$ will become conductive.

Thereafter, as illustrated in FIG. 6B, when a sequence of signals of byte size or word size, each of which is multiples of eight bits, such as 16, 32, and 64 bits are applied to the input terminals of the sequence of the front-inverters $I_{11}$, $I_{21}$, $I_{31}$, ..., $I_{(m-1)1}$, $I_{m1}$, respectively, the sequence of the front-inverters $I_{11}$, $I_{22}$, $I_{31}$, ..., $I_{(m-1)1}$, $I_{m1}$ invert the signals of byte size or word size respectively, as illustrated in FIG. 6C, lagging by the delay time Tau [Greek]$_{d1}$ determined by the storage capacitors $C_{11}$, $C_{21}$, $C_{31}$, ..., $C_{(m-1)1}$, $C_{m1}$ and stray resistances, respectively, and transfer the inverted signal to nodes at the storage capacitors $C_{11}$, $C_{21}$, $C_{31}$, ..., $C_{(m-1)1}$, $C_{m1}$ in the front-inverters $I_{11}$, $I_{21}$, $I_{31}$, ..., $I_{(m-1)1}$, $I_{m1}$, respectively.

Here, FIG. 6B is a waveform diagram illustrating an example of an ideal input signal of square wave entered to the input terminals of the front-inverters $I_{11}$, $I_{21}$, $I_{31}$, ..., $I_{(m-1)1}$, $I_{m1}$ of the first O-column $U_1$. FIG. 6C is a waveform diagram illustrating an example of the variation of the logical level of the storage capacitor $C_{i1}$. In the example of FIG. 6C, the ideal logical level at storage capacitor $C_{i1}$ is represented by a solid line, and the actual potential variation of the storage capacitor $C_{i1}$ is represented by a one-dot chain line.

(a) At time "$t_1$", that is, after a period of Tau [Greek]$_{clock}$/3, when the first clock signals $CLK_1$ become the low-level so that the low-level clock signals can be applied to the respective gate electrodes of the nMOS transistors implementing a sequence of the coupling-elements $Q_{111}$, $Q_{211}$, $Q_{311}$, ..., $Q_{(m-1)11}$, $Q_{m11}$ in the first O-column $U_1$, the coupling-elements $Q_{111}$, $Q_{211}$, $Q_{311}$, ..., $Q_{(m-1)11}$, $Q_{m11}$ become cut-off state, respectively. Therefore, as illustrated in FIGS. 6B and 6C, even if the signals entering the first main-electrodes of the sequence of the coupling-elements $Q_{111}$, $Q_{211}$, $Q_{311}$, ..., $Q_{(m-1)11}$, $Q_{m11}$ change, the charges or the logical levels of the signals already stored in the storage capacitors $C_{11}$, $C_{21}$, $C_{31}$, ..., $C_{(m-1)1}$, $C_{m1}$ are maintained respectively.

(b) And, when time elapses to "$t_2$", that is, after a period of Tau [Greek]$_{clock}$/2, as the second clock signal $CLK_2$ becomes high-level, the high-level clock signals are applied to the respective gate electrodes of the nMOS transistors implementing the sequence of the buffer-elements $Qr_{111}$, $Qr_{211}$, $Qr_{311}$, ..., $Qr_{(m-1)11}$, $Qr_{m11}$ in the first E-column $Ur_1$ illustrated in FIG. 3A so that the buffer-elements $Qr_{111}$, $Qr_{211}$, $Qr_{311}$, ..., $Qr_{(m-1)11}$, $Qr_{m11}$ can transfer the sequence of signals of byte size or word size stored temporary in the storage capacitors $C_{11}$, $C_{21}$, $C_{31}$, ..., $C_{(m-1)1}$, $C_{m1}$ to the input terminals of the respective rear-inverters $Ir_{11}$, $Ir_{21}$, $Ir_{31}$, ..., $Ir_{(m-1)1}$, $Ir_{m1}$ of the rear-stage cell $Mr_{11}$, $Mr_{21}$, $Mr_{31}$, ..., $Mr_{(m-1)1}$, $Mr_{m1}$ in the first E-column $Ur_1$ illustrated in FIG. 3A.

When the signals stored temporary in the storage capacitors $C_{11}$, $C_{21}$, $C_{31}$, ..., $C_{(m-1)1}$, $C_{m1}$ of the front-stage cells $M_{11}$, $M_{21}$, $M_{31}$, ..., $M_{(m-1)1}$, $M_{m1}$ are transferred respectively to the input terminal of the rear-inverters $Ir_{11}$, $Ir_{21}$, $Ir_{31}$, ..., $Ir_{(m-1)1}$, $Ir_{m1}$ of the rear-stage cell $Mr_{11}$, $Mr_{21}$, $Mr_{31}$, ..., $Mr_{(m-1)1}$, $Mr_{m1}$, the rear-inverters $Ir_{11}$, $Ir_{21}$, $Ir_{31}$, ..., $Ir_{(m-1)1}$, $Ir_{m1}$ invert respectively the signals stored temporary in the storage capacitors $C_{11}$, $C_{21}$, $C_{31}$, ..., $C_{(m-1)1}$, $C_{m1}$ of the front-stage cells $M_{11}$, $M_{21}$, $M_{31}$, ..., $M_{(m-1)1}$, $M_{m1}$ lagging by delay time Tau $[\text{Greek}]_{d2}$, as illustrated in FIG. 6D. The delay time Tau $[\text{Greek}]_{d2}$ is determined by the storage capacitors $Cr_{11}$, $Cr_{21}$, $Cr_{31}$, ..., $Cr_{(m-1)1}$, $Cr_{m1}$ and stray resistances, respectively.

Here, FIG. 6D is a waveform diagram illustrating an example of the logical level of the storage capacitor $Cr_{j1}$. In the example of FIG. 6D, the ideal logical level at storage capacitor $Cr_{i1}$ is represented by a solid line, and the actual potential variation of the storage capacitor $Cr_{i1}$ is represented by a one-dot chain line.

(c) At time "$t_3$", that is, after a period of $5\text{Tau } [\text{Greek}]_{clock}/6$, the second clock signal $CLK_2$ becomes the low-level, then the low-level clock signals are applied respectively to the gate electrodes of nMOS transistors implementing the sequence of the buffer-elements $Qr_{111}$, $Qr_{211}$, $Qr_{311}$, ..., $Qr_{(m-1)11}$, $Qr_{m11}$, and the signal paths from the input terminal INs of the buffer-elements $Qr_{111}$, $Qr_{211}$, $Qr_{311}$, ..., $Qr_{(m-1)11}$, $Qr_{m11}$ to the input terminal INs of the rear-inverters $Ir_{11}$, $Ir_{21}$, $Ir_{31}$, ..., $Ir_{(m-1)1}$ become cut-off state. Therefore, as illustrated in FIGS. 6C and 6D, even if the signals of byte size or word size stored in the preceding storage capacitors $C_{11}$, $C_{21}$, $C_{31}$, ..., $C_{(m-1)1}$, $C_{m1}$ change, the charges already stored in the storage capacitors $Cr_{11}$, $Cr_{21}$, $Cr_{31}$, ..., $Cr_{(m-1)1}$, $Cr_{m1}$, which define the logical levels of the signals, are maintained until the second clock signal $CLK_2$ becomes the high-level at time "$t_6$".

(d) At time "$t_4$", that is, after a period of Tau $[\text{Greek}]_{clock}$, as the first clock signal $CLK_1$ becomes high-level, the high-level clock signals are applied to the respective gate electrodes of the sequence of the coupling-elements $Q_{121}$, $Q_{221}$, $Q_{321}$, ..., $Q_{(m-1)21}$, $Q_{m21}$ in the second O-column $U_2$ illustrated in FIG. 3B, and the coupling-elements $Q_{121}$, $Q_{221}$, $Q_{321}$, ..., $Q_{(m-1)21}$, $Q_{m21}$ becomes conductive.

Thereafter, when a sequence of signals of byte size or word size provided by preceding storage capacitors $Cr_{11}$, $Cr_{21}$, $Cr_{31}$, ..., $Cr_{(m-1)1}$, $Cr_{m1}$ in the first E-column $Ur_1$ illustrated in FIG. 3A are entered to the first main-electrodes of the sequence of the coupling-elements $Q_{121}$, $Q_{221}$, $Q_{321}$, ..., $Q_{(m-1)21}$, $Q_{m21}$ in the second O-column $U_2$, the sequence of the coupling elements $Q_{121}$, $Q_{221}$, $Q_{321}$, ..., $Q_{(m-1)21}$, $Q_{m21}$ invert the signals of byte size or word size, as illustrated in FIG. 6E, lagging by the delay time. Tau $[\text{Greek}]_{d1}$ determined by the storage capacitors $C_{12}$, $C_{22}$, $C_{32}$, ..., $C_{(m-1)2}$, $C_{m2}$ and stray resistances, and transfer the inverted signal to nodes at the storage capacitors $C_{12}$, $C_{22}$, $C_{32}$, ..., $C_{(m-1)2}$, $C_{m2}$ in the front-inverters $I_{12}$, $I_{22}$, $I_{32}$, ..., $I_{(m-1)2}$, $I_{m2}$ in the second O-column $U_2$.

Here, FIG. 6E is a waveform diagram illustrating an example of the logical level of the storage capacitor $C_{i2}$ of the second O-column $U_2$. In the example of FIG. 6E, the logical level of storage capacitors $C_{i2}$ is represented by a solid line, and the actual potential variation of the storage capacitors $C_{i2}$ is represented by a one-dot chain line.

(e) At time "$t_5$", that is, after a period of $4\text{Tau } [\text{Greek}]_{clock}/3$, as the first clock signal $CLK_1$ becomes low-level, the low-level clock signals are applied to the respective gate electrodes of the sequence of the coupling-elements $Q_{121}$, $Q_{221}$, $Q_{321}$, ..., $Q_{(m-1)21}$, $Q_{m21}$ in the second O-column $U_2$, and the coupling-elements $Q_{121}$, $Q_{221}$, $Q_{321}$, ..., $Q_{(m-1)21}$, $Q_{m21}$ become cut-off state. Therefore, as illustrated in FIGS. 7D and 7E, even if the signal of byte size or word size stored in the storage capacitors $Cr_{11}$, $Cr_{21}$, $Cr_{31}$, ..., $Cr_{(m-1)1}$, $Cr_{m1}$ in the first E-column $Ur_1$ changes, the charges defining the logical levels of the signals, which are already stored temporary in the storage capacitors $C_{12}$, $C_{22}$, $C_{32}$, ..., $C_{(m-1)2}$, $C_{m2}$ in the second O-column $U_2$ are maintained.

(f) And, at time "$t_6$", that is, after a period of $3\text{Tau } [\text{Greek}]_{clock}/2$, as the second clock signal $CLK_2$ becomes high-level, the high-level clock signals are applied to the respective gate electrodes of the sequence of the buffer-elements $Qr_{121}$, $Qr_{221}$, $Qr_{321}$, ..., $Qr_{(m-1)21}$, $Qr_{m21}$ in the second E-column $Ur_2$ illustrated in FIG. 3B, and the buffer-elements $Qr_{121}$, $Qr_{221}$, $Qr_{321}$, ..., $Qr_{(m-1)21}$, $Qr_{m21}$ becomes conductive. Thereafter, as illustrated in FIG. 6E, when a sequence of signals of byte size or word size stored in the preceding storage capacitors $C_{12}$, $C_{22}$, $C_{32}$, ..., $C_{(m-1)2}$, $C_{m2}$ in the second O-column $U_2$ are entered to the first main-electrodes of the sequence of the buffer-elements $Qr_{121}$, $Qr_{221}$, $Qr_{321}$, ..., $Qr_{(m-1)21}$, $Qr_{m21}$ in the second E-column $Ur_2$, the sequence of the buffer-elements $Qr_{121}$, $Qr_{221}$, $Qr_{321}$, ..., $Qr_{(m-1)21}$, $Qr_{m21}$ invert the signals of byte size or word size, as illustrated in FIG. 6F, lagging by delay time Tau $[\text{Greek}]_{d2}$, which are determined by the storage capacitors $Cr_{12}$, $Cr_{22}$, $Cr_{32}$, ..., $Cr_{(m-1)2}$, $Cr_{m2}$ and stray resistances, and transfer the inverted signal to nodes at the storage capacitors $Cr_{12}$, $Cr_{22}$, $Cr_{32}$, ..., $Cr_{(m-1)2}$, $Cr_{m2}$ in the second E-column $Ur_2$.

Then, the signals entered to the first main-electrodes of the coupling-elements $Q_{111}$, $Q_{211}$, $Q_{311}$, ..., $Q_{(m-1)11}$, $Q_{m11}$ of the first O-column $U_1$ are transferred to a node at the storage capacitors $Cr_{12}$, $Cr_{22}$, $Cr_{32}$, ..., $Cr_{(m-1)2}$, $Cr_{m2}$ in the second E-column $Ur_2$. Here, FIG. 6F is a waveform diagram illustrating an example of the logical level of the storage capacitor $Cr_{i2}$ in the second E-column $Ur_2$. In the example of FIG. 6F, the ideal logical level at storage capacitor $Cr_{i2}$ is represented by a solid line, and the actual potential variation of the storage capacitor $Cr_{i2}$ is represented by a one-dot chain line.

(g) And, at time "$t_7$", that is, after a period of $11\text{Tau } [\text{Greek}]_{clock}/6$, as the second clock signal $CLK_2$ becomes low-level, the low-level clock signals are applied to the respective gate electrodes of the sequence of the buffer-elements $Qr_{121}$, $Qr_{221}$, $Qr_{321}$, ..., $Qr_{(m-1)21}$, $Qr_{m21}$ in the second E-column $Ur_2$ illustrated in FIG. 3B, and the buffer-elements $Qr_{121}$, $Qr_{221}$, $Qr_{321}$, ..., $Qr_{(m-1)21}$, $Qr_{m21}$ become cut-off state. Thereafter, as illustrated in FIG. 6E and FIG. 6F, even if the signal of byte size or word size stored in the preceding storage capacitors $C_{12}$, $C_{22}$, $C_{32}$, ..., $C_{(m-1)2}$, $C_{m2}$ in the second O-column $U_2$ changes, the charges defining the logical levels of the signals, which are already stored in the storage capacitors $Cr_{12}$, $Cr_{22}$, $Cr_{32}$, ..., $Cr_{(m-1)2}$, $Cr_{m2}$ in the second E-column $Ur_2$ illustrated in FIG. 3B are maintained.

Waveform Shaping in the 1st Embodiment

Suppose that, as the signal of logical level "1" sent from the (j−1)-th rear-stage cell $Mr_{i(j-1)}$ on the i-th row, a potential of 0.7 volt, for example, which is slightly larger than the threshold voltage $V_{th}$ of 0.4 volt for the nMOS transistor $Q_{ij3}$ of the j-th front-stage cell $M_{ij}$ on the i-th row is applied to the input terminal of the front-inverter $I_{ij}$ via coupling-element (nMOS transistor) $Q_{ij1}$ in the configuration of the MM according to the first embodiment. As the potential of 0.7 volt is applied to the gate electrode of the nMOS transistor $Q_{ij3}$, the nMOS transistor $Q_{ij3}$ becomes conductive so that the electric charge of the signal stored in the storage capacitor $C_{ij}$ can be discharged, and then, the signal charge stored in the storage capacitor $C_{ij}$ becomes the logical level of "0" (=zero volt).

Then, a signal of logical level "0" is transferred to the gate electrode of the pMOS transistor $Qr_{ij2}$ of the j-th rear-stage cell $Mr_{ij}$ on the i-th row, and the pMOS transistor $Qr_{ij2}$ becomes conductive. Here, the pMOS transistor $Qr_{ij2}$ causes a voltage drop in the supply voltage (=one volt), which is applied to the first main-electrode of the pMOS transistor $Qr_{ij2}$, and the inter-electrode potential of the storage capacitor $Cr_{ij}$ becomes a reduced voltage (=0.7 volt) due to the voltage drop of the pMOS transistor $Qr_{ij2}$, and the signal of logical level "1" is stored in the storage capacitor $Cr_{ij}$.

Then, the potential (=0.7 volt) of logical level "1" sent from the j-th rear-stage cell $Mr_{ij}$ to the first main-electrode of the nMOS transistor $Q_{i(j+1)3}$ of the (j+1)-th front-stage cell $M_{i(j+1)}$ becomes equal to the potential (=0.7 volt) of the signal sent from the (j−1)-th rear-stage cell $Mr_{i(j-1)}$. Therefore, when passing through a plurality of stages of front-stage cells, the signal levels applied to the gate electrodes of the respective nMOS transistors are not attenuated, and it is possible to prevent the signal levels from becoming smaller than the threshold voltage $V_{th}$ of the respective nMOS transistors. As a result, the stored information can be properly transferred to the subsequent front-stage cell.

Maximized Data-Packing Density in Double-Bit Memory-Units

As stated above, in the MM according to the first embodiment, because each of double-bit memory-units includes the O-column and the E-column such that each of the double-bit memory-units shapes the attenuated input waveforms to recover the original pulse-height, even operating at lower supply voltages, by amplifying the attenuated pulse-height of the input signals of "1" to the voltage level of the supply voltage through the combined operations of the O-column and the E-column, the accurate marching transferring of stored information of byte size or word size, even with lower supply voltages, can be achieved.

Here, because each of the front-stage cell in the O-column and the rear-stage cell in the E-column can serve as an active independent bit-level cell, respectively, so that the successive two bit-level data in a data stream can be shared by the O-column and the E-column in the double-bit memory-unit, the data-packing density can be maximized, and therefore, the memory capacity of the MM according to the first embodiment can be increased.

The behavior such that the successive two bit-level data in a data stream can be shared by the O-column and the E-column in the double-bit memory-unit is distinuishable from the performance of the master-slave flip-flop chain. Because the master-slave flip-flop chain is implemented by the first stage flip-flop (the master), consists of two inverters and the second stage flip-flop (the slave) connected the first stage flip-flop, the master-slave flip-flop chain can store only a single bit-level data in the two stage flip-flops.

In the master-slave flip-flop chain, when the clock goes high, and the input is transmitted to the first stage, and the output of the second stage (the slave) does not change. When the clock goes low again, the second stage is set to the same state as the first stage, changing the output of the second stage. Therefore, the double-bit memory-units including the O-column and the E-column of the first embodiment can archive the double data-packing density of the master-slave flip-flop chain.

Other Effectiveness of the 1st Embodiment

And, furthermore, according to the MM computer system pertaining to the first embodiment, because the MM actively and sequentially sends information of byte size or word size in units to the processor 11, the processor 11 can execute the arithmetic and logic operation at an extremely high speed, using the units of information that are sequentially transferred.

Because the random access to individual front-stage cells, which is employed in the conventional memories such as SRAM or DRAM, is not required, the bottlenecks between the processor chip and the conventional memory chip or the conventional cache memory chip can be removed. Therefore, it is possible to provide a computer system capable of achieving extremely high-speed operation with extremely low power consumption, which operates with lower supply voltages.

Second Embodiment: Quadruple-TR Cell Scheme

In the configuration illustrated in FIGS. 4A and 4B, a Domino-transport isolation between a signal-storage state of the (j−1)-th rear-stage cell $Mr_{i(j-1)}$ on the i-th row and a signal-storage state of the j-th front-stage cell $M_{ij}$ on the i-th row can be established by the coupling-element implemented by a single nMOS transistor $Q_{ij1}$ in the j-th front-stage cell $M_{ij}$ on the i-th row so as to establish a triple-transistors bit-level cell.

And, the Domino-transport isolation between a signal-storage state of the j-th front-stage cell $M_{ij}$ on the i-th row and a signal-storage state of the j-th rear-stage cell $Mr_{ij}$ on the i-th row can be established by the buffer-element implemented by a single nMOS transistor $Qr_{ij1}$ in the j-th rear-stage cell $Mr_{ij}$ on the i-th row so as to establish another triple-transistors bit-level cell.

However in a MM according to a second embodiment, as illustrated in FIG. 7A, each of the coupling-element and the buffer-element may be implemented by two pass transistors so as to establish a CMOS transmission gate, respectively. That is, a coupling-element ($Q_{ij1}$, $Q_{ij4}$) in the j-th front-stage cell $M_{ij}$ on the i-th row encompasses an nMOS transistor $Q_{ij1}$ and a pMOS transistor $Q_{ij4}$ so as to implement a front-transmission gate ($Q_{ij1}$, $Q_{ij4}$). And a buffer-element ($Qr_{ij1}$, $Qr_{ij4}$) in the j-th rear-stage cell $Mr_{ij}$ on the i-th row encompasses an nMOS transistor $Qr_{ij1}$ and a pMOS transistor $Qr_{ij4}$ so as to implement a rear-transmission gate ($Qr_{ij1}$, $Qr_{ij4}$).

Then, as illustrated in FIG. 7A, the front-stage cell $M_{ij}$ implements a quadruple-transistors bit-level cell with the front-transmission gate ($Q_{ij1}$, $Q_{ij4}$) and a front-inverter $I_{ij}$. Similarly, the rear-stage cell $Mr_{ij}$ implements a quadruple-transistors bit-level cell with the rear-transmission gate ($Qr_{ij1}$, $Qr_{ij4}$) and a rear-inverter $Ir_{ij}$.

In the MM according to the second embodiment, the nMOS transistor $Q_{ij1}$ in the coupling-element ($Q_{ij1}$, $Q_{ij4}$) has a first main-electrode connected to the output terminal of the preceding rear-stage cell $Mr_{i(j-1)}$, a second main-electrode connected to the input terminal of the front-inverter $I_{ij}$ of the front-stage cell $M_{ij}$, and a gate electrode connected to the first clock-line $L_{clk1}$. Although the illustration is omitted in FIG. 7A, the rear-stage cell $Mr_{i(j-1)}$ is one of the rear-stage cells $Mr_{1(j-1)}$, $Mr_{2(j-1)}$, $Mr_{3(j-1)}$, ..., $Mr_{(m-1)(j-1)}$, $Mr_{m(j-1)}$ allocated to the E-column $Ur_{(j-1)}$ illustrated in FIG. 3A to 3C. The E-column $Ur_{(j-1)}$ is arranged adjacent to the input side of the array of the O-column $U_1$, $U_2$, $U_3$, ..., $U_{n-1}$, $U_n$ illustrated in FIG. 2.

And the pMOS transistor $Q_{ij4}$ in the coupling-element ($Q_{ij1}$, $Q_{ij4}$) has a first main-electrode connected to the output terminal of the preceding rear-stage cell $Mr_{i(j-1)}$, a second main-electrode connected to the input terminal of the front-inverter $I_{ij}$ of the front-stage cell $M_{ij}$, and a gate electrode connected to the second clock-line $L_{clk2}$. In contrast to traditional discrete MOS transistors, the substrate terminals (bulk) of the nMOS transistor $Q_{ij1}$ and the pMOS transistor $Q_{ij4}$ are not connected internally to the respective first main-electrodes, and only the first and second main-electrodes of the nMOS transistor $Q_{ij1}$ and the pMOS transistor $Q_{ij4}$, are connected in parallel.

As illustrated in FIG. 7B, each of the first clock signal CLK and the second clock signal CLK(bar) periodically swings between the high-level and the low-level with a clock cycle Tau [Greek]$_{clock}$ such that the first clock signal CLK and the second clock signal CLK(bar) are Tau [Greek]$_{clock}$/2 apart temporary from each other. As a CMOS transmission gate, the coupling-element ($Q_{ij1}$, $Q_{ij4}$) is implemented by the pMOS transistor $Q_{ij4}$ and the nMOS transistor $Q_{ij1}$. Because the second clock signal CLK(bar) is the inverted signal of the first clock signal CLK, the control terminals of the coupling-element ($Q_{ij1}$, $Q_{ij4}$) are biased in a complementary manner through the first clock signal CLK and the second clock signal CLK(bar) so that the pMOS transistor $Q_{ij4}$ and the nMOS transistor $Q_{ij1}$ are either on or off.

Similar to the waveforms illustrated in FIG. 5A, the first clock signal CLK and the second clock signal CLK(bar) swing quasi-complementary in a mode such that the second clock signal CLK(bar) rises after a period of Tau [Greek]$_{clock}$/6 from the falling edge of the first clock signal CLK and falls before the period of Tau [Greek]$_{clock}$/6 from the rising edge of the first clock signal CLK. Here, the clock cycle Tau [Greek]$_{clock}$ of the first clock signal CLK and the second clock signal CLK(bar) illustrated in FIG. 7B is same as the clock cycle controlling the arithmetic and logic operations in the ALU 112.

Then, when the first clock signal CLK is at high-level, while the second clock signal CLK(bar) is low-level, and when the first main-electrode of the nMOS transistor $Q_{ij1}$ connected to the output terminal of the preceding rear-stage cell $Mr_{i(j-1)}$ is a logic "0", a positive gate-source voltage (or gate-to-drain voltage) will occur at the nMOS transistor $Q_{ij1}$, and the nMOS transistor $Q_{ij1}$ begins to conduct, and the front-transmission gate ($Q_{ij1}$, $Q_{ij4}$) conducts.

When the first main-electrode connected to the output terminal of the preceding rear-stage cell $Mr_{i(j-1)}$ is now raised continuously up to a logic "1", so the gate-source voltage is reduced (or gate-drain voltage) on the nMOS transistor $Q_{ij1}$, and the nMOS transistor $Q_{ij1}$ begins to turn off. At the same time, the pMOS transistor $Q_{ij4}$ has a negative gate-source voltage (or gate-to-drain voltage) builds up, whereby pMOS transistor $Q_{ij4}$ transistor starts to conduct and the front-transmission gate ($Q_{ij1}$, $Q_{ij4}$) switches such that the pMOS transistor passes a strong "1" but poor "0", and nMOS transistor $Q_{ij1}$ passes strong "0" but poor "1", although both pMOS transistor $Q_{ij4}$ and nMOS transistor $Q_{ij1}$ work simultaneously.

Thereby it is achieved that the front-transmission gate ($Q_{ij1}$, $Q_{ij4}$) passes over the entire voltage range, independent on their threshold voltages, so that the coupling-element ($Q_{ij1}$, $Q_{ij4}$) can control transferring the signal from an output terminal of the adjacent rear-stage cell $Mr_{i(j-1)}$ allocated in the E-column $Ur_{(j-1)}$ arranged adjacent to an input side of the O-column $U_j$, and the stray voltage drop in the coupling-element ($Q_{ij1}$, $Q_{ij4}$) can be minimized. Then, the Domino transport of the signal, which is stored in the storage capacitor $Cr_{i(j-1)}$ of the (j-1)-th rear-stage cell $Mr_{i(j-1)}$, toward the input terminal of the front-inverter $I_{ij}$ of the front-stage cell $M_{ij}$, is protected.

Namely, in the MM according to the second embodiment, the coupling-element ($Q_{ij1}$, $Q_{ij4}$) is provided so as to isolate the signal-storage state of the j-th front-stage cell $M_{ij}$ from the signal-storage state of the (j-1)-th rear-stage cell $Mr_{i(j-1)}$, of the preceding double-bit memory-unit, similarly to the coupling-element $Q_{ij1}$ stated in the first embodiment. When the first clock signal CLK supplied from the first clock-line $L_{clk1}$ becomes high-level, simultaneously with the timing when the second clock signal CLK(bar) supplied from the second clock-line $L_{clk2}$ becomes low-level, the signal path from the output terminal of the (j-1)-th rear-stage cell $Mr_{i(j-1)}$ to the input terminal of the front-inverter $I_{ij}$ of the j-th front-stage cell $M_{ij}$ becomes conductive.

Similar to the first embodiment, the front-inverter $I_{ij}$ is implemented by a CMOS inverter encompassing a pMOS transistor $Q_{ij2}$, which has a first main-electrode connected to a power-supply line $L_{sv}$, and a gate electrode connected to the second main-electrode of the coupling-element $Q_{ij1}$, and an nMOS transistor $Q_{ij3}$, which has a first main-electrode connected to a second main-electrode of the pMOS transistor $Q_{ij2}$, a gate electrode connected to the second main-electrode of the coupling-element $Q_{ij1}$, and a second main-electrode connected to a ground potential. To the output terminal of the front-inverter $I_{ij}$, a storage capacitor $C_{ij}$ assigned in the front-inverter $I_{ij}$ is connected in parallel with the nMOS transistor $Q_{ij3}$. And an output node connecting the second main-electrode of the pMOS transistor $Q_{ij2}$ and the first main-electrode of the nMOS transistor $Q_{ij3}$ serves as an internal output terminal of the front-stage cell $M_{ij}$.

The internal output terminal of the front-stage cell $M_{ij}$ delivers the signal stored in the storage capacitor $C_{ij}$ to the rear-stage cell $Mr_{ij}$. That is, the front-inverter $I_{ij}$ inverts the signal transferred through the coupling-element $Q_{ij1}$, and transfers further the inverted signal to the E-column $Ur_j$ arranged adjacent to an output side of the front-stage cell $M_{ij}$. And the front-stage storage capacitor $C_{ij}$ stores the inverted signal. The rear-stage cell $Mr_{ij}$ includes the buffer-element ($Qr_{ij1}$, $Qr_{ij4}$) encompassing the nMOS transistor $Qr_{ij1}$ and the pMOS transistor $Qr_{ij4}$, implementing the rear-transmission gate ($Qr_{ij1}$, $Qr_{ij4}$).

Similar to the front-transmission gate ($Q_{ij1}$, $Q_{ij4}$), the pMOS transistor $Qr_{ij4}$ in the buffer-element ($Qr_{ij1}$, $Qr_{ij4}$) has a first main-electrode connected to the output terminal of the front-stage cell $M_{ij}$, a second main-electrode connected to the input terminal of the rear-inverter $Ir_{ij}$ of the rear-stage cell $Mr_{ij}$, and a gate electrode connected to the first signal supply line $L_{clk1}$.

The nMOS transistor $Qr_{ij1}$ in the buffer-element ($Qr_{ij1}$, $Qr_{ij4}$) has a first main-electrode connected to the output terminal of the front-stage cell $M_{ij}$, a second main-electrode connected to the input terminal of the rear-inverter Ir$_{ij}$ of the rear-stage cell Mr$_{ij}$, and a gate electrode connected to the second signal supply line L$_{clk2}$. The substrate terminals (bulk) of the nMOS transistor Qr$_{ij1}$ and the pMOS transistor Qr$_{ij4}$, are not connected internally to the first main-electrodes, and only the first and second main-electrodes of the nMOS transistor Qr$_{ij1}$ and the pMOS transistor Qr$_{ij4}$, are connected in parallel.

Because the second clock signal CLK(bar) is the inverted signal of the first clock signal CLK, as the CMOS transmission gate, the control terminals of the buffer-element (Qr$_{ij1}$, Qr$_{ij4}$) are biased in the complementary manner through the first clock signal CLK and the second clock signal CLK(bar) so that the pMOS transistor Qr$_{ij4}$ and the nMOS transistor Qr$_{ij1}$ are either on or off.

When the voltage on the first control terminal is high-level, the complementary low-level signal is applied to the second control terminal, allowing the pMOS transistor Qr$_{ij4}$ and the nMOS transistor Qr$_{ij1}$ to conduct and pass the signal at the input terminal to the output terminal. When the voltage on the first control terminal is low-level, the complementary high-level signal is applied to the second control terminal, turning the pMOS transistor Qr$_{ij4}$ and the nMOS transistor Qr$_{ij1}$ off and forcing a high-impedance condition on both the input and output terminals.

Then, the buffer-element (Qr$_{ij1}$, Qr$_{ij4}$) controls transferring the signal from an output terminal of the adjacent front-stage cell M$_{ij}$ allocated in the O-column U$_j$ arranged adjacent to an input side of the E-column Ur$_j$. Because the first clock signal CLK and the second clock signal CLK(bar) swing periodically in the quasi-complementary mode as illustrated in FIG. 7B, the coupling-element (Q$_{ij1}$, Q$_{ij4}$) and the buffer-element (Qr$_{ij1}$, Qr$_{ij4}$) operate quasi-complementary such that when the coupling-element (Q$_{ij1}$, Q$_{ij4}$) is conductive state, the buffer-element (Qr$_{ij1}$, Qr$_{ij4}$) is cut-off state, and vice versa. Therefore, the Domino transportation of the signal from the storage capacitor C$_{ij}$ of the front-inverter I$_{ij}$ to the rear-inverter Ir$_{ij}$ is prevented.

On the other hand, when the first clock signal CLK supplied from the first clock-line L$_{clk1}$ becomes high-level, simultaneously with the timing when the second clock signal CLK(bar) supplied from the second clock-line L$_{clk2}$ becomes low-level, the signal path from the output terminal of the j-th front-stage cell M$_{ij}$ to the input terminal of the rear-inverter Ir$_{ij}$ of the j-th rear-stage cell Mr$_{ij}$ becomes cut-off state by the buffer-element (Qr$_{ij1}$, Qr$_{ij4}$).

Then, the Domino transport of the signal, which is stored in the storage capacitor C$_{ij}$ of the front-stage cell M$_{ij}$, toward the input terminal of the rear-inverter Ir$_{ij}$ of the rear-stage cell Mr$_{ij}$, is protected by the buffer-element (Qr$_{ij1}$, Qr$_{ij4}$), while the signal stored in the storage capacitor C$_{ij}$ of the j-th front-stage cell M$_{ij}$ is transferred to the input terminal of the rear-inverter Ir$_{ij}$ of the rear-stage cell Mr$_{ij}$. And the stray voltage drop in the buffer-element (Qr$_{ij1}$, Qr$_{ij4}$) can be minimized. The stray voltage drop is ascribable to the threshold voltages of the pMOS transistor Qr$_{ij4}$ and the nMOS transistor Qr$_{ij1}$.

The rear-inverter Ir$_{ij}$ has an input terminal connected to a output terminal of the rear-transmission gate (Qr$_{ij1}$, Qr$_{ij4}$). The rear-inverter Ir$_{ij}$ is implemented by a CMOS inverter encompassing a pMOS transistor Qr$_{ij2}$ having a first main-electrode connected to a power-supply line L$_{sv}$ and a gate electrode connected to the second main-electrode of the buffer-element Qr$_{ij1}$, and an nMOS transistor Qr$_{ij3}$ having a first main-electrode connected to a second main-electrode of the pMOS transistor Qr$_{ij2}$, a gate electrode connected to the second main-electrode of the buffer-element Qr$_{ij1}$, and a second main-electrode connected to a ground potential. To the output terminal of the rear-inverter Ir$_{ij}$, the storage capacitor Cr$_{ij}$ assigned in the rear-inverter Ir$_{ij}$ is connected in parallel with the nMOS transistor Qr$_{ij3}$.

And an output node connecting the second main-electrode of the pMOS transistor Qr$_{ij2}$ and the first main-electrode of the nMOS transistor Qr$_{ij3}$ serves as an output terminal of the rear-stage cell Mr$_{ij}$. The output terminal of the rear-stage cell Mr$_{ij}$ delivers the signal stored in the storage capacitor Cr$_{ij}$ to the next front-stage cell M$_{i(j+1)}$. That is, the rear-inverter Ir$_{ij}$ re-inverts the inverted signal transferred from the front-stage cell M$_{ij}$ arranged in the same row, and transfers further the re-inverted signal to the O-column U$_{(j+1)}$ arranged adjacent to an output side of the rear-stage cell Mr$_{ij}$. And, the storage capacitor Cr$_{ij}$ stores the re-inverted signal.

Then, in accordance with the first clock signal CLK and the second clock signal CLK(bar), the signal stored in the storage capacitor Cr$_{i(j-1)}$ of the (j-1)-th rear-stage cell Mr$_{i(j-1)}$ can be transferred to a node at the storage capacitor Cr$_{ij}$ of the rear-stage cell Mr$_{ij}$.

Furthermore, similar to the first embodiment, because CMOS inverters of the front-inverter I$_{ij}$ and the rear-inverter Ir$_{ij}$ switches respectively the nMOS transistor Q$_{ij1}$, Qr$_{ij1}$ and the pMOS transistor Q$_{ij4}$, Qr$_{ij4}$ so that each of the outputs of the front-stage cell M$_{ij}$ and the rear-stage cell Mr$_{ij}$ can connect to the potential of the power-supply line L$_{sv}$, signal voltage levels in a sequential chain do not decrease.

Therefore, according to the MM pertaining to the second embodiment, the accurate marching transferring of stored information of byte size or word size, with lower supply voltages, can be achieved.

Third Embodiment: 2.5-TR Cell Scheme)

Comparative Example

In the configuration illustrated in FIGS. 4A and 4B, the j-th front-stage cell M$_{ij}$ on the i-th row has the front-inverter I$_{ij}$ implemented a single inverter. And, the j-th rear-stage cell Mr$_{ij}$ on the i-th row has the rear-inverter Ir$_{ij}$ implemented a single inverter.

However in a MM according to a comparative example of a third embodiment, as illustrated in FIG. 8, each of the front-stage cell and rear-stage cell may include two inverters so as to establish a quintuple-transistors bit-level cell. That is, the j-th front-stage cell M$_{ij}$ on the i-th row includes a second front-inverter I$_{ij2}$ between a first front-inverter I$_{ij1}$ and the storage capacitor C$_{ij}$. And the j-th rear-stage cell Mr$_{ij}$ on the i-th row includes a second rear-inverter Ir$_{ij2}$ between a first rear-inverter Ir$_{ij1}$ and the storage capacitor Cr$_{ij}$.

In the MM according to the comparative example of the third embodiment, the second front-inverter I$_{ij2}$ is implemented by a CMOS inverter encompassing a pMOS transistor Q$_{ij5}$ having a first main-electrode connected to a power-supply line L$_{sv}$ and a gate electrode connected to the output terminal of the front-inverter I$_{ij1}$, and an nMOS transistor Q$_{ij6}$ having a first main-electrode connected to a second main-electrode of the pMOS transistor Q$_{ij5}$, a gate electrode connected to the output terminal of the first front-inverter I$_{ij1}$, and a second main-electrode connected to a ground potential. The storage capacitor C$_{ij}$ is connected in parallel with the nMOS transistor Q$_{ij6}$.

And an output node connecting the second main-electrode of the pMOS transistor Q$_{ij5}$ and the first main-electrode of the nMOS transistor Q$_{ij6}$ serves as an internal output terminal of the front-stage cell M$_{ij}$. The internal output terminal of the front-stage cell M$_{ij}$ delivers the signal stored in the storage capacitor $C_{ij}$ to the rear-stage cell $Mr_{ij}$, which is arranged before the next front-stage cell $M_{i(j+1)}$.

The second rear-inverter $Ir_{ij2}$ is implemented by a CMOS inverter encompassing a pMOS transistor $Qr_{ij5}$ having a first main-electrode connected to the power-supply line $L_{sv}$ and a gate electrode connected to the output terminal of the first rear-inverter $Ir_{ij1}$, and an nMOS transistor $Qr_{ij6}$ having a first main-electrode connected to a second main-electrode of the pMOS transistor $Qr_{ij5}$, a gate electrode connected to the output terminal of the first rear-inverter $Ir_{ij1}$, and a second main-electrode connected to a ground potential.

The storage capacitor $Cr_{ij}$ is connected in parallel with the nMOS transistor $Qr_{ij6}$. And an output node connecting the second min-electrode of the pMOS transistor $Qr_{ij5}$ and the first main-electrode of the nMOS transistor $Qr_{ij6}$ serves as an internal output terminal of the rear-stage cell $Mr_{ij}$. The internal output terminal of the rear-stage cell $Mr_{ij}$ delivers the signal stored in the storage capacitor $Cr_{ij}$ to the front-stage cell $M_{i(j+1)}$ arranged before the next rear-stage cell $Mr_{i(j+1)}$.

Since the second front-inverter $I_{ij2}$ is inserted between the first front-inverter $I_{ij1}$ and the storage capacitor $C_{ij}$, the signal inverted by the first front-inverter $I_{ij1}$ is inverted again by the front-inverter $I_{ij2}$ and stored in the storage capacitor $C_{ij}$. That is, the same signal as the signal fed to the front-stage cell $M_{ij}$ is stored in the storage capacitor $C_{ij}$. Also, since the second rear-inverter $Ir_{ij2}$ is inserted between the first rear-inverter $Ir_{ij1}$ and the storage capacitor $Cr_{ij}$, the signal inverted by the first rear-inverter $Ir_{ij1}$ is inverted again by the second rear-inverter $Ir_{ij2}$ and stored in the storage capacitor $Cr_{ij}$. That is, the same signal as the signal fed to the rear stage cell $Mr_{ij}$ is stored in the storage capacitor $Cr_{ij}$.

Suppose that, as the signal of logical level "1" sent from the (j−1)-th rear-stage cell $Mr_{i(j−1)}$ on the i-th row, a potential of 0.7 volt, for example, which is slightly larger than the threshold voltage $V_{th}$ of 0.4 volt for the nMOS transistor $Q_{ij3}$ of the j-th front-stage cell $M_{ij}$ on the i-th row is applied to the input terminal of the first front-inverter $I_{ij1}$ via coupling-element (nMOS transistor) $Q_{ij1}$ in the configuration of the MM according to the comparative example. As the potential of 0.7 volt is applied to the gate electrode of the nMOS transistor $Q_{ij3}$, the nMOS transistor $Q_{ij3}$ becomes conductive, and then, the input terminal of the front-inverter $I_{ij2}$ becomes the logical level of "0" (=zero volt).

Then, a signal of logical level "0" is transferred to the input terminal of the second front-inverter $I_{ij2}$, and the pMOS transistor $Q_{ij5}$ becomes conductive. Here, the pMOS transistor $Q_{ij5}$ causes a voltage drop in the supply voltage (=one volt), which is applied to the first main-electrode of the pMOS transistor $Q_{ij5}$, and the inter-electrode potential of the storage capacitor $C_{ij}$ becomes a reduced voltage (=0.7 volt) due to the voltage drop of the pMOS transistor $Q_{ij5}$, and the signal of logical level "1" is stored in the storage capacitor $C_{ij}$. The same operation is performed also in the j-th rear-stage cell $Mr_{ij}$ on the i-th row.

Then, the potential (=0.7 volt) of logical level "1" sent from the j-th rear-stage cell $Mr_{ij}$ to the first main-electrode of the nMOS transistor $Q_{i(j+1)3}$ of the (j+1)-th front-stage cell $M_{i(j+1)}$ becomes equal to the potential (=0.7 volt) of the signal sent from the (j−1)-th rear-stage cell $Mr_{i(j+1)}$. Therefore, when passing through a plurality of stages of front-stage cells, the signal levels applied to the gate electrodes of the respective nMOS transistors are not attenuated, and it is possible to prevent the signal levels from becoming smaller than the threshold voltage $V_{th}$ of the respective nMOS transistors. As a result, the stored information can be properly transferred to the subsequent front-stage cell.

As stated above, in the MM according to the comparative example, each of double-bit memory-units includes the O-column and the E-column, each of the O-column and the E-column shapes the attenuated input waveforms to recover the original pulse-height, even operating at lower supply voltages, by amplifying the attenuated pulse-height of the input signals of "1" to the voltage level of the supply voltage, the accurate marching transferring of stored information of byte size or word size, even with lower supply voltages, can be achieved.

2.5-TR Cell of 3$^{rd}$ Embodiment

In the configuration illustrated in FIG. 8, the j-th front-stage cell $M_{ij}$ on the i-th row includes double front-inverters $I_{ij1}$, $I_{ij2}$ and the storage capacitor $C_{ij}$. And the j-th rear-stage cell $Mr_{ij}$ on the i-th row includes double rear-inverters $Ir_{ij1}$, $Ir_{ij2}$ and the storage capacitor $Cr_{ij}$. However in a MM according to a third embodiment, as illustrated in FIG. 9, each of the front-stage cell and rear-stage cell may include parasitic low-pass filter so as to divide the quintuple-transistors bit-level cell recited in the third embodiment, achieving a 2.5 transistors bit-level cell.

That is, the j-th front-stage cell $M_{ij}$ on the i-th row includes a parasitic low-pass filter $LPF_{ij}$ between the first front-inverter $I_{ij1}$ and the second front-inverter $I_{ij2}$. And the j-th rear-stage cell $Mr_{ij}$ on the i-th row includes a parasitic low-pass filter $LPFr_{ij}$ between Inverter $Ir_{ij1}$ and $Ir_{ij2}$.

In the MM according to the third embodiment, the parasitic low-pass filter $LPF_{ij}$ includes a stray resistor $Rlpf_{ij}$ having one end connected to the output terminal of the first front-inverter $I_{ij1}$ and the other end connected to the input terminal of the second front-inverter $I_{ij2}$, and a stray capacitor $Clpf_{ij}$ having one end connected between the stray resistor $Rlpf_{ij}$ and the second front-inverter $I_{ij2}$ and the other end connected to the grounded.

The parasitic low-pass filter $LPFr_{ij}$ includes a stray resistor $Rlpfr_{ij}$ having one end connected to the output terminal of the first rear-inverter $Ir_{ij1}$ and the other end connected to the input terminal of the second rear-inverter $Ir_{ij2}$, and a stray capacitor $Crlpf_{ij}$ having one end connected between the stray resistor $Rlpfr_{ij}$ and the rear-inverter $Ir_{ij2}$ and the other end connected to the grounded.

However, the stray resistor $Rlpf_{ij}$, the stray capacitor $Clpf_{ij}$, the stray resistor $Rlpfr_{ij}$ and the stray capacitor $Crlpf_{ij}$ illustrated in FIG. 9 may be realized by actual electronic components such as physical resistive elements, physical capacitive elements or the like so as to obtain larger value of resistance or capacitance. If a larger value of the physical capacitor $Crlpf_{ij}$ is required, as a capacitor dielectric film for the physical capacitor $Crlpf_{ij}$, dielectric films other than $SiO_2$ film may be used such as $Si_3N_4$ film, or an ONO film having a triple-layered structure including a silicon oxide film ($SiO_2$ film). Further, the capacitor dielectric film mays include an oxide containing at least one element selected from Sr, Al, Mg, Y, Hf, Zr, Ta, and Bi, or silicon nitride containing at least one element selected from the above-listed elements.

As illustrated in FIGS. 3A, 3B and 3C, the MM is implemented by Since the parasitic low-pass filter $LPF_{ij}$ is inserted between the first front-inverter $I_{ij1}$ and the second front-inverter $I_{ij2}$, even if the coupling-element $Q_{ij1}$ is switched to the cut-off state and the conductive state at high speed by the first clock signal CLK and high-frequency noise occurs at the output of the coupling-element $Q_{ij1}$, the high-frequency noise can be cut off by the parasitic low-pass filter LPF$_{ij}$, it is possible to prevent the second front-inverter I$_{ij2}$ from malfunctioning due to high frequency noise.

Also since the parasitic low-pass filter LPFr$_{ij}$ is inserted between the first rear-inverter Ir$_{ij1}$ and the second rear-inverter Ir$_{ij2}$, even if the coupling-element Qr$_{ij1}$ is switched to the cut-off state and the conductive state at high speed by the first clock signal CLK and high-frequency noise occurs at the output of the coupling-element Qr$_{ij1}$, the high-frequency noise can be cut off by the parasitic low-pass filter LPFr$_{ij}$, it is possible to prevent the rear-inverter Ir$_{ij2}$ from malfunctioning due to high frequency noise.

Furthermore, similar to the first and the second embodiments, because CMOS inverters of the front-inverter I$_{ij1}$, I$_{ij2}$ and the rear-inverter I$_{ij1}$, I$_{ij2}$ switches respectively the nMOS transistor Q$_{ij3}$, Q$_{ij6}$, Qr$_{ij3}$, Qr$_{ij6}$, and the pMOS transistor Q$_{ij2}$, Q$_{ij5}$, Qr$_{ij2}$, Qr$_{ij5}$ so that each of the outputs of the front-stage cell M$_{ij}$ and the reap-stage cell Mr$_{ij}$ can connect to the potential of the power-supply line L$_{sv}$, signal voltage levels in a sequential chain do not decrease.

Reverse Directional MM

Although FIG. 2 has illustrated the MM including the MMM31 which stores temporary and store the information of byte-size data, word-size data, byte-size instructions or word-size instructions in each of the O-columns U$_1$, U$_2$, U$_3$, . . . , U$_{n-1}$, U$_n$ and the E-columns Ur$_1$, Ur$_2$, Ur$_3$, . . . , Ur$_{(n-1)}$, Ur$_n$, sequentially transferring the information synchronously with the clock signals, step by step, from the input terminal INs toward the output terminals.

FIG. 10 illustrates reverse directional MM according to an additional embodiment of the present invention. As illustrated in FIG. 10, the reverse directional MM of the additional embodiment is implemented by m*2n matrix, which includes an array of O-columns U$_1$, U$_2$, U$_3$, . . . , U$_{n-1}$, U$_n$ and an array of E-columns Ur$_1$, Ur$_2$, Ur$_3$, . . . , Ur$_{n-1}$, Ur$_n$ that are inserted alternately between the adjacent O-columns U$_1$, U$_2$, U$_3$, . . . , U$_{n-1}$, U$_n$.

That is, E-columns Ur$_1$, Ur$_2$, Ur$_3$, . . . , Ur$_{n-1}$, Ur$_n$ are arranged at alternating periodic positions to O-columns U$_1$, U$_2$, U$_3$, . . . , U$_{n-1}$, U$_n$ along the direction of the stream. Through the O-columns U$_1$, U$_2$, U$_3$, . . . , U$_{n-1}$, U$_n$, the information is transferred synchronously with the first clock signal via E-columns Ur$_1$, Ur$_2$, Ur$_3$, . . . , Ur$_{(n-1)}$, Ur$_n$, step by step, from output terminal toward the input terminal as illustrated in FIG. 10. Here, "m" is an integer determined by byte size or word size. Although the choice of a byte size or word size is optional, when computer architecture is designed, byte size or word sizes are naturally multiples of eight bits, with 16, 32, and 64 bits being commonly used.

Namely, as illustrated in FIG. 10, the first E-column Ur$_1$ is allocated at the left side of m*2n matrix, and the first O-column U$_1$ is inserted between the first E-column Ur$_1$ and the second O-column U$_2$. The combination of the first O-column U$_1$ and the first E-column Ur$_1$ implements a first double-bit memory-unit.

And, as illustrated in FIG. 10, the second E-column Ur$_2$ is inserted between the second O-column U$_2$ and the third O-column U$_3$. The combination of the second O-column U$_2$ and the second E-column Ur$_2$ implements a second double-bit memory-unit. Similarly, the third E-column Ur$_3$ is inserted between the third O-column U$_3$ and the fourth O-column U$_4$. The combination of the third O-column U$_3$ and the third E-column Ur$_3$ implements a third double-bit memory-unit.

And, as illustrated in FIG. 10, the n-th O-column U$_n$ is arranged behind the n-th E-column Ur$_n$. The combination of the n-th O-column U$_n$ and the n-th E-column Ur$_n$ implements a n-th double-bit memory-unit. Therefore, if we focus to an array of double-bit memory-units, the reverse directional MM of the additional embodiment is implemented by m*n matrix.

FIGS. 11A and 11B illustrates an array of i-th row of the m*2n matrix (here, "m" is an integer determined by byte size or word size) in a cell-level representation of the another MM illustrated in FIG. 10, which stores the inverted information of bit-level in each of front-stage cells M$_{i1}$, M$_{i2}$, M$_{i3}$, . . . , M$_{i(n-1)}$, M$_{in}$, and sequentially inverts and transfers the information synchronously with the first clock signal via rear-stage cells Mr$_{i1}$, Mr$_{i2}$, Mr$_{i3}$, . . . , Mr$_{i(n-1)}$, Mr$_{in}$, step by step in the reverse direction to the MM illustrated in FIGS. 2-5, namely from the output terminal O$_i$ toward the input terminal I$_i$ in the representation of FIGS. 2-5.

The first column from the left side in the m*2n matrix is implemented by a vertical array of rear-stage cells Mr$_{11}$, Mr$_{21}$, Mr$_{31}$, . . . , Mr$_{(m-1)1}$, M$_{m1}$, which represent the first E-column Ur$_1$ as illustrated in FIG. 11A. Although the illustration of the respective rear-stage cells Mr$_{11}$, Mr$_{21}$, Mr$_{31}$, . . . , Mr$_{(m-1)1}$, Mr$_{m1}$ are represented by the generic-concept notation of Mr$_{j1}$ (j=1 to m). Each of the rear-stage cells Mr$_{11}$, Mr$_{21}$, Mr$_{31}$, . . . , Mr$_{(m-1)1}$, Mr$_{m1}$ is a bit-level cell configured to store data of a single bit.

The second column from the left side in the m*2n matrix is implemented by a vertical array of front-stage cells M$_{11}$, M$_{21}$, M$_{31}$, . . . , M$_{(m-1)1}$, M$_{m1}$, which represent the first O-column U$_1$. Although the illustration of the respective front-stage cells M$_{11}$, M$_{21}$, M$_{31}$, . . . , M$_{(m-1)1}$, M$_{m1}$ are represented by the generic-concept notation of M$_{ij}$ (j=1 to m). Each of the front-stage cells M$_{11}$, M$_{21}$, M$_{31}$, . . . , M$_{(m-1)1}$, M$_{m1}$ is a bit-level cell configured to store data of a single bit.

Similarly, the third column in the m*2n matrix, which is implemented by a vertical array of rear-stage cells Mr$_{12}$, Mr$_{22}$, Mr$_{32}$, . . . , Mr$_{(m-1)2}$, Mr$_{m2}$, which represent the second E-column Ur$_2$. Although the illustration of the respective rear-stage cells Mr$_{12}$, Mr$_{22}$, Mr$_{32}$, . . . , M$_{(m-1)2}$, Mr$_{m2}$ are represented by the generic-concept notation of Mr$_{j2}$ (j=1 to m). Each of the rear-stage cells Mr$_{12}$, Mr$_{22}$, Mr$_{32}$, . . . , Mr$_{(m-1)2}$, Mr$_{m2}$ is a bit-level cell configured to store data of a single bit.

The fourth column in the m*2n matrix, which is implemented by a vertical array of front-stage cells M$_{12}$, M$_{22}$, M$_{32}$, . . . , M$_{(m-1)2}$, M$_{m2}$, which represent the second O-column U$_2$. Although the illustration of the front-stage cells M$_{12}$, M$_{22}$, M$_{32}$, . . . , M$_{(m-1)2}$, M$_{m2}$ are represented by the generic-concept notation of M$_{j2}$ (j=1 to m). Each of the front-stage cells M$_{12}$, M$_{22}$, M$_{32}$, . . . , M$_{(m-1)2}$, M$_{m2}$ is a bit-level cell configured to store data of a single bit.

The second column from the right side in the m*2n matrix is implemented by a vertical array of rear-stage cells Mr$_{1n}$, Mr$_{2n}$, Mr$_{3n}$, . . . , Mr$_{(m-1)n}$, Mr$_{mn}$, which represent the n-th E-column Ur$_n$ as illustrated in FIG. 11B. Although the illustration of the rear-stage cells Mr$_{1n}$, Mr$_{2n}$, Mr$_{3n}$, . . . , Mr$_{(m-1)n}$, Mr$_{mn}$ are represented by the generic-concept notation of Mr$_{jn}$ (j=1 to m). Each of the rear-stage cells Mr$_{1n}$, Mr$_{2n}$, Mr$_{3n}$, . . . , Mr$_{(m-1)n}$, Mr$_{mn}$ is a bit-level cell configured to store data of a single bit.

The first column from the right side in the m*2n matrix is implemented by a vertical array of front-stage cells M$_{1n}$, M$_{2n}$, M$_{3n}$, . . . , M$_{(m-1)n}$, M$_{mn}$, which represent the n-th O-column U$_n$. Although the illustration of the front-stage cells M$_{12}$, M$_{22}$, M$_{32}$, . . . , M$_{(m-1)2}$, M$_{m2}$ are represented by the generic-concept notation of M$_{jn}$ (j=1 to m). Each of the front-stage cells $M_{1n}$, $M_{2n}$, $M_{3n}$, . . . , $M_{(m-1)n}$, $M_{mn}$ is a bit-level cell configured to store data of a single bit.

As illustrated in FIG. 12, in the reverse directional MM according to the additional embodiment, the j-th front-stage cell $M_{ij}$ on the i-th row encompasses a coupling-element $Q_{ij1}$ having an input terminal connected to the output terminal of the (j+1)-th rear-stage cell $Mr_{i(j+1)}$, and a gate electrode connected to the first clock-line $L_{clk1}$. That is, the rear-stage cell $Mr_{i(j+1)}$ is allocated on the right-hand side of the coupling-element $Q_{ij1}$.

And, the j-th front-stage cell $M_{ij}$ further encompasses a front-inverter $I_{ij}$ having an input terminal connected to an output terminal of the coupling-element $Q_{ij1}$. The front-inverter $I_{ij}$ is implemented by a CMOS inverter encompassing a pMOS transistor $Q_{ij2}$ having a first main-electrode connected to a power-supply line $L_{sv}$ and a gate electrode connected to the output terminal of the coupling-element $Q_{ij1}$, and an nMOS transistor $Q_{ij3}$ having a first main-electrode connected to the second main-electrode of the pMOS transistor $Q_{ij2}$, a gate electrode connected to the input terminal of the coupling-element $Q_{ij1}$, and a second main-electrode connected to a ground potential.

To an internal output terminal of the front-inverter $I_{ij}$, a storage capacitor $C_{ij}$ being assigned in the front-inverter $I_{ij}$ is connected in parallel. And an output node connecting the second main-electrode of the pMOS transistor $Q_{ij2}$ and the first main-electrode of the nMOS transistor $Q_{ij3}$ serves as an internal output terminal of the front-stage cell $M_{ij}$. The internal output terminal delivers the signal stored in the storage capacitor $C_{ij}$ to the j-th rear-stage cell $Mr_{ij}$ allocated at left-hand side of the front-stage cell $M_{ij}$.

And the j-th rear-stage cell $Mr_{ij}$ on the i-th row encompasses a buffer-element $Qr_{ij1}$ having an input terminal connected to the internal output terminal of the j-th front-stage cell $M_{ij}$ and a gate electrode connected to the second clock-line $L_{clk2}$ and a rear-inverter $Ir_{ij}$ having an input terminal connected to the output terminal of the buffer-element $Qr_{ij1}$. The rear-inverter $Ir_{ij}$ is implemented by a CMOS inverter encompassing a pMOS transistor $Qr_{ij2}$ having a first main-electrode connected to a power-supply line $L_{sv}$ and a gate electrode connected to the output terminal of the buffer-element $Q_{ij1}$, and an nMOS transistor $Qr_{ij3}$ having the first main-electrode connected to the second main-electrode of the pMOS transistor $Qr_{ij2}$, a gate electrode connected to the output terminal of the buffer-element $Qr_{ij1}$, and a second main-electrode connected to a ground potential.

To the output terminal of the rear-inverter $Ir_{ij}$, a storage capacitor $Cr_{ij}$ assigned in the rear-inverter $Ir_{ij}$ is connected in parallel. And an output node connecting the second main-electrode of the pMOS transistor $Qr_{ij2}$ and the first main-electrode of the nMOS transistor $Qr_{ij3}$ serves as an output terminal of the rear-stage cell $Mr_{ij}$. The output terminal delivers the signal stored in the storage capacitor $Cr_{ij}$ to the (j−1)-th front-stage cell $M_{i(j-1)}$ allocated at left-hand side of the rear-stage cell $Mr_{ij}$.

As stated above, in the reverse directional MM of the additional embodiment, because each of double-bit memory-units includes the O-column and the E-column such that each of the double-bit memory-units can shape the attenuated input waveforms to recover the original pulse-height, by amplifying the attenuated pulse-heights of signal "1" to the level of the supply voltage, the accurate marching transferring of stored information of byte size or word size, even with lower supply voltages, can be achieved.

And, furthermore, according to the reverse directional MM of the additional embodiment illustrated in FIGS. 10, 11A, 11B and 12, because the addressing to each of the O-columns $U_1$, $U_2$, $U^3$, . . . , $U_{n-1}$, $U_n$ and E-columns $Ur_1$, $Ur_2$, $Ur_3$, . . . , $Ur_{n-1}$, $Ur_n$ disappears, the required information can be transferred to its destination unit connected to the edge side of the memory chip with lower supply voltages.

Bi-Directional MM

Furthermore, the reverse directional MM illustrated in FIG. 10 and the forward directional MM illustrated in FIG. 2 can be combined to achieve a bi-directional MM such that byte or word size information is transferred bi-directionally between the input and output columns. One of the optional schemes to implement the bi-directional MM is to delineate the patterns of the forward and reverse directional MMs on a single semiconductor chip in a topology recited in U.S. Pat. Nos. 8,949,650 and 9,361,957.

Another optional scheme to implement the bi-directional MM is to stack a first semiconductor chip 1, on which the pattern of the forward directional MM is delineated, on a second semiconductor chip 2, on which the pattern of the reverse directional MM is delineated as illustrated in FIGS. 13 and 14. In a flip-chip configuration illustrated in FIG. 14, for interconnecting the first semiconductor chip 1 and the second semiconductor chip 2, a plurality of solder bumps $B_{ij}$ are deposited onto a plurality of chip pads $P_{2ij}$, respectively, on the second semiconductor chip 2 (i=1 to m; j=1 to n).

In order to mount the first semiconductor chip 1 on to the second semiconductor chip 2, the first semiconductor chip 1 is flipped over so that its top side faces down, and aligned so that its pads align with matching pads on the second semiconductor chip 2, and then the solder bumps $B_{ij}$ are reflowed to complete the interconnect.

Similar to the circuit topology illustrated in FIG. 12, at right side of a top surface of the semiconductor chip 2 illustrated at lower portion of FIG. 13, a j-th front-stage cell $M_{ij(2)}$ is assigned on an i-th row, the j-th front-stage cell $M_{ij(2)}$ has a lateral coupling-element $Q_{ij1}$ implemented by an nMOS transistor. The lateral coupling-element $Q_{ij1}$ has an input terminal connected to the output terminal of the (j+1)-th rear-stage cell, and a gate electrode connected to the first clock-line $L_{clk}$. Although the illustration is omitted, the (j+1)-th rear-stage cell is assigned on the right-hand side of the lateral coupling-element $Q_{ij1}$. And, the j-th front-stage cell $M_{ij}$ (2) further has a front CMOS-inverter having an input terminal connected to an output terminal of the lateral coupling-element $Q_{ij1}$.

The front CMOS-inverter has a pMOS transistor $Q_{ij2}$ having a first main-electrode connected to a power-supply line $L_{sv}$ and a gate electrode connected to the output terminal of the lateral coupling-element $Q_{ij1}$, and an nMOS transistor $Q_{ij3}$ having a first main-electrode connected to the second main-electrode of the pMOS transistor $Q_{ij2}$, a gate electrode connected to the input terminal of the lateral coupling-element $Q_{ij1}$, and a second main-electrode connected to a ground potential. To an internal output terminal of the front CMOS-inverter, a storage capacitor $C_{ij}$ being assigned to the front CMOS-inverter is connected in parallel.

And an output node connecting the second main-electrode of the pMOS transistor $Q_{ij2}$ and the first main-electrode of the nMOS transistor $Q_{ij3}$ serves as an internal output terminal of the front-stage cell $M_{ij(2)}$. Through an inter-column line of the i-th row, the internal output terminal delivers the signal stored in the storage capacitor to the j-th rear-stage cell $Mr_{ij(2)}$ assigned at left-hand side of the front-stage cell $M_{ij(2)}$.

At a midway point on the inter-column line of the i-th row between the j-th front-stage cell $M_{ij(2)}$ and the j-th rear-stage cell $Mr_{ij(2)}$, an input terminal of an inter-chip coupling-element $Q_{ij4}$ implemented by an nMOS transistor is connected. The inter-chip coupling-element $Q_{ij4}$ has an output terminal connected to the chip pad $P_{2ij}$, and a gate electrode connected to an inter-chip clock-line $L_{int-1}$.

And the j-th rear-stage cell $Mr_{ij(2)}$ on the i-th row has a buffer-element $Qr_{ij1}$ implemented by an nMOS transistor. The buffer-element $Qr_{ij1}$ has an input terminal connected to the internal output terminal of the j-th front-stage cell $M_{ij}(2)$ and a gate electrode connected to the second clock-line $L_{clk2}$ and a rear CMOS-inverter having an input terminal connected to the output terminal of the buffer-element $Qr_{ij1}$.

The rear CMOS-inverter has a pMOS transistor $Qr_{ij2}$ having a first main-electrode connected to a power-supply line $L_{sv}$, and a gate electrode connected to the output terminal of the buffer-element $Q_{ij1}$, and an nMOS transistor $Qr_{ij3}$ having the first main-electrode connected to the second main-electrode of the pMOS transistor $Qr_{ij2}$, a gate electrode connected to the output terminal of the buffer-element $Q_{ij1}$, and a second main-electrode connected to a ground potential.

To the output terminal of the rear CMOS-inverter, a storage capacitor $Cr_{ij}$ assigned to the rear CMOS-inverter is connected in parallel. And an output node connecting the second main-electrode of the pMOS transistor $Qr_{ij2}$ and the first main-electrode of the nMOS transistor $Qr_{ij3}$ serves as an output terminal of the rear-stage cell $Mr_{ij(2)}$. The output terminal delivers the signal stored in the storage capacitor $Cr_{ij}$ to the (j−1)-th front-stage cell assigned at left-hand side of the rear-stage cell $Mr_{ij(2)}$.

Although illustration of a detailed circuit configuration on a flip-chipped surface is omitted, similar to the circuit topology illustrated in FIG. 4A, at the left position of the flip-chipped surface of the semiconductor chip 1 illustrated at upper portion of FIG. 13, a j-th front-stage cell $M_{ij(1)}$, on the i-th row in the matrix of MM is assigned. The front-stage cell $M_{ij(1)}$, encompasses a lateral coupling-element implemented by an nMOS transistor, which has a first main-electrode connected to an output terminal of the (j−1)th rear-stage cell and a gate electrode connected to the first clock-line, and a front CMOS-inverter having an input terminal connected to a second main-electrode of the lateral coupling-element. That is, a lateral coupling-element controls transferring the signal from an output terminal of the (j−1)th rear-stage cell.

The front CMOS-inverter has a pMOS transistor, which has a first main-electrode connected to a power-supply line and a gate electrode connected to the second main-electrode of the lateral coupling-element, and an nMOS transistor, which has a first main-electrode connected to a second main-electrode of the pMOS transistor, a gate electrode connected to the second main-electrode of the lateral coupling-element, and a second main-electrode connected to a ground potential.

To the output terminal of the front CMOS-inverter, the storage capacitor $C_{ij}$ assigned to the front CMOS-inverter is connected in parallel with the nMOS transistor. And an output node of the front CMOS-inverter serves as an internal output terminal of the front-stage cell $M_{ij(1)}$. Through an inter-column line of the i-th row, the internal output terminal of the front-stage cell $M_{ij(1)}$ delivers the signal stored in the storage capacitor $C_{ij}$ to the rear-stage cell $Mr_{ij(1)}$, which is arranged before the (j+1)th front-stage cell.

At a midway point on the inter-column line of the i-th row between the j-th front-stage cell $M_{ij(1)}$ and the j-th rear-stage cell $Mr_{ij(1)}$, a chip pad $P_{1ij}$ is connected. And, the rear-stage cell $Mr_{ij(1)}$ has a buffer-element implemented by an nMOS transistor, which has a first main-electrode connected to an internal output terminal of the preceding front-stage cell $M_{ij(1)}$ and a gate electrode connected to a second clock-line, and a rear CMOS-inverter having an input terminal connected to a second main-electrode of the buffer-element implemented by an nMOS transistor.

The rear CMOS-inverter has a pMOS transistor having a first main-electrode connected to a power-supply line and a gate electrode connected to the second main-electrode of the buffer-element, and an nMOS transistor having a first main-electrode connected to a second main-electrode of the pMOS transistor, a gate electrode connected to the second main-electrode of the buffer-element, and a second main-electrode connected to a ground potential.

To the output terminal of the rear CMOS-inverter, the storage capacitor assigned to the rear CMOS-inverter is connected in parallel with the nMOS transistor. And an output node of the rear CMOS-inverter serves as an output terminal of the rear-stage cell $Mr_{ij(1)}$. The output terminal of the rear-stage cell $Mr_{ij(1)}$ delivers the signal stored in the storage capacitor to the (j+1)th front-stage cell.

In the flip-chip configuration, when the first semiconductor chip 1 and the second semiconductor chip 2 are interconnected through specific solder bumps $B_{ij}$ disposed at intermediate nodes such that a specific internal output node on the first semiconductor chip 1 is connected to the corresponding internal input node on the second semiconductor chip 2, and a specific internal output node on the second semiconductor chip 2 is connected to the corresponding internal input node on the first semiconductor chip 1 through the inter-chip coupling-element $Q_{ij4}$.

By a clock signal supplied through the inter-chip clock-line $L_{int-1}$, because a specific internal output node on the first semiconductor chip 1 can be connected to the corresponding internal input node on the second semiconductor chip 2, and a specific internal output node on the second semiconductor chip 2 can be connected to the corresponding internal input node on the first semiconductor chip 1, a shorter vector data can roll through the specific intermediate nodes in a circular fashion between the first semiconductor chip 1 and the second semiconductor chip 2.

The shortest vector data, which will roll the rotational direction between the first semiconductor chip 1 and the second semiconductor chip 2, may be implemented by the double-bit data stored in the neighboring two columns. Any number of sets of the double columns, which are successively adjoining, can implement a desired length of vector data, and the desired length of vector data can roll the rotational direction between the first semiconductor chip 1 and the second semiconductor chip 2 in a fashion such as a continuous moving belt of a conveyer.

MM Assisted Random-Access Capable Memory

FIG. 15 illustrates a schematic plan view of a semiconductor chip, on which a pattern of a MM assisted random-access capable memory (MM-ARACM) is delineated. Especially, as one of the example of the MM-ARACM, FIG. 15 illustrates a pattern of a dynamic random-access memory (DRAM), or a double data rate (DDR) synchronous dynamic random-access memory (SDRAM) and an output interface 22a of the DDR SDRAM. The output interface 22a may be allocated at a path between the DDR SDRAM and a processor of a computer system, or the output interface 22a may be disposed between the DDR SDRAM and another memory device allocated at a path toward the processor.

The output interface 22a encompasses an internal bus 221, an Interface memory 222 connected to the internal bus 221, and an output bus 223 connected to the interface memory 222. The output interface 22a include a data divider 224 and a MM cache ($BLB_1$, ..., $BLB_{13}$, $BLB_{14}$, $BLB_{15}$ and $BLB_{16}$). Although the DDR SDRAM is a mere example of DRAMs, the data in the DDR SDRAM illustrated in FIG. 15 is stored as electric charges in memory capacitors in the bit-level cells arrayed in the memory matrix 20.

For example, the memory matrix 20 is divided into sixteen memory-array blocks of first memory-array block $DB_1$, second memory-array block $DB_2$, third memory-array block $DB_3$, ..., and 16th memory-array block $DB_{16}$, and the sixteen memory-array blocks may be classified into four groups in the example illustrated in FIG. 15 in accordance with a design specification. Each of the first memory-array block $DB_1$, the second memory-array block $DB_2$, the third memory-array block $DB_3$, ..., and the 16th memory-array block $DB_{16}$ includes 128 bit lines, for example, and the 128 bit lines are connected to corresponding sense amplifiers implemented by voltage differential-amplifiers, respectively.

The outputs of the sense amplifiers assigned to each of the memory-array blocks $DB_1$, $DB_2$, $DB_3$, ..., $DB_{16}$ are connected to the corresponding output buffers, and the set of the sense amplifiers and output buffers are schematically illustrated as "the sense amplifier and buffers (SABs) 21" in the example illustrated in FIG. 15.

The read operation depletes the charge in a bit-level cell, destroying the data, so after the data is read out the SABs 21 must immediately write it back in the bit-level cell by applying a voltage to it, recharging the memory capacitor, which is called "memory refresh". For example, sixteen memory-array blocks may implement a part of one memory bank, and a 3D stacked structure of a plurality of memory banks implements DDR SDRAM. Because the plurality of memory banks provide parallelism, and SDRAM has separate data and command buses, commands to different banks can be pipelined, the processes of "activate", "precharge" and "transfer data" in the plurality of memory banks can be executed in parallel.

The bit-level cells in the DRAM are laid out in rows and columns in each of the first memory-array block $DB_1$, the second memory-array block $DB_2$, the third memory-array block $DB_3$, ..., and the 16th memory-array block $DB_{16}$ of the memory matrix 20. Each line is attached to each bit-level cell in the row, and the lines which run along the rows are called "wordlines", which are activated by putting a voltage on it.

The lines which run along the columns are called "bit-line" in the DRAM, and two such complementary bitlines are attached to the voltage differential amplifiers, which implement the sense amplifiers in the SABs 21 at the edge of the array. Each bit-level cell lies at the intersection of a particular wordline and bitline, which can be used to "address" it. The data in the bit-level cells is read or written by the same bit-lines which run along the top of the rows and columns.

Because the access latency of the DRAM is fundamentally limited by the memory matrix 20, to make more of very high potential bandwidth, a DDR scheme was developed, which allow data to be transferred at both rising edge and falling edge of the clock pulses. The DDR scheme uses the same commands, accepted once per cycle, but reads or writes two words of data per clock cycle.

In the burst mode, data of burst length is transferred to the corresponding sense amplifier connected to each of the memory-array blocks $DB_1$, $DB_2$, $DB_3$, ..., $DB_{16}$. The outputs from the SABs 21, which corresponds to the data stored in the first memory-array block $DB_1$, the second memory-array block $DB_2$, the third memory-array block $DB_3$, ..., and the 16th memory-array block $DB_{16}$ includes, are fed to the internal bus 221 with 16 bits burst length, for example, and 128 bits parallel data are transferred through the internal bus 221 to the interface memory 222.

Because the burst length is determined by the DDR SDRAM organization, and the value of the burst length directly decides the minimum access granularity, the burst length can be construed as "minimum cache line size". The MM cache ($BLB_1$, ..., $BLB_{13}$, $BLB_{14}$, $BLB_{15}$ and $BLB_{16}$) encompasses a first burst-length block $BLB_1$, ..., a 13th burst-length block $BLB_{13}$, a 14th burst-length block $BLB_{14}$, a 15th burst-length block $BLB_{15}$ and a 16th burst-length block $BLB_{16}$.

As illustrated in FIG. 16, the k-th burst-length block $BLB_k$ (k=1 to 16) has a plurality of odd-numbered columns $U_1$, $U_2$, $U_3$, ..., $U_7$, $U_8$ and a plurality of even-numbered columns $Ur_1$, $Ur_2$, $Ur_3$, ..., $Ur_7$, $Ur_8$ arranged at alternating periodic positions to the odd-numbered columns $U_1$, $U_2$, $U_3$, ..., $U_7$, $U_8$ along the row direction in a 8*16 matrix illustrated in FIG. 16. Each of the odd-numbered columns $U_1$, $U_2$, $U_3$, ..., $U_7$, $U_8$ has a sequence of front-stage cells aligned along the column direction in the 8*16 matrix so as to invert and store a set of moving information of eight bits.

And, each of the even-numbered columns $Ur_1$, $Ur_2$, $Ur_3$, ..., $Ur_7$, $Ur_8$ has a sequence of rear-stage cells aligned along the column direction so as to re-invert and store the set of moving information of the eight bits, which is inverted by adjacent odd-numbered columns. Then, in each of rows in the 8*16 matrix of the k-th burst-length block $BLB_k$, serial information of 16 bits burst length is stored.

Namely, the 128 bits parallel data, which is transferred through the internal bus 221, is divided into eight parallel sets of serial information of 16 bits burst length by the data divider 224, and the serial information of 16 bits burst length is transferred to the first burst-length block $BLB_1$, and the first burst-length block $BLB_1$ stores a stream of eight parallel data with 16 bits burst length. Then, the first burst-length block $BLB_1$ transfers the stream of eight parallel data with 16 bits burst length toward the second burst-length block (the illustration of the second burst-length block is omitted in FIG. 15) along a direction of the stream, synchronously at a clock frequency of the processor in the computer system.

Similarly, and sequentially, the stream of eight parallel data with 16 bits burst length are transferred toward the third burst-length block (the illustration is omitted) along the direction of the stream, synchronously at a clock frequency of the processor. Finally, the stream of eight parallel data with 16 bits burst length are transferred from the 15th burst-length block $BLB_{15}$ toward the 16th burst-length block $BLB_{16}$ along the direction of the stream, synchronously at a clock frequency of the processor, and the stream of eight parallel data with 16 bits burst length is provided to the processor in the computer system as eight bits parallel information from the 16th burst-length block $BLB_{16}$.

FIG. 17 illustrates a schematic plan view of another example of a MM assisted DRAM which encompasses a DDR SDRAM and an output interface 22b of the DDR SDRAM. The output interface 22b may be allocated at a path between the DDR SDRAM and a processor of a computer system, or the output interface 22b may be disposed between the DDR SDRAM and another memory device allocated at a path toward the processor. The output interface 22b includes first MM cache $MMC_1$, second MM cache $MMC_2$, third MM cache $MMC_3$, . . . , and 16th MM cache $MMC_{16}$. Contrary to the output interface 22a illustrated in FIG. 15, the output interface 22b does not include internal bus 221, and the first MM cache $MMC_1$, the second MM cache $MMC_2$, the third MM cache $MMC_3$, . . . , and the 16th MM cache $MMC_{16}$ are directly connected to the memory matrix 20, which is divided into sixteen memory-array blocks of first memory-array block $DB_1$, second memory-array block $DB_2$, third memory-array block $DB_3$, . . . , and 16th memory-array block $DB_{16}$.

Because each of the first memory-array block $DB_1$, the second memory-array block $DB_2$, the third memory-array block $DB_3$, . . . , and the 16th memory-array block $DB_{16}$ includes 128 bit lines, and the 128 bit lines are connected to corresponding sense amplifiers, and the outputs of the sense amplifiers assigned to each of the memory-array blocks $DB_1$, $DB_2$, $DB_3$, . . . , $DB_{16}$ are connected to the corresponding output buffers, the first MM cache $MMC_1$, the second MM cache $MMC_2$, the third MM cache $MMC_3$, . . . , and the 16th MM cache $MMC_{16}$ are directly connected to the corresponding output buffers of the first memory-array block $DB_1$, the second memory-array block $DB_2$, the third memory-array block $DB_3$, . . . , and the 16th memory-array block $DB_{16}$, respectively. The set of the sense amplifiers and output buffers are schematically illustrated as "the sense amplifier and buffers (SABs) 21" in the example illustrated in FIG. 17. Similar to the topology illustrated in FIG. 15, sixteen memory-array blocks in FIG. 17 may implement a part of one memory bank, and a 3D stacked structure of a plurality of memory banks implements DDR SDRAM.

Because the plurality of memory banks provides parallelism, and SDRAM has separate data and command buses, commands to different banks can be pipelined. Furthermore, the data streams from the first memory-array block $DB_1$, the second memory-array block $DB_2$, the third memory-array block $DB_3$, . . . , and the 16th memory-array block $DB_{16}$ to the first MM cache $MMC_1$, the second MM cache $MMC_2$, the third MM cache $MMC_3$, . . . , and the 16th MM cache $MMC_{16}$ can be executed in parallel. Because the burst length is determined by the DDR SDRAM architecture, and the value of the burst length directly decides the minimum access granularity, the burst length can be construed as the minimum cache line size.

Similar to the structure illustrated in FIG. 16, the k-th MM cache $MMC_k$ (k=1 to 16) has a plurality of odd-numbered columns $U_1$, $U_2$, $U_3$, . . . , $U_7$, $U_8$ and a plurality of even-numbered columns $Ur_1$, $Ur_2$, $Ur_3$, . . . , $Ur_7$, $Ur_8$ arranged at alternating periodic positions to the odd-numbered columns $U_1$, $U_2$, $U_3$, . . . , $U_7$, $U_8$ along the row direction in a 128*16 matrix Each of the odd-numbered columns $U_1$, $U_2$, $U_3$, . . . , $U_7$, $U_8$ has a sequence of front-stage cells aligned along the column direction in the 128*16 matrix so as to invert and store a set of moving information of eight bits.

And, each of the even-numbered columns $Ur_1$, $Ur_2$, $Ur_3$, . . . , $Ur_7$, $Ur_8$ has a sequence of rear-stage cells aligned along the column direction so as to re-invert and store the set of moving information of the eight bits, which is inverted by adjacent odd-numbered columns. Then, in each of rows in the 128*16 matrix of the k-th MM cache $MMC_k$, serial information of cache line size is stored. And, the stream of 128 parallel data with cache line size are stored and transferred through the first MM cache $MMC_1$, the second MM cache $MMC_2$, the third MM cache $MMC_3$, . . . , and the 16th MM cache $MMC_{16}$, respectively, toward the processor in the computer system.

Similar to the tandem structure of the interface memory 222 illustrated in FIG. 15, if a plurality of memory matrices, which implement respectively the MM caches $MMC_1$, $MMC_2$, $MMC_3$, . . . , $MMC_{16}$ illustrated in FIG. 17, is tandemly connected along the column direction, a larger size of the MM caches can be achieved. For example, if eight 128*16 matrices are tandemly connected along the column direction, a MM caches with a 128*128 matrix size can be achieved, and if sixteen 128*16 matrices are tandemly connected along the column direction, a MM caches with a 128*256 matrix size can be achieved, and a larger matrix size will serve as a MM L3 cache 22b illustrated in FIG. 18.

Then, a memory matrix 20 of DDR4 DRAM and the MM L3 cache 22b implement the MM assisted DRAM (20, 22b), which will serve as a main memory of a computer system. In the computer system illustrated in FIG. 18, a secondary memory 41 implemented by a hard disk drive (HDD) or a flash memory is connected to the MM assisted DRAM (20, 22b) through an interface 26, and the MM L3 cache 22b is connected to a SRAM-L2 cache 23 through an interface 27. Furthermore, through an interface 28, the SRAM-L2 cache 23 is connected to a first SRAM-L1 cache $24_{-1}$, a second SRAM-L1 cache $24_{-2}$, . . . . And the first SRAM-L1 cache $24_{-1}$ is connected to a first CPU $25_{-1}$, while the second SRAM-L1 cache $24_{-2}$ is connected to a second CPU $25_{-2}$.

The MM L3 cache 22b is characterized as a pool of fast memory common to all the CPUs $25_{-1}$, $25_{-2}$, . . . , and the MM L3 cache 22b is often gated independently from the rest of the CPU core and can be dynamically partitioned to balance access speed, power consumption, and storage capacity. In earlier technology, the SRAM L3 cache is known not fast as the SRAM-L1 cache or the SRAM-L2 cache, the MM L3 cache 22b can operate faster than the SRAM-L1 cache or the SRAM-L2 cache. Therefore, the MM L3 cache 22b is more flexible and plays a vital role in managing the high-speed computer system.

In the computer organization illustrated in FIG. 18, the SRAM-L2 cache 23 can be changed to a MM L2 cache, and the first SRAM-L1 cache $24_{-1}$ and the second SRAM-L1 cache $24_{-2}$, . . . , can be changed to a plurality of MM L1 caches, because the MM cache made of the marching memory architecture is faster than the SRAM caches.

Other Embodiments

Various modifications will become possible for those skilled in the art after receiving the teaching of the present disclosure without departing from the scope thereof.

In the circuit representations illustrated in FIGS. 4A, 4B, 7A, 8, 9, 11A, 11B, 12 and 13, although transistor symbols for MOSFETs are used for convenience sake, the active elements implementing the circuit configurations illustrated in FIGS. 4A, 4B, 7A, 8, 9, 11A, 11B, 12 and 13 are not limited to the MOSFETs, and the MOSFETs can be replaced by MOSSITs, for example.

Because MOSSIT is an ultimate and extreme case of short-cannel MOSFETs in the punch-through current mode, which represents a triode-like drain current vs. drain voltage characteristics, the threshold voltage inherent in MOSFET cannot be defined in MOSSIT. Therefore, lower and lower supply voltages can be applied to the MMs explained in the first to third embodiment, if the MOSFETs are replaced by MOSSITs, because the stray voltage drops at the output terminal of the bit-level cell due to the threshold voltage $V_{th}$ in MOSFET are eliminated.

Furthermore, the MOSFET and MOSSIT can be replaced by insulated-gate (IG) transistors such as MISFET or MISSIT, respectively, which has a gate insulating film other than silicon oxide film ($SiO_2$ film). As another example of the IG transistors, a high electron mobility transistor (HEMT), a hetero junction FET or a hetero junction SIT can be used for the active elements implementing the circuit configurations illustrated in FIGS. 4A, 4B, 7A, 8, 9, 11A, 11B, 12 and 13.

In the examples of MMs pertaining to the first to third embodiments, circuit configurations in which CMOS inverters are used for the front-inverters and the rear-inverters are explained as a matter of convenience. However, the front-inverters and the rear-inverters are not limited to the CMOS inverters, and nMOS inverters or pMOS inverters, which may include static resistive loads, can be used. If the nMOS inverter with the static resistive load is used for the front-inverter and the rear-inverter, respectively, the above mentioned triple-transistors cell will become the double-transistors cell, and the above mentioned quadruple-transistors cell will become the triple-transistors cell, which will miniaturized the bit-level cell finer and finer.

In addition, another nMOS inverter, which includes a depletion mode transistor as pull-up, can be used for the front-inverter and the rear-inverter. Furthermore, bipolar mode junction SITs (BSITs) can implement the inverters which can be used for the front-inverters and the rear-inverters of the present invention, with a configuration similar to TTL inverters implemented by bipolar junction transistors (BJTs).

If a variable resistor, which has a reverse biased p-n junction structure of a normally-on type SIT so as to provide a potential barrier for signal charges, is used as the front-stage coupling-element and the rear-stage coupling-element, respectively, the number of the transistors in the bit-level cell will be further reduced.

Although FIG. 15 has illustrated a pattern of a DDR-SDRAM as one of the examples, the architecture of the MM-ARACM can be applied to various memory arrays of NAND flash memories or NOR flash memories. If the memory-array blocks $DB_1, DB_2, DB_3, \ldots, DB_{16}$ illustrated in FIG. 15 are replaced respectively by arrays of flash-memory cells implemented by electrically erasable programmable read-only memory (EEPROM) scheme, the same technical concept explained by FIGS. 15 and 16 can be used.

For example, each of the flash-memory cells may encompasses a semiconductor substrate, a gate insulator stacked on the semiconductor substrate, a floating gate electrode stacked on the gate insulator, an inter-electrode dielectric stacked on the floating gate electrode incorporating a positive charge layer and a control gate electrode stacked on the inter-electrode dielectric. The gate insulator is configured to enable tunneling of electrons through the gate insulator, and the floating gate accumulates electron charges.

If memory arrays of NAND flash memories or NOR flash memories implement the pipelined memory-array blocks, the pipelined memory-array blocks can store a stream of parallel data or instructions of byte size or word size, and the pipelined memory-array blocks transfer the stream of parallel data or instructions from the plurality of memory-array blocks to an output interface implemented by MM, the output interface is allocated at a path between the flash memory and the processor of a computer system.

In the burst mode of the flash memory, data of burst length is transferred to the corresponding sense amplifier connected to each of the memory-array blocks, and the outputs of the sense amplifiers are transferred to output buffers. Then, the outputs from the output buffers may be fed to the internal bus. And the outputs from the internal bus are transferred to the interface memory implemented by MM. Then, the parallel data stored in the memory-array blocks of the flash memory can be transferred toward a processor in the computer system along a direction of the stream.

If the stream of parallel data or instructions is reverse directional from the processor toward the flash memory, the output interface allocated at the path between the flash memory and the processor will changed to an input interface allocated at the path between the processor and the flash memory.

As described above, the input/output interface may be interconnected between the flash memory and another memory device, or the input/output interface may be interconnected between the flash memory and the processor of computer system. Similar to the configuration illustrated in FIGS. 15 and 16, the input/output interface of the flash memory may include an internal bus and an interface memory implemented by MM.

Or alternatively, the input/output interface of the flash memory may not include the internal bus, but the interface memory implemented by MM is directly connected to the pipelined memory-array blocks of the flash memory, similar to the configuration illustrated in FIG. 17. If the outputs from the output buffers of the flash memory are directly fed to the MM cache memory, a similar organization of the computer system illustrated in FIG. 18 can be achieved by the flash memory, or by the random-access capable memory other than DRAM.

Thus, the present invention of course includes various embodiments and modifications and the like which are not detailed above. Therefore, the scope of the present invention will be defined in the following claims.

The invention claimed is:

1. A marching memory configured to store a stream of parallel data or instructions of byte size or word size, for transferring the stream of parallel data or instructions toward a processor in the computer system along a direction of the stream, synchronously at a clock frequency of the processor, comprising:

a plurality of odd-numbered columns, each of the odd-numbered columns having a sequence of front-stage cells aligned along a column direction in a matrix so as to invert and store a set of moving information of the byte size or the word size; and a plurality of even-numbered columns arranged at alternating periodic positions to the odd-numbered columns along the direction of the stream, each of the even-numbered columns having a sequence of rear-stage cells aligned along the column direction so as to re-invert and store a set of moving information inverted by adjacent odd-numbered columns.

2. The marching memory of claim 1, wherein each of front-stage cells comprises:

a front-stage coupling-element configured to control transferring of one of the signals in the set of moving information from an output terminal of the adjacent rear-stage cell allocated in one of the even-numbered columns arranged adjacent to an input side of the odd-numbered column; and a front-inverter configured to invert the one of the signals transferred through the front-stage coupling-element, and to transfer further the inverted one of the signals toward the one of the even-numbered columns arranged adjacent to an output side of the front-stage cell.

3. The marching memory of claim 2, wherein each of the front-stage cells further comprises a front-stage storage capacitor configured to store the inverted signal.

4. The marching memory of claim 1, wherein each of the rear-stage cells comprises:
a rear-inverter configured to re-invert the inverted one of the signals transferred from a front-stage cell arranged in a same row, and to transfer further the re-inverted signal toward one of the odd-numbered columns arranged adjacent to an output side of the rear-stage cell; and
a rear-stage storage capacitor configured to store the re-inverted signal.

5. The marching memory of claim 4, wherein each of the rear-stage cells further comprises a rear-stage coupling-element configured to control transferring of one of the signals in the set of moving information from an output terminal of the adjacent front-stage cell allocated in one of the odd-numbered columns arranged adjacent to an input side of the even-numbered column.

6. A marching memory adapted for a random-access capable memory having a plurality of pipelined memory-array blocks, configured to store a stream of parallel data or instructions of byte size or word size, for transferring the stream of parallel data or instructions from the plurality of memory-array blocks toward a processor in the computer system along a direction of the stream, synchronously at a clock frequency of the processor, comprising:
a plurality of odd-numbered columns, each of the odd-numbered columns having a sequence of front-stage cells aligned along a column direction in a matrix so as to invert and store a set of moving information of the byte size or the word size; and
a plurality of even-numbered columns arranged at alternating periodic positions to the odd-numbered columns along the direction of the stream, each of the even-numbered columns having a sequence of rear-stage cells aligned along the column direction so as to re-invert and store a set of moving information inverted by adjacent odd-numbered columns.

7. A computer system comprising:
a processor; and
a marching memory serving as a main memory, configured to store a stream of parallel data or instructions of byte size or word size, for transferring the stream of parallel data or instructions synchronously along a direction of the stream at a clock frequency for driving the processor in the computer system, and providing the processor with the stream of parallel data or instructions actively and sequentially so that the processor can execute arithmetic and logic operations with the stored stream of parallel data or instructions, the marching memory including:
a plurality of odd-numbered columns, each of the odd-numbered columns having a sequence of front-stage cells aligned along a column direction in a matrix so as to invert and store a set of moving information of the byte size or the word size; and
a plurality of even-numbered columns arranged at alternating periodic positions to the odd-numbered columns along the direction of the stream, each of the even-numbered columns having a sequence of rear-stage cells aligned along the column direction so as to re-invert and store a set of moving information inverted by adjacent odd-numbered columns.

8. A computer system comprising:
a processor; and
a main memory including a random-access capable memory having a plurality of pipelined memory-array blocks, and a marching memory as an interface allocated at a path between the random-access capable memory and the processor, the marching memory stores a stream of parallel data or instructions of byte size or word size, for transferring the stream of parallel data or instructions synchronously along a direction of the stream at a clock frequency for driving the processor in the computer system, and providing the processor with the stream of parallel data or instructions from the plurality of memory-array blocks actively and sequentially so that the processor can execute arithmetic and logic operations with the stored stream of parallel data or instructions, the marching memory including:
a plurality of odd-numbered columns, each of the odd-numbered columns having a sequence of front-stage cells aligned along a column direction in a matrix so as to invert and store a set of moving information of the byte size or the word size; and
a plurality of even-numbered columns arranged at alternating periodic positions to the odd-numbered columns along the direction of the stream, each of the even-numbered columns having a sequence of rear-stage cells aligned along the column direction so as to re-invert and store a set of moving information inverted by adjacent odd-numbered columns.

9. A computer system comprising:
a processor; and
a main memory including a random-access capable memory having a plurality of pipelined memory-array blocks, and a cache memory implemented by a marching memory, the marching memory stores a stream of parallel data or instructions of byte size or word size, for transferring the stream of parallel data or instructions synchronously along a direction of the stream at a clock frequency for driving the processor in the computer system, and providing the processor with the stream of parallel data or instructions from the plurality of memory-array blocks actively and sequentially so that the processor can execute arithmetic and logic operations with the stored stream of parallel data or instructions, the marching memory including:
a plurality of odd-numbered columns, each of the odd-numbered columns having a sequence of front-stage cells aligned along a column direction in a matrix so as to invert and store a set of moving information of the byte size or the word size; and
a plurality of even-numbered columns arranged at alternating periodic positions to the odd-numbered columns along the direction of the stream, each of the even-numbered columns having a sequence of rear-stage cells aligned along the column direction so as to re-invert and store a set of moving information inverted by adjacent odd-numbered columns.

* * * * *